(12) United States Patent
Hsieh

(10) Patent No.: US 9,245,834 B2
(45) Date of Patent: Jan. 26, 2016

(54) SEMICONDUCTOR DEVICE AND METHOD OF FORMING COMPLIANT CONDUCTIVE INTERCONNECT STRUCTURE IN FLIPCHIP PACKAGE

(75) Inventor: Ming-Che Hsieh, Hsinchu (TW)

(73) Assignee: STATS ChipPAC, Ltd., Singapore (SG)

( * ) Notice: Subject to any disclaimer, the term of this patent is extended or adjusted under 35 U.S.C. 154(b) by 223 days.

(21) Appl. No.: 13/422,981

(22) Filed: Mar. 16, 2012

(65) Prior Publication Data
US 2013/0241071 A1 Sep. 19, 2013

(51) Int. Cl.
*H01L 23/48* (2006.01)
*H01L 23/498* (2006.01)
(Continued)

(52) U.S. Cl.
CPC ...... *H01L 23/49816* (2013.01); *H01L 21/4853* (2013.01); *H01L 23/49811* (2013.01); *H01L 24/11* (2013.01); *H01L 24/13* (2013.01); *H01L 24/16* (2013.01); *H01L 24/81* (2013.01); *H01L 24/92* (2013.01); *H01L 24/97* (2013.01); *H01L 21/561* (2013.01); *H01L 21/563* (2013.01); *H01L 24/83* (2013.01); *H01L 2224/0345* (2013.01); *H01L 2224/0346* (2013.01); *H01L 2224/0348* (2013.01); *H01L 2224/03452* (2013.01); *H01L 2224/03472* (2013.01); *H01L 2224/03474* (2013.01); *H01L 2224/0401* (2013.01); *H01L 2224/05022* (2013.01); *H01L 2224/05111* (2013.01); *H01L 2224/05124* (2013.01); *H01L 2224/05139* (2013.01); *H01L 2224/05144* (2013.01); *H01L 2224/05147* (2013.01); *H01L 2224/05155* (2013.01); *H01L 2224/05611* (2013.01);
(Continued)

(58) Field of Classification Search
CPC ............ H01L 21/4825; H01L 21/4853; H01L 23/3128; H01L 23/4855–23/49; H01L 23/4952; H01L 23/498–23/49816; H01L 24/10–24/41; H01L 24/81
USPC ......... 257/697–698, 700–703, 734–738, 748, 257/772–781, 762, E23.067–E23.07, 257/E23.02–E23.024, E23.182–E23.191; 438/461–464, 610–613, 107–108, 110, 438/455; 228/180.22; 174/540–541, 551, 174/557–558
See application file for complete search history.

(56) References Cited

U.S. PATENT DOCUMENTS 5,411,400 A * 5/1995 Subrahmanyan et al. ...... 439/68
5,431,328 A * 7/1995 Chang et al. ............. 228/180.22
(Continued)

*Primary Examiner* — David Vu
*Assistant Examiner* — Cuong Nguyen
(74) *Attorney, Agent, or Firm* — Robert D. Atkins; Patent Law Group: Atkins and Associates, P.C.

(57) ABSTRACT

A semiconductor device has a semiconductor die. The semiconductor die has a contact pad. A first conductive layer is formed over the contact pad. A conductive shell having a hollow core is formed over the first conductive layer. A compliant material is deposited in the hollow core. The semiconductor die is mounted over a substrate with the conductive shell electrically connected to a conductive trace on the substrate. A second conductive layer is formed over the conductive shell. The compliant material is an insulating material. A bump material is deposited around the conductive shell. A pre-solder material is deposited over the conductive trace. The conductive shell has a cross-sectional width less than 7 micrometers. The second conductive layer is a conductive lip. Mounting the semiconductor die over the substrate further includes mounting the semiconductor die over the substrate in a bump on lead (BOL) configuration.

21 Claims, 44 Drawing Sheets

(51) Int. Cl.
*H01L 23/00* (2006.01)
*H01L 21/48* (2006.01)
*H01L 21/56* (2006.01)

(52) U.S. Cl.
CPC ............... *H01L 2224/05624* (2013.01); *H01L 2224/05639* (2013.01); *H01L 2224/05644* (2013.01); *H01L 2224/05647* (2013.01); *H01L2224/05655* (2013.01); *H01L 2224/05666* (2013.01); *H01L 2224/05686* (2013.01); *H01L 2224/1145* (2013.01); *H01L 2224/1146* (2013.01); *H01L 2224/1147* (2013.01); *H01L 2224/11452* (2013.01); *H01L 2224/11903* (2013.01); *H01L 2224/1308* (2013.01); *H01L 2224/13011* (2013.01); *H01L 2224/13013* (2013.01); *H01L 2224/13014* (2013.01); *H01L 2224/13017* (2013.01); *H01L 2224/13018* (2013.01); *H01L 2224/1319* (2013.01); *H01L 2224/1329* (2013.01); *H01L 2224/13076* (2013.01); *H01L 2224/13082* (2013.01); *H01L 2224/13111* (2013.01); *H01L 2224/13124* (2013.01); *H01L 2224/13139* (2013.01); *H01L 2224/13144* (2013.01); *H01L 2224/13147* (2013.01); *H01L 2224/13155* (2013.01); *H01L 2224/13166* (2013.01); *H01L 2224/13186* (2013.01); *H01L 2224/13299* (2013.01); *H01L 2224/16225* (2013.01); *H01L 2224/16227* (2013.01); *H01L 2224/48091* (2013.01); *H01L 2224/73204* (2013.01); *H01L 2224/73265* (2013.01); *H01L 2224/814* (2013.01); *H01L 2224/81191* (2013.01); *H01L 2224/81411* (2013.01); *H01L 2224/81815* (2013.01); *H01L 2224/83104* (2013.01); *H01L 2224/92125* (2013.01); *H01L 2224/94* (2013.01); *H01L 2224/97* (2013.01); *H01L 2924/00013* (2013.01); *H01L 2924/01322* (2013.01); *H01L 2924/12041* (2013.01); *H01L 2924/1306* (2013.01); *H01L 2924/13091* (2013.01); *H01L 2924/15311* (2013.01); *H01L 2924/181* (2013.01)

(56) References Cited

U.S. PATENT DOCUMENTS

| | | | | |
|---|---|---|---|---|
| 5,956,235 | A * | 9/1999 | Kresge et al. | 361/774 |
| 6,458,411 | B1 | 10/2002 | Goossen et al. | |
| 6,767,818 | B1 | 7/2004 | Chang et al. | |
| 6,972,490 | B2 | 12/2005 | Chang et al. | |
| 7,586,187 | B2 | 9/2009 | Hsu et al. | |
| 7,675,171 | B2 | 3/2010 | Lee | |
| 7,749,886 | B2 | 7/2010 | Oganesian et al. | |
| 8,173,536 | B2 * | 5/2012 | Cho et al. | 438/612 |
| 8,835,301 | B2 * | 9/2014 | Choi et al. | 438/613 |
| 2008/0194095 | A1 * | 8/2008 | Daubenspeck et al. | 438/612 |
| 2008/0224308 | A1 * | 9/2008 | Lee | 257/737 |
| 2008/0227237 | A1 * | 9/2008 | Lin et al. | 438/106 |
| 2010/0059855 | A1 * | 3/2010 | Lin et al. | 257/528 |
| 2010/0072631 | A1 * | 3/2010 | Marion | 257/779 |
| 2011/0101518 | A1 | 5/2011 | Cho et al. | |
| 2011/0156253 | A1 * | 6/2011 | Tsai et al. | 257/738 |
| 2012/0217640 | A1 | 8/2012 | Choi et al. | |

* cited by examiner

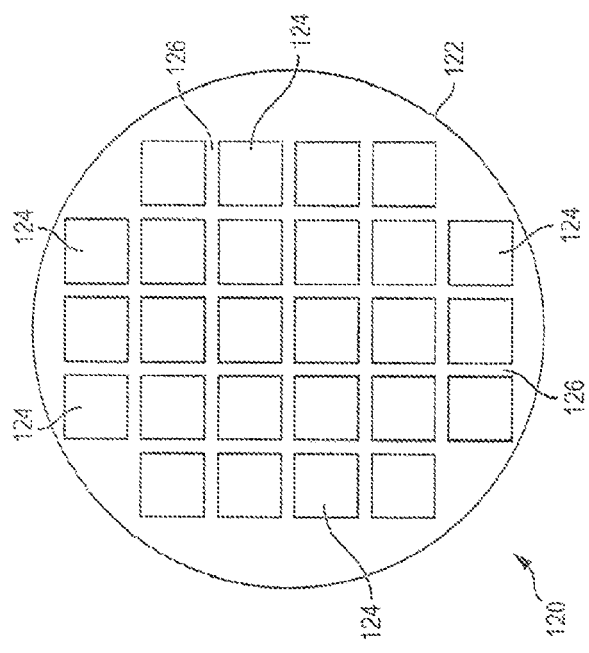
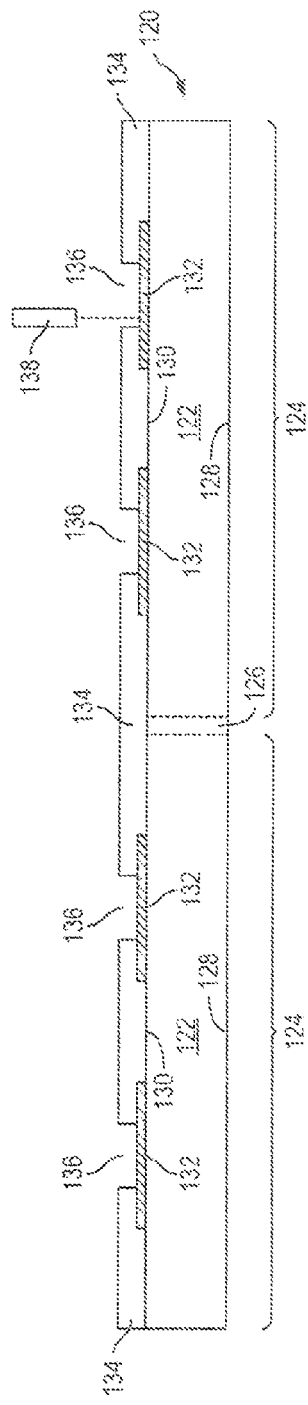
FIG. 5a
FIG. 5b

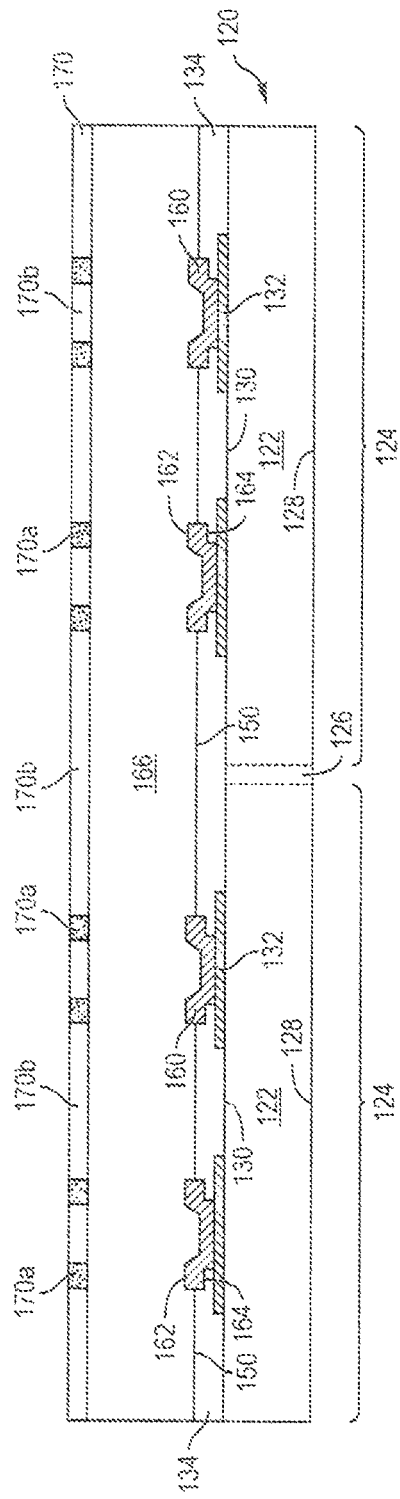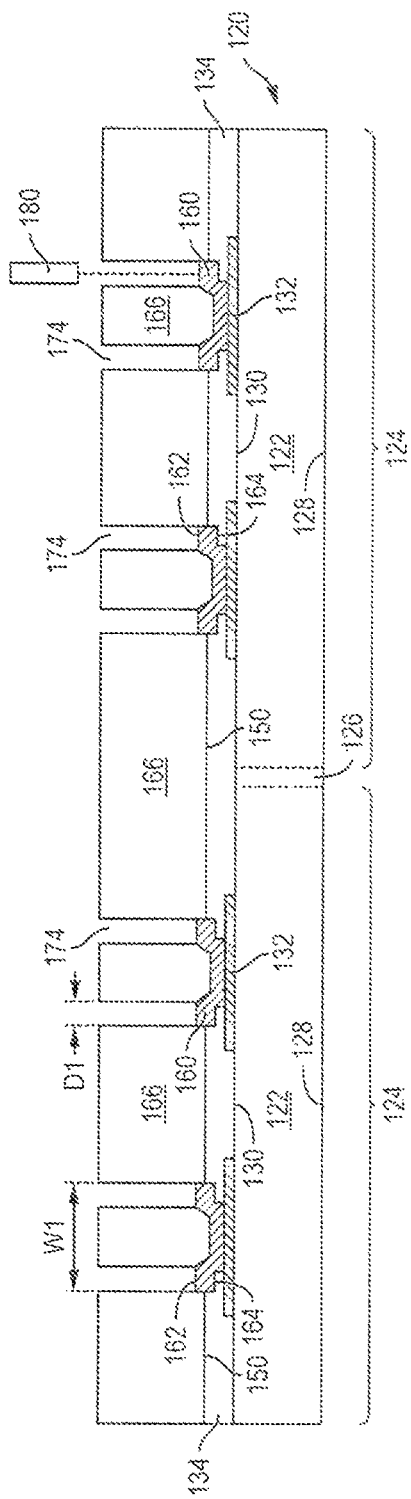

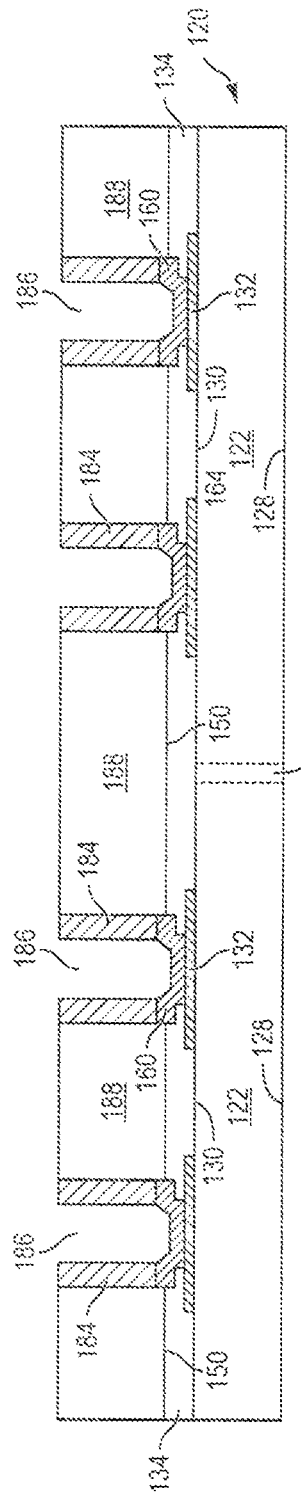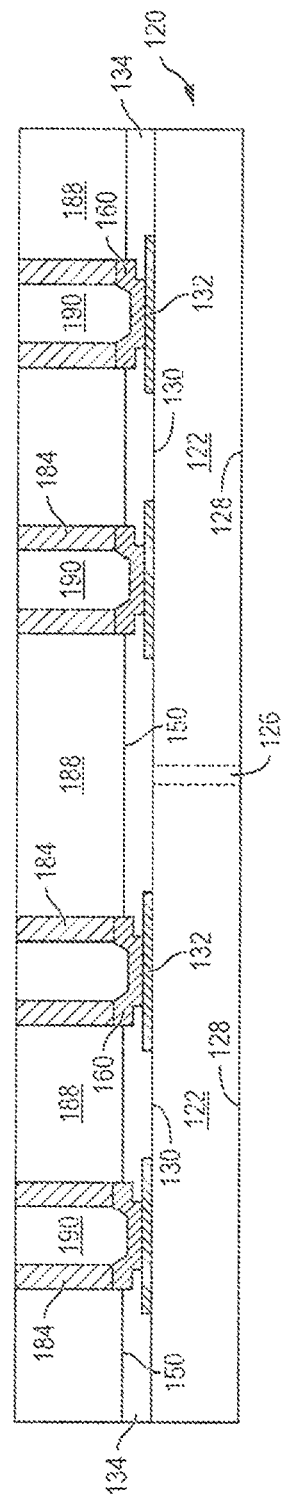

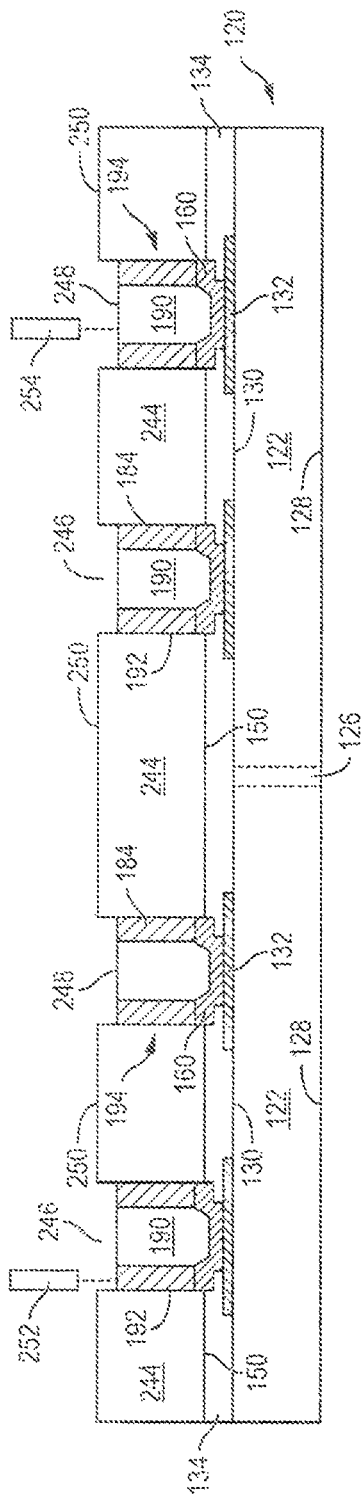
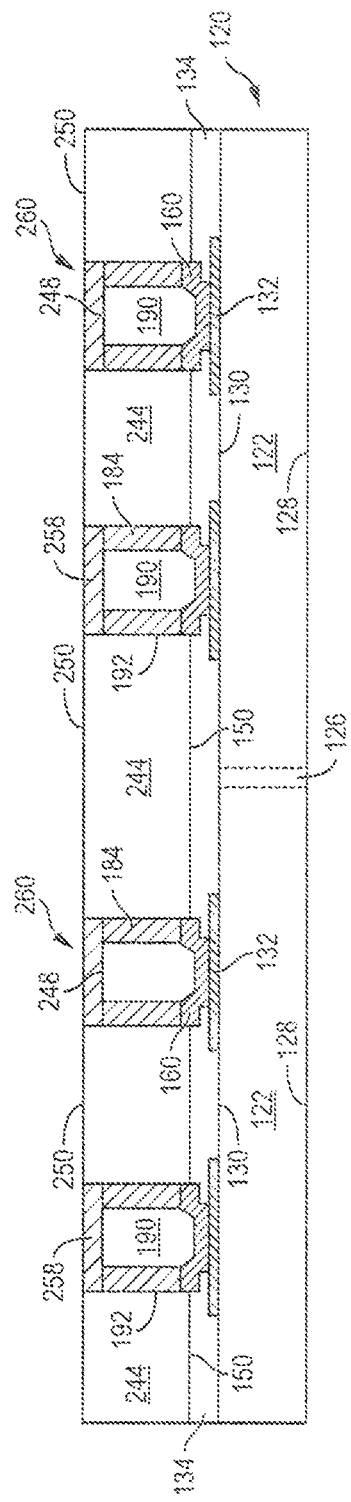
FIG. 9a
FIG. 9b

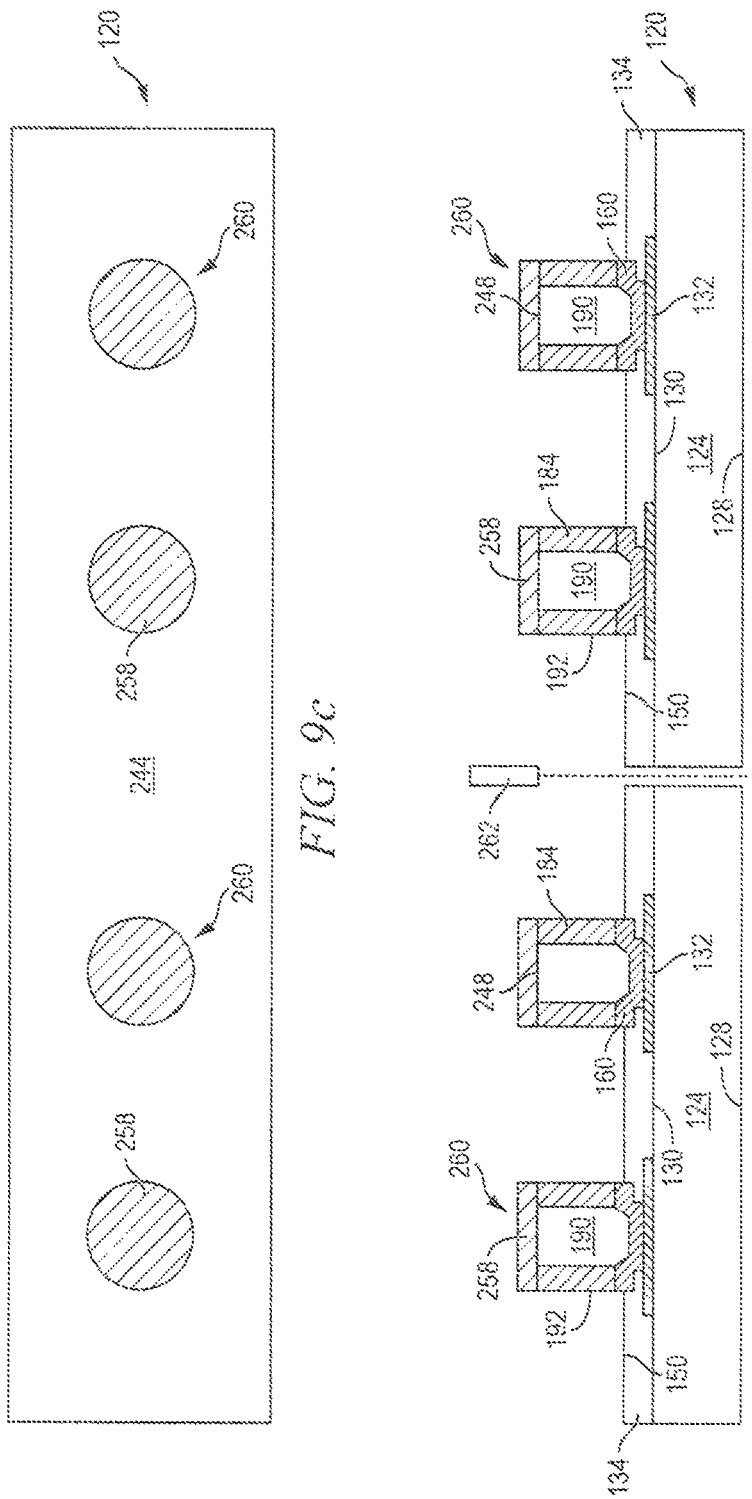

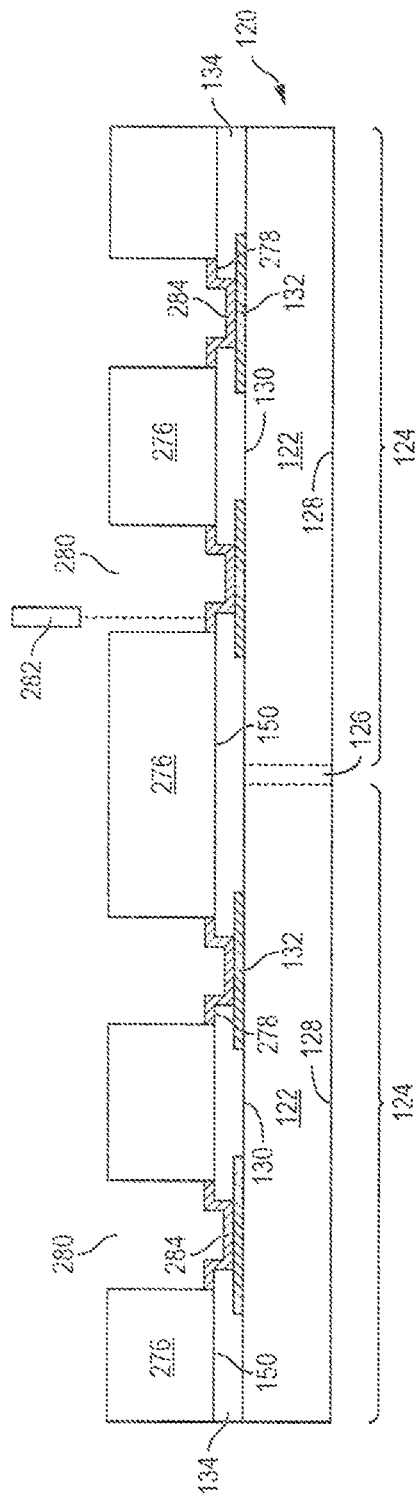
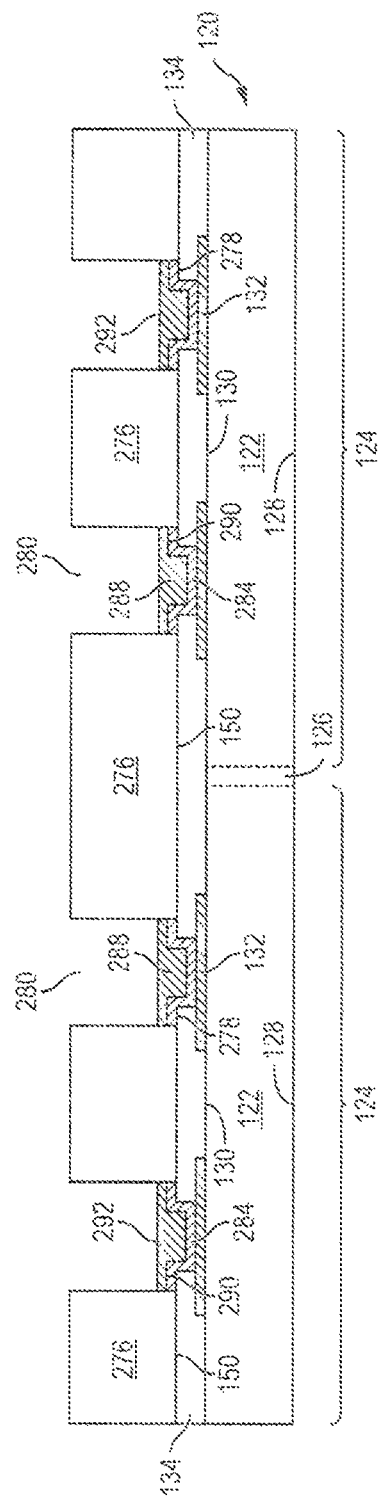
FIG. 11a
FIG. 11b

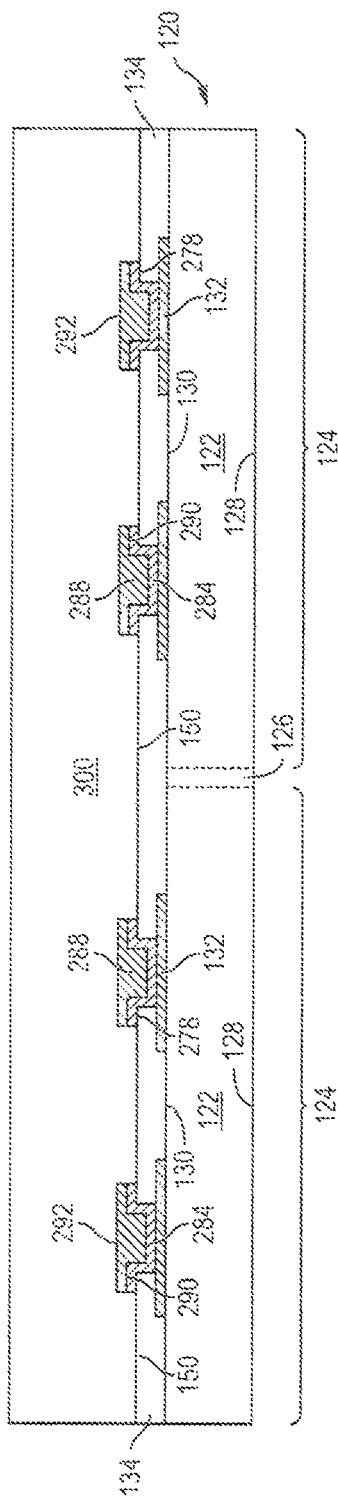
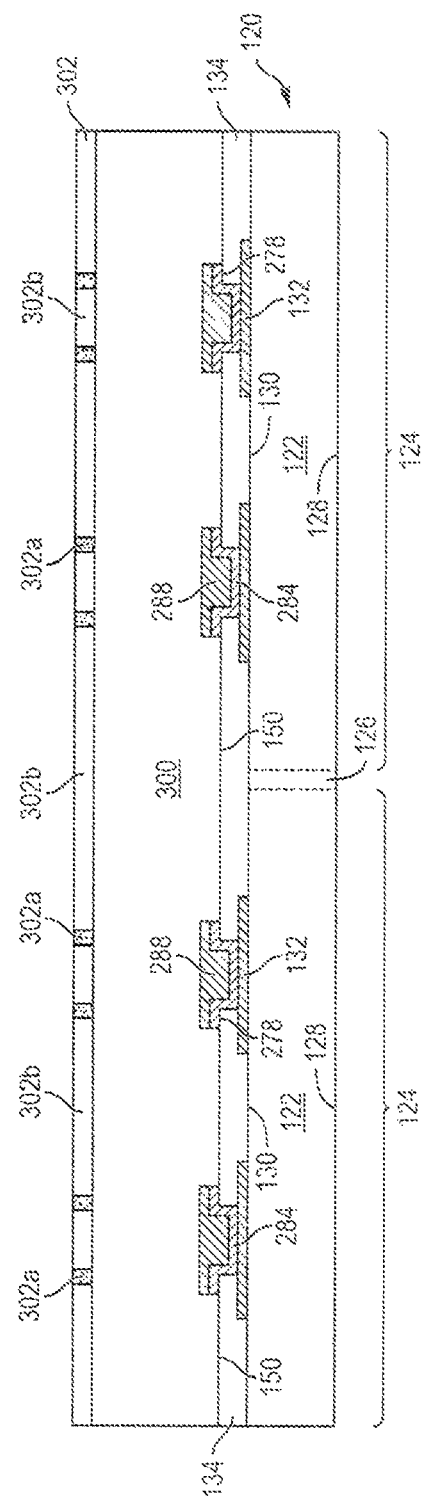
FIG. 11c
FIG. 11d

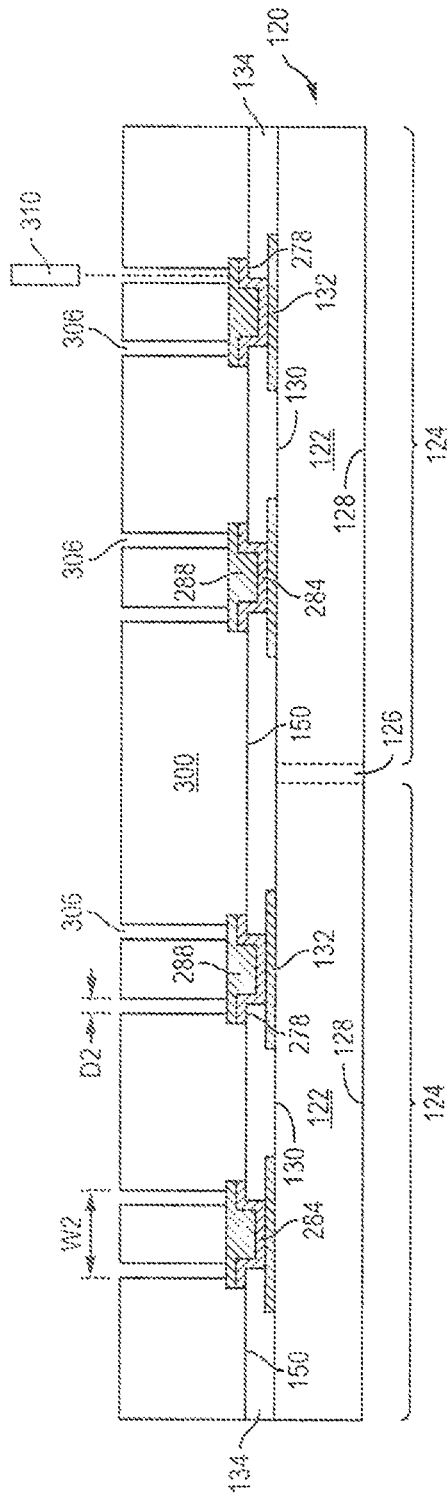
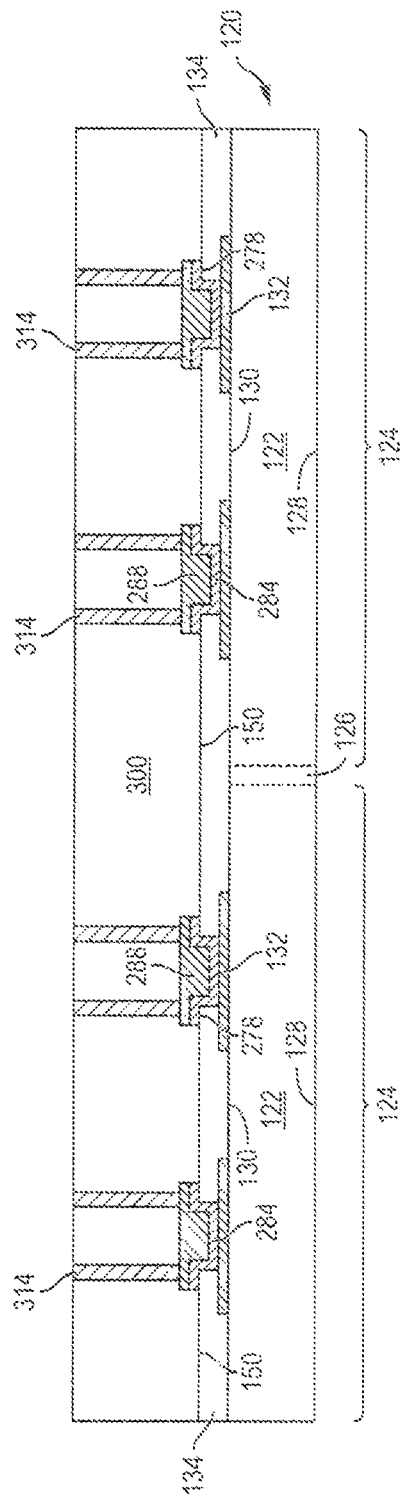
FIG. 11e
FIG. 11f

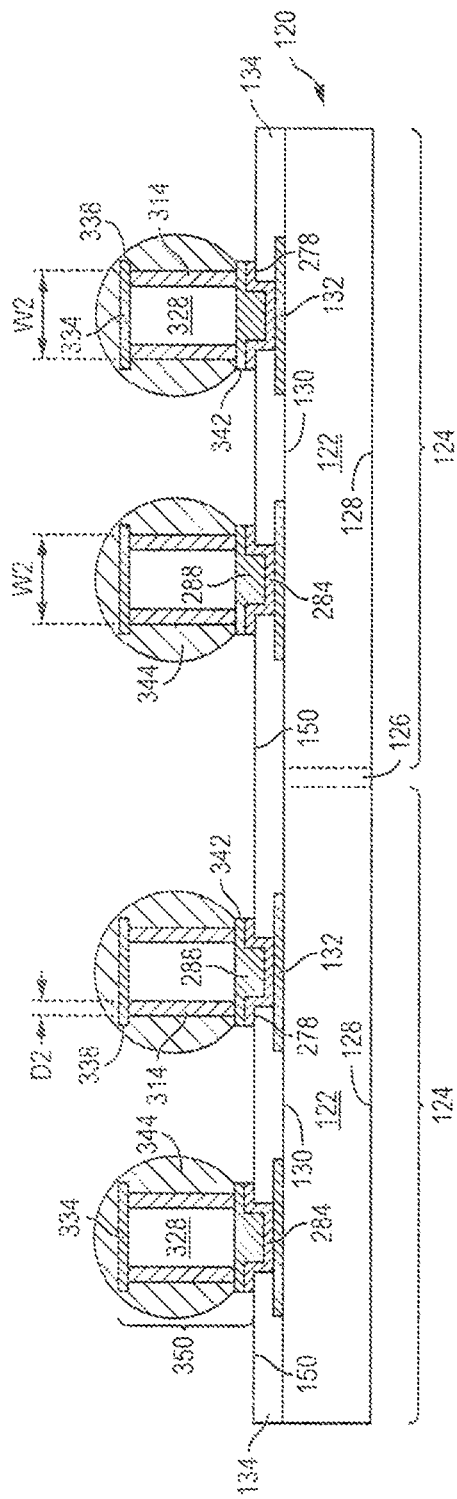
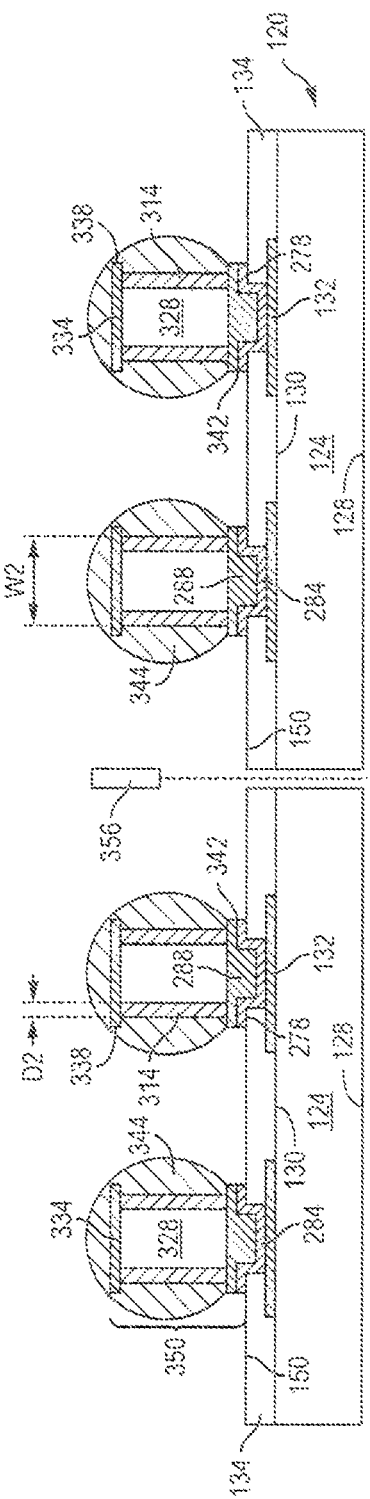

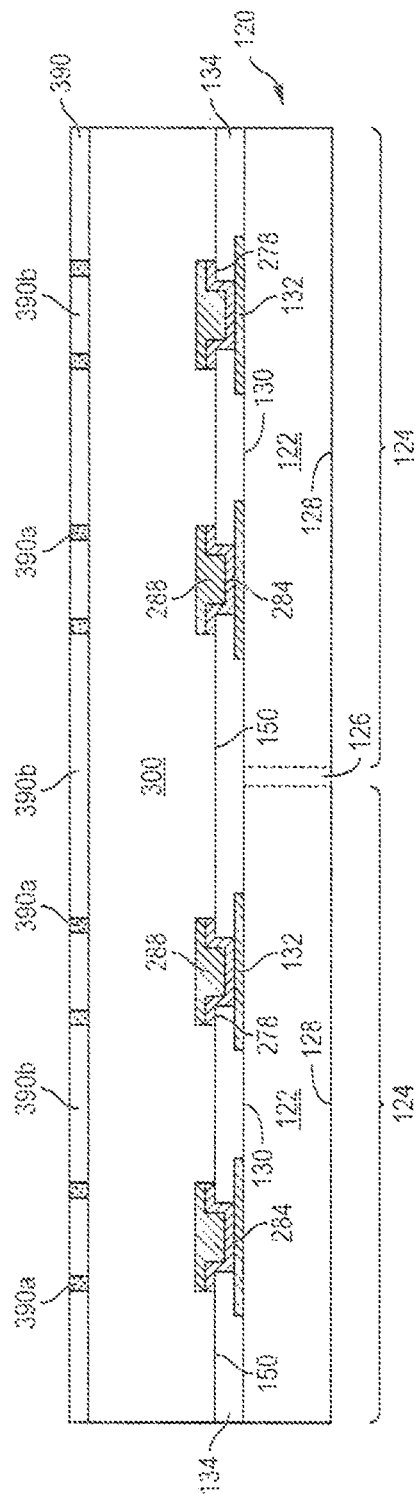
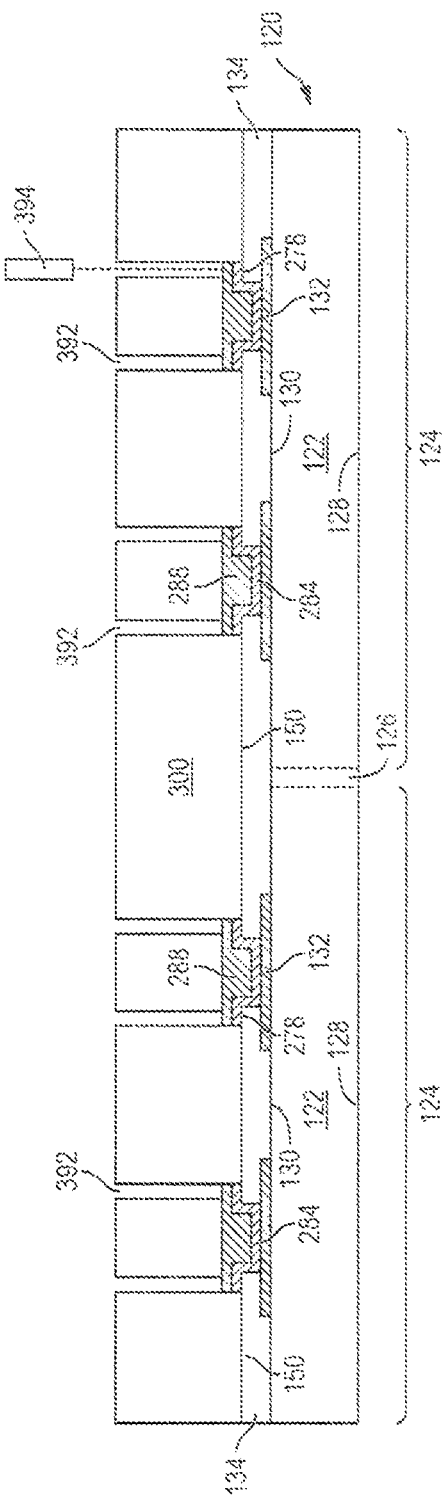

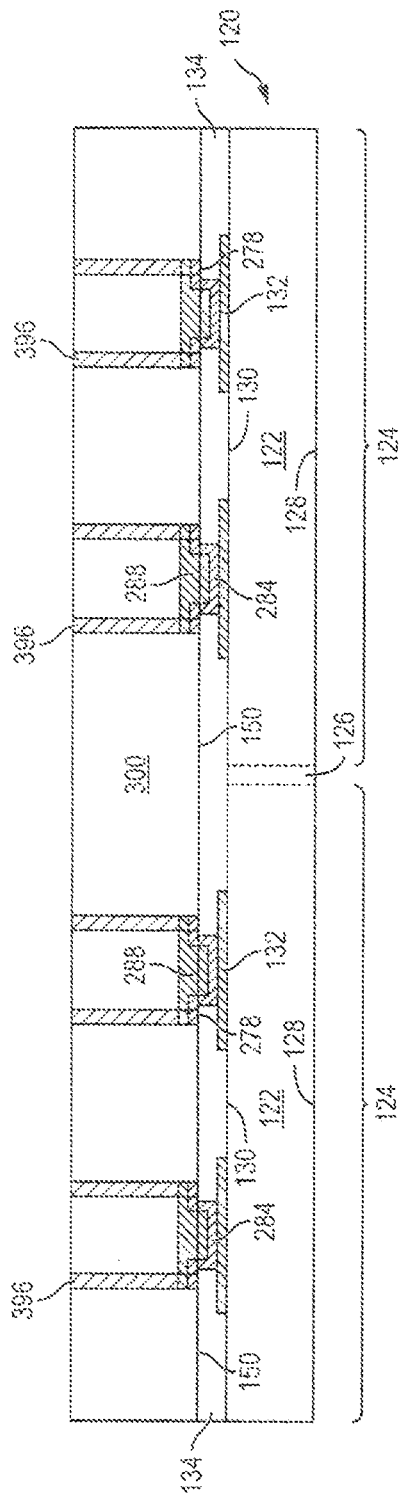
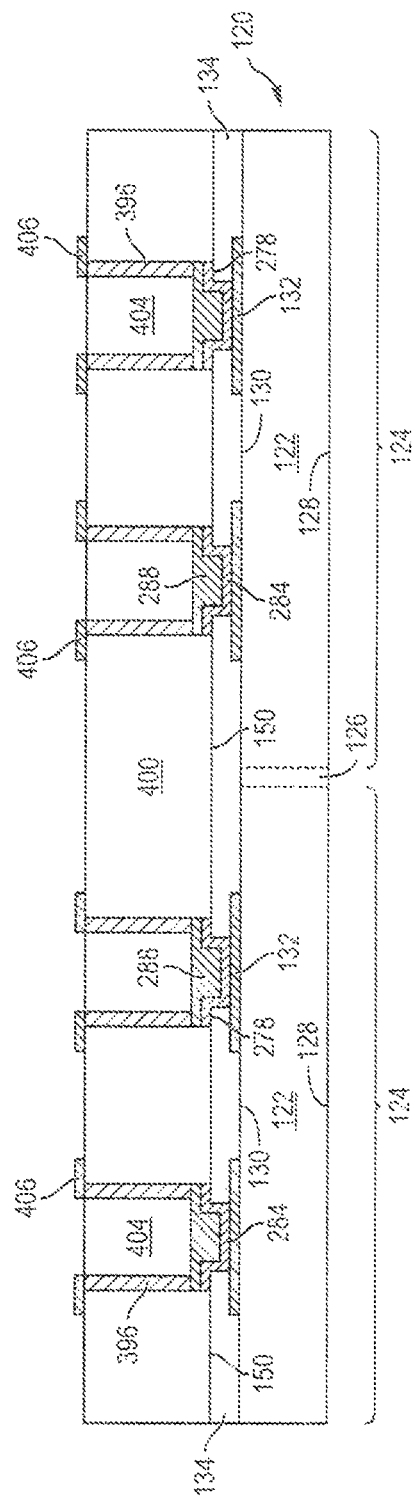
FIG. 15c
FIG. 15d

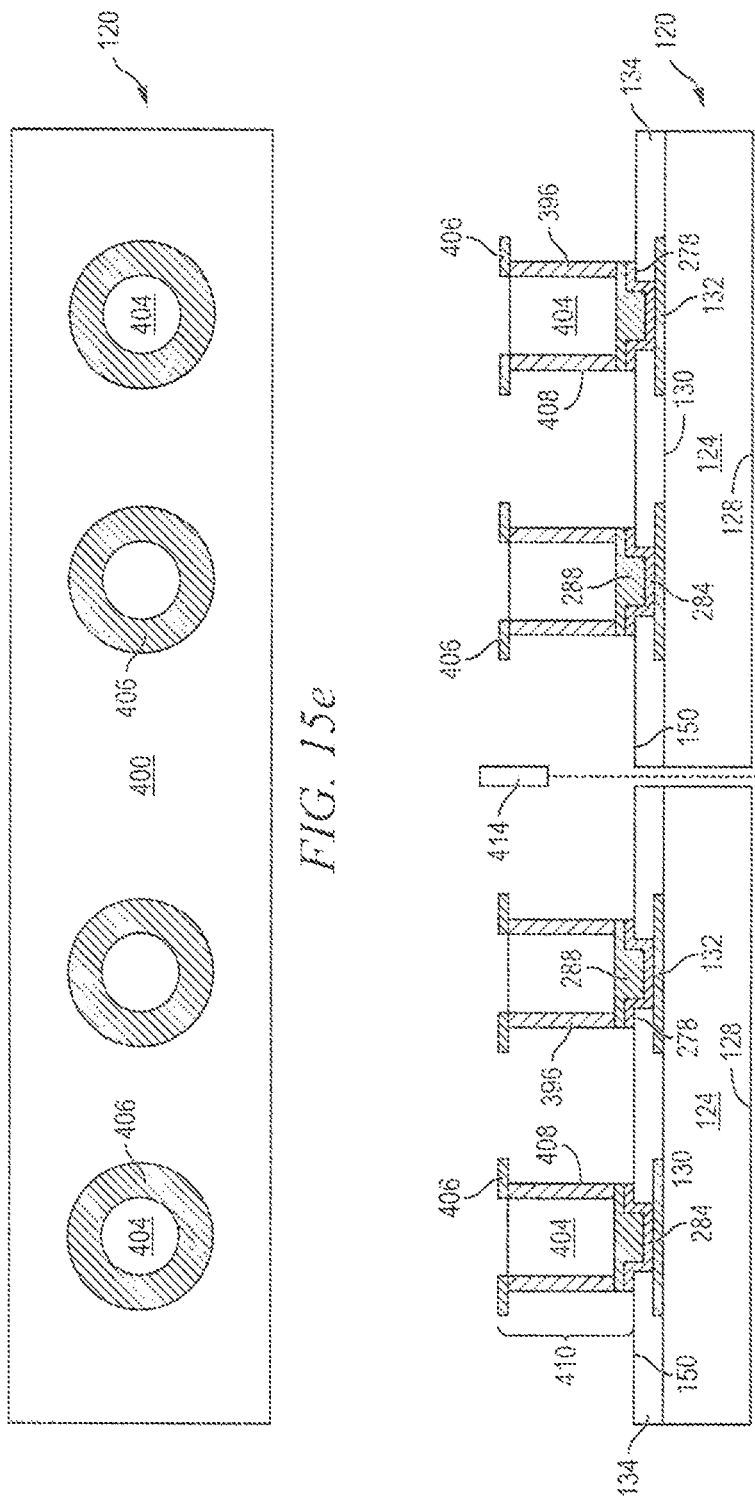

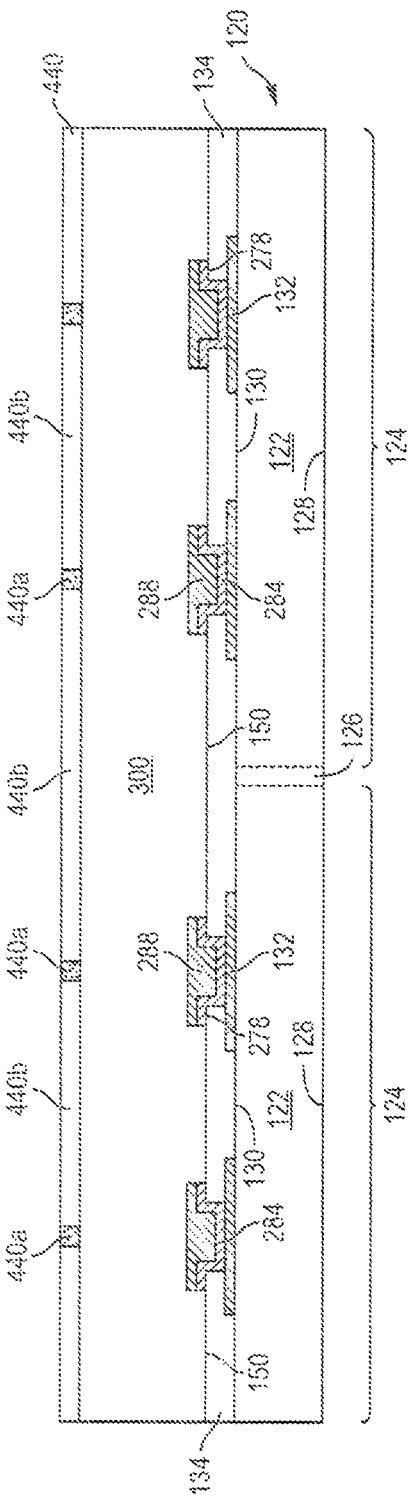
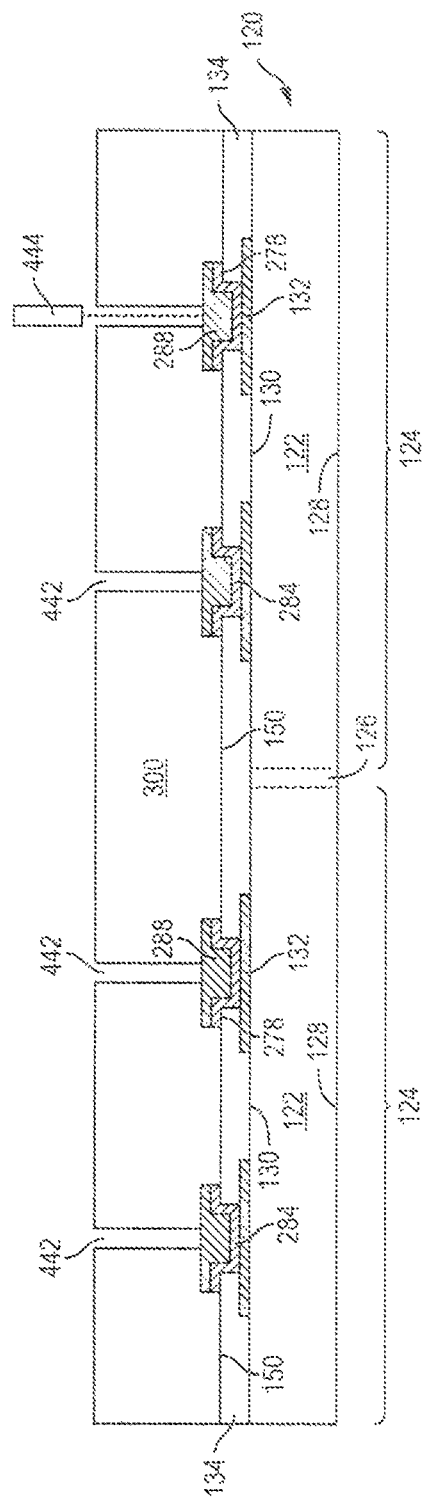
FIG. 18a
FIG. 18b

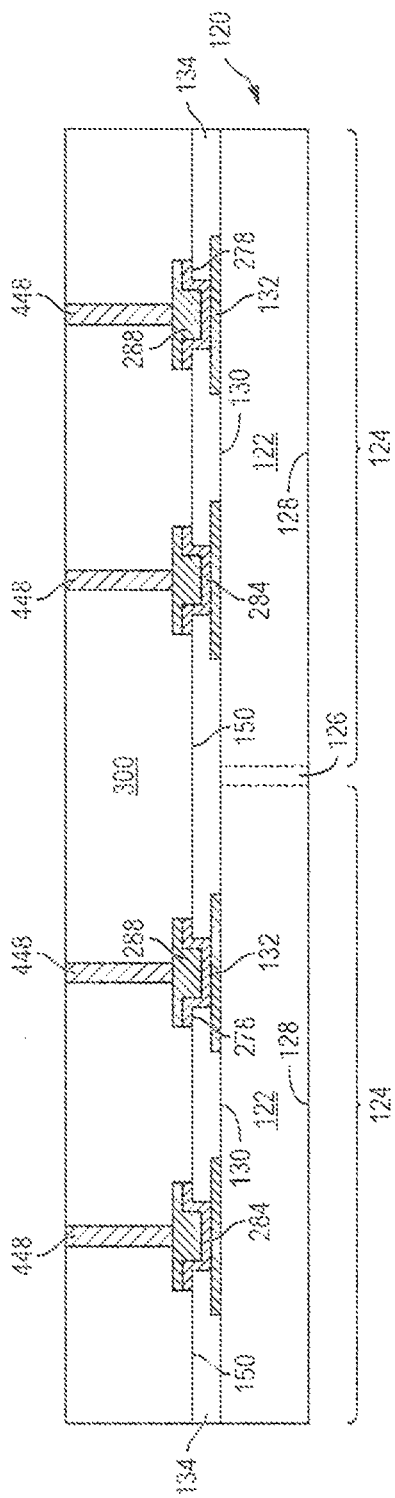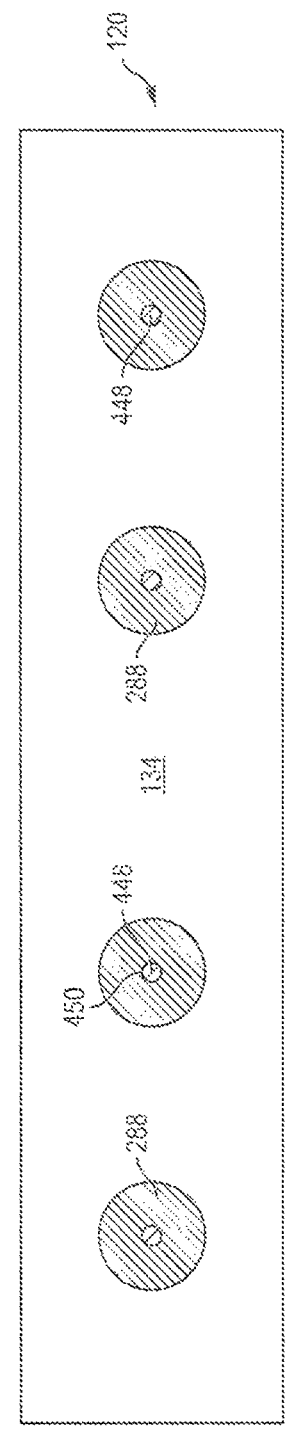
FIG. 18c
FIG. 18d

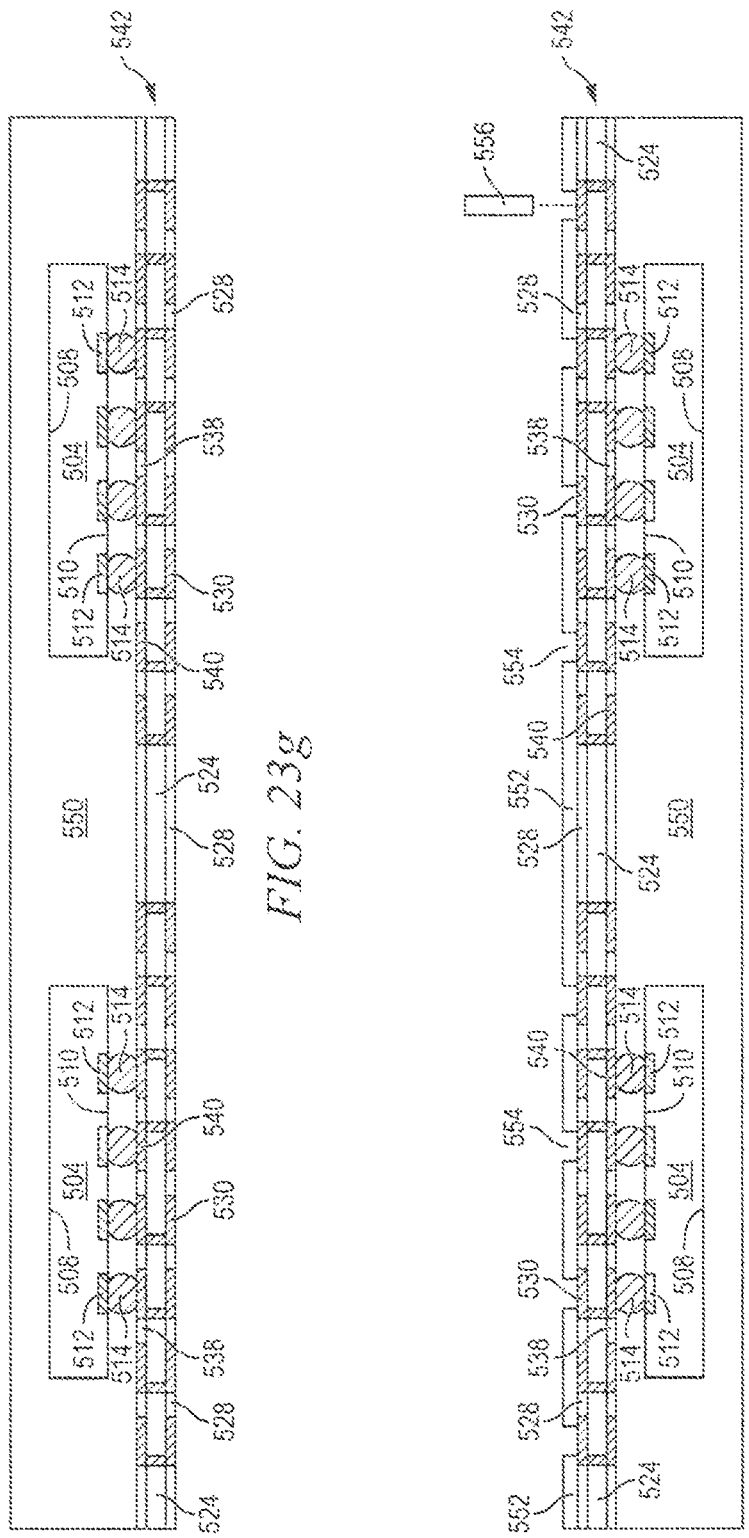

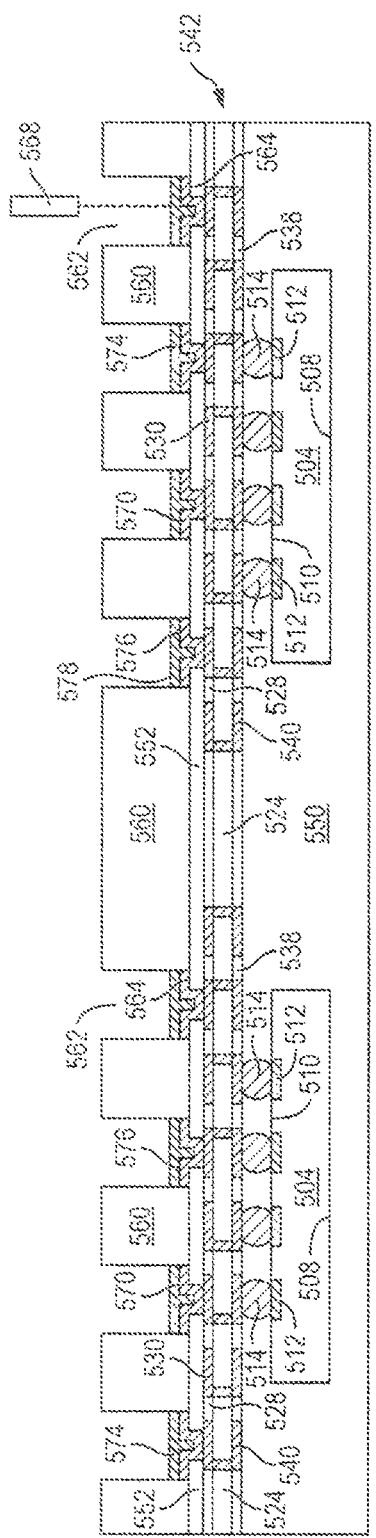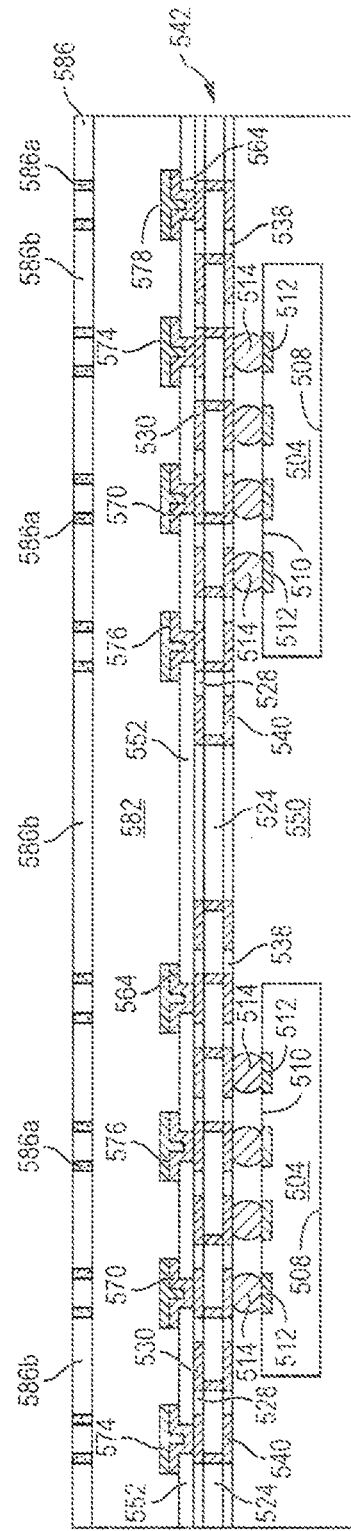
FIG. 23i
FIG. 23j

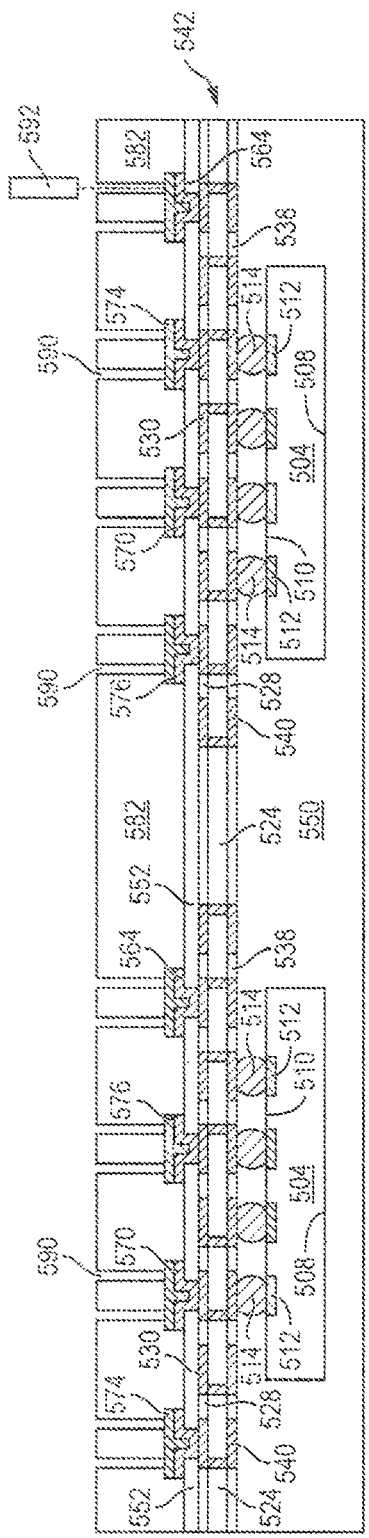
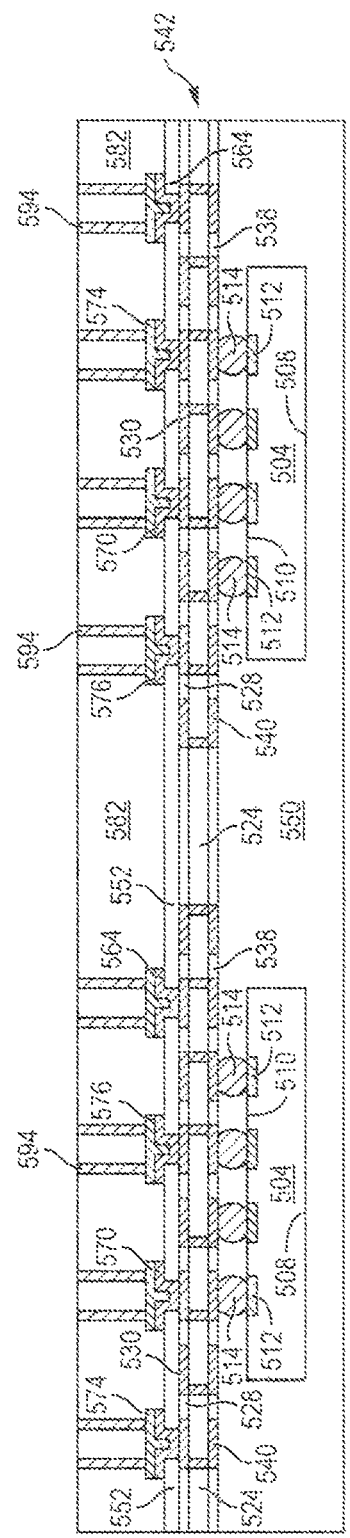
FIG. 23k
FIG. 23l

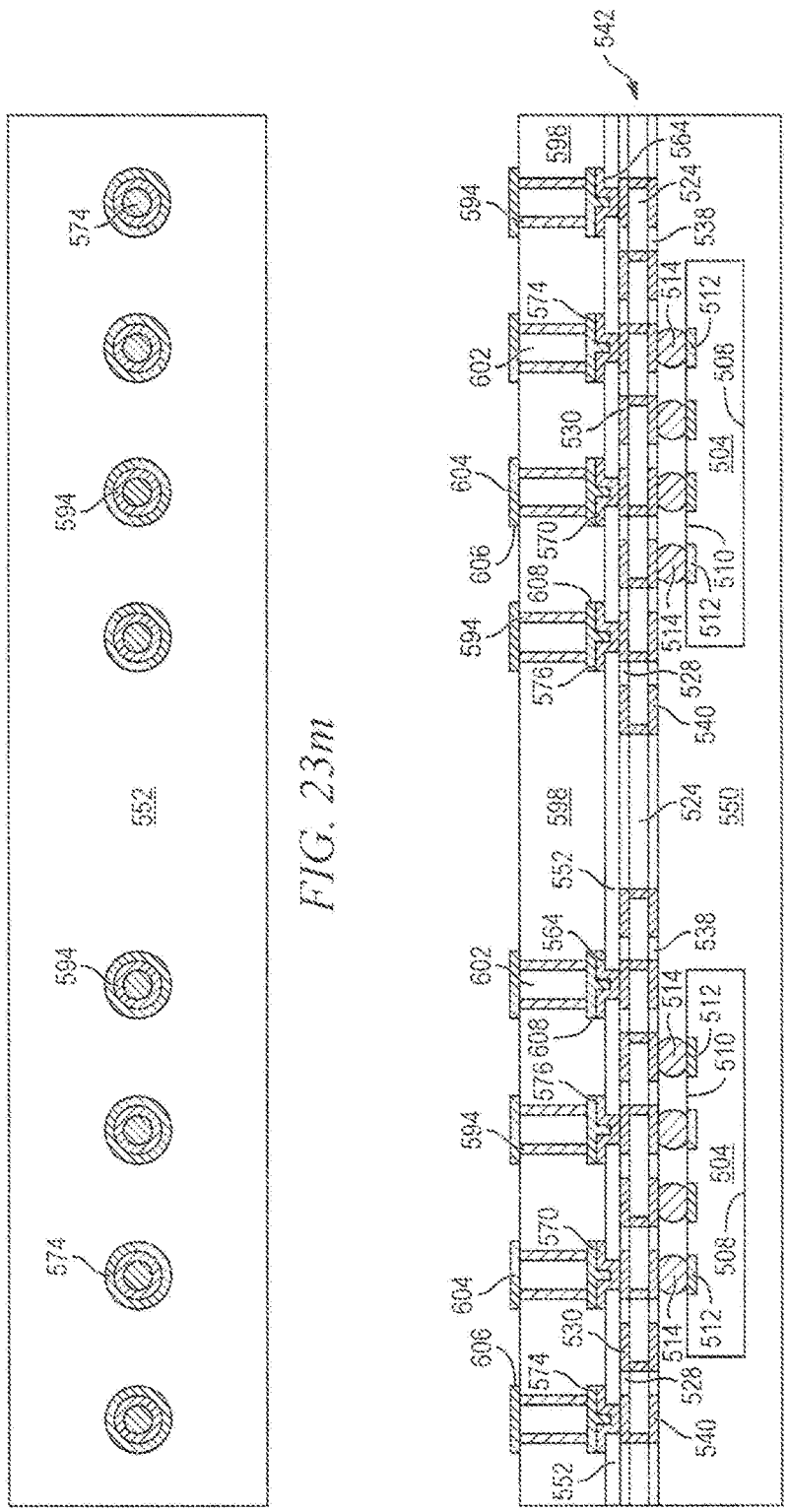

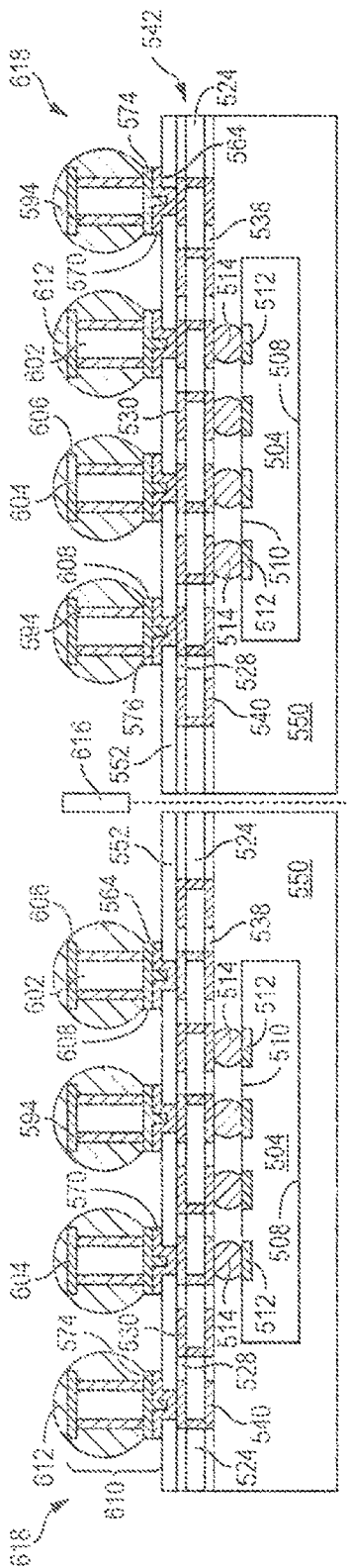
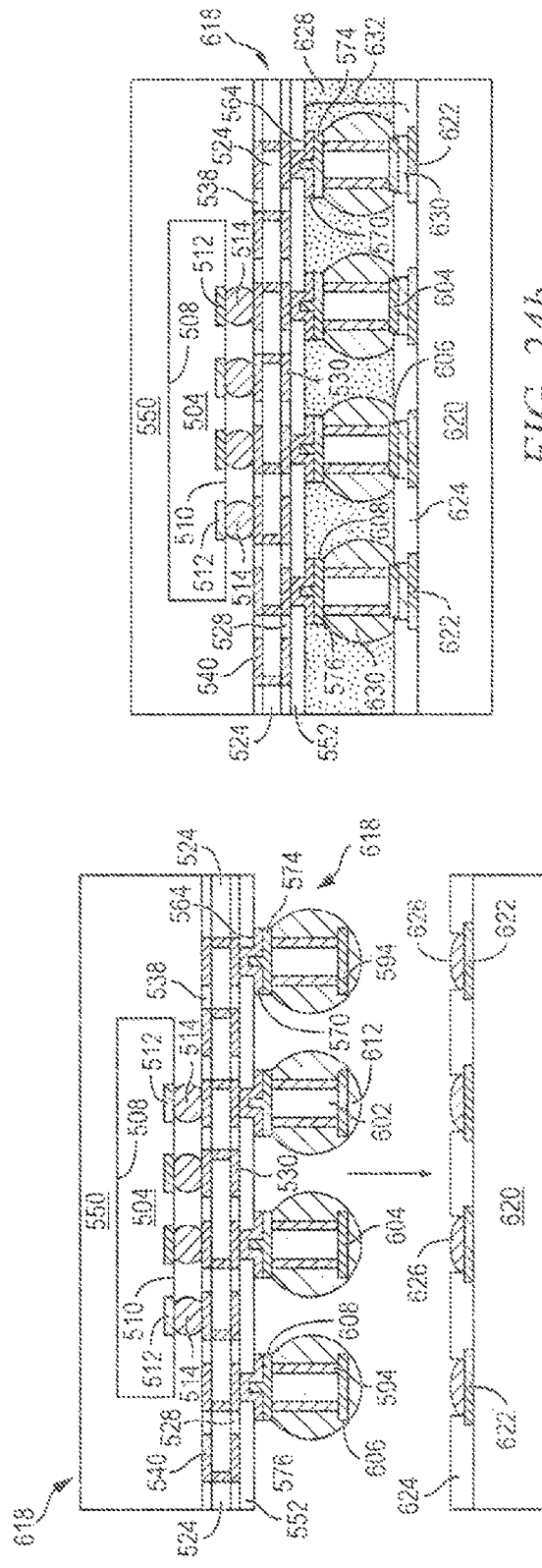

SEMICONDUCTOR DEVICE AND METHOD OF FORMING COMPLIANT CONDUCTIVE INTERCONNECT STRUCTURE IN FLIPCHIP PACKAGE

FIELD OF THE INVENTION

The present invention relates in general to semiconductor devices and, more particularly, to a semiconductor device and method of forming a compliant conductive interconnect structure in a flipchip package.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation. The term "semiconductor die" as used herein refers to both the singular and plural form of the words, and accordingly, can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

One common technique of interconnecting a semiconductor die with a printed circuit board (PCB) or other substrate involves the use of bumps. FIG. 1 illustrates a conventional semiconductor device 10 with flipchip type semiconductor die 12 having an active surface 14 and contact pads 16 formed over active surface 14. An insulating or passivation layer 18 is formed over active surface 14 and contact pads 16. A portion of insulating layer 18 is removed to expose contact pads 16. An electrically conductive layer 20 is conformally applied over the exposed contact pads 16 and insulating layer 18. Conductive layer 20 operates as an under bump metallization (UBM) layer electrically connected to contact pads 16. A conductive bump material 22 is deposited over conductive layer 20.

A substrate or PCB 24 has one or more conductive layers 26 operating as conductive traces or contact pads. An insulating or passivation layer 28 is formed over conductive layer 26. A portion of insulating layer 28 is removed to expose conductive layer 26. A conductive pre-solder or bump material 29 is deposited over the exposed conductive layer 26. Semiconductor die 12 is positioned over and mounted to substrate 24 using a pick and place operation with active surface 14 oriented toward substrate 24. Bumps 22 and 29 are reflowed and merge to form a bump interconnect structure mechanically and electrically connecting semiconductor die 12 to conductive layer 26 of substrate 24.

FIG. 2 illustrates another conventional semiconductor device with flipchip type semiconductor die 12 having an active surface 14 and contact pads 16 formed over active surface 14. An insulating or passivation layer 18 is formed over active surface 14 and contact pads 16. A portion of insulating layer 18 is removed to expose contact pads 16. An electrically conductive layer 20 is conformally applied over the exposed contact pads 16 and insulating layer 18. Conductive layer 20 operates as a UBM layer electrically connected to contact pads 16. A conductive pillar 30 is formed over conductive layer 20. A conductive bump material 32 is deposited over conductive pillar 30.

A substrate or PCB 34 has one or more conductive layers 36 operating as conductive traces or contact pads. An insulating layer 38 is formed over conductive layer 36. A portion of insulating layer 38 is removed to expose conductive layer 36. A pre-solder or bump material 40 is deposited over conductive layer 36. Semiconductor die 12 is positioned over and mounted to substrate 34 using a pick and place operation with active surface 14 and conductive pillars 30 oriented toward the substrate. Bumps 32 and 40 are reflowed and merge to form a bump interconnect structure mechanically and electrically connecting conductive pillars 30 and semiconductor die 12 to conductive layer 36 of substrate 34.

In each case of FIGS. 1-2, the bump interconnect structure is susceptible to de-wetting of the UBM layer and exhibits weak joints and reliability problems. For example, semiconductor die 12 has a problem with delamination or damage of the extremely-low dielectric constant (ELK) interlayer dielectric layer (ILD) around the bump area. When the semiconductor wafer is subjected to thermal or mechanical stress, the ELK ILD delamination or damage can occur which causes defects in the semiconductor die. Similarly, semiconductor die 12 is subject to pre-solder cracking at the junction with the substrate. The incidence of pre-solder cracking and ELK delamination reduces reliability and manufacturing yield, and increases cost.

SUMMARY OF THE INVENTION

A need exists for a reliable interconnect structure robust against cracking and other joint reliability issues. Accordingly, in one embodiment, the present invention is a method of making a semiconductor device comprising the steps of providing a semiconductor die having a contact pad, forming a first conductive layer over the contact pad, forming a conductive shell having a hollow core over the first conductive layer, depositing a compliant material in the hollow core, and mounting the semiconductor die over a substrate with the conductive shell electrically connected to a conductive trace on the substrate.

In another embodiment, the present invention is a method of making a semiconductor device comprising the steps of providing a semiconductor die having a contact pad, forming a first conductive layer over the contact pad, forming a conductive shell having a hollow core over the first conductive layer, and mounting the semiconductor die over a substrate with the conductive shell electrically connected to a conductive trace on the substrate.

In another embodiment, the present invention is a method of making a semiconductor device comprising the steps of providing a first substrate, and forming a compliant composite conductive interconnect structure over the first substrate.

In another embodiment, the present invention is a semiconductor device comprising a substrate. A compliant composite conductive interconnect structure is formed over the substrate.

BRIEF DESCRIPTION OF THE DRAWINGS

FIGS. 9a-9d illustrate a process of forming a covered compliant conductive interconnect structure over a semiconductor wafer;

FIGS. 11a-11l illustrate a process of forming a narrow compliant conductive interconnect structure with conductive bump material over a semiconductor wafer;

FIGS. 15a-15f illustrate a process of forming a compliant conductive interconnect structure with a conductive lip over a semiconductor wafer;

FIGS. 18a-18f illustrate a process of forming a compliant conductive interconnect structure with a narrow conductive column and external conductive bump material;

FIGS. 24a-24b illustrate a process of mounting a semiconductor package having a compliant conductive interconnect structure over a substrate.

DETAILED DESCRIPTION OF THE DRAWINGS

Figure 1:
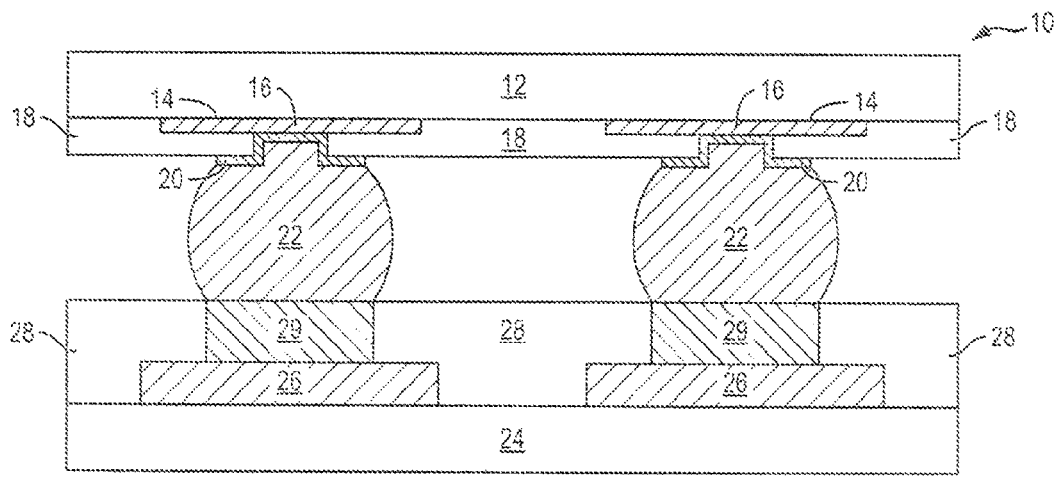
FIG. 1 illustrates a conventional semiconductor die mounted to a substrate with bump material.
Figure 2:
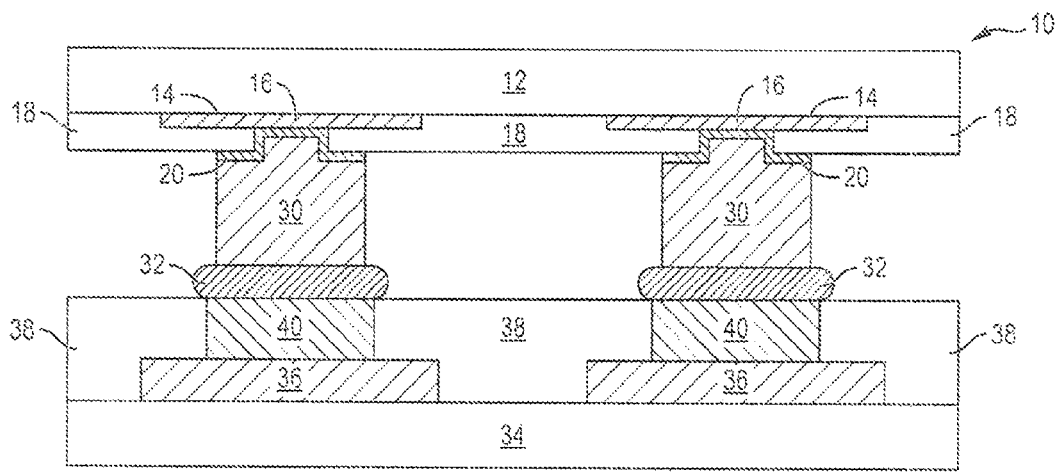
FIG. 2 illustrates a conventional semiconductor die mounted to a substrate with a conductive pillar and bump material.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. In one embodiment, the portion of the photoresist pattern subjected to light is removed using a solvent, exposing portions of the underlying layer to be patterned. In another embodiment, the portion of the photoresist pattern not subjected to light, the negative photoresist, is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Patterning is the basic operation by which portions of the top layers on the semiconductor wafer surface are removed. Portions of the semiconductor wafer can be removed using photolithography, photomasking, masking, oxide or metal removal, photography and stenciling, and microlithography. Photolithography includes forming a pattern in reticles or a photomask and transferring the pattern into the surface layers of the semiconductor wafer. Photolithography forms the horizontal dimensions of active and passive components on the surface of the semiconductor wafer in a two-step process. First, the pattern on the reticle or masks is transferred into a layer of photoresist. Photoresist is a light-sensitive material that undergoes changes in structure and properties when exposed to light. The process of changing the structure and properties of the photoresist occurs as either negative-acting photoresist or positive-acting photoresist. Second, the photoresist layer is transferred into the wafer surface. The transfer occurs when etching removes the portion of the top layers of semiconductor wafer not covered by the photoresist. The chemistry of photoresists is such that the photoresist remains substantially intact and resists removal by chemical etching solutions while the portion of the top layers of the semiconductor wafer not covered by the photoresist is removed. The process of forming, exposing, and removing the photoresist, as well as the process of removing a portion of the semiconductor wafer can be modified according to the particular resist used and the desired results.

In negative-acting photoresists, photoresist is exposed to light and is changed from a soluble condition to an insoluble condition in a process known as polymerization. In polymerization, unpolymerized material is exposed to a light or energy source and polymers form a cross-linked material that is etch-resistant. In most negative resists, the polymers are polyisoprenes. Removing the soluble portions (i.e., the portions not exposed to light) with chemical solvents or developers leaves a hole in the resist layer that corresponds to the opaque pattern on the reticle. A mask whose pattern exists in the opaque regions is called a clear-field mask.

In positive-acting photoresists, photoresist is exposed to light and is changed from relatively nonsoluble condition to much more soluble condition in a process known as photo-solubilization. In photosolubilization, the relatively insoluble resist is exposed to the proper light energy and is converted to a more soluble state. The photosolubilized part of the resist can be removed by a solvent in the development process. The basic positive photoresist polymer is the phenol-formaldehyde polymer, also called the phenol-formaldehyde novolak resin. Removing the soluble portions (i.e., the portions exposed to light) with chemical solvents or developers leaves a hole in the resist layer that corresponds to the transparent pattern on the reticle. A mask whose pattern exists in the transparent regions is called a dark-field mask.

After removal of the top portion of the semiconductor wafer not covered by the photoresist, the remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual semiconductor die and then packaging the semiconductor die for structural support and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 3:
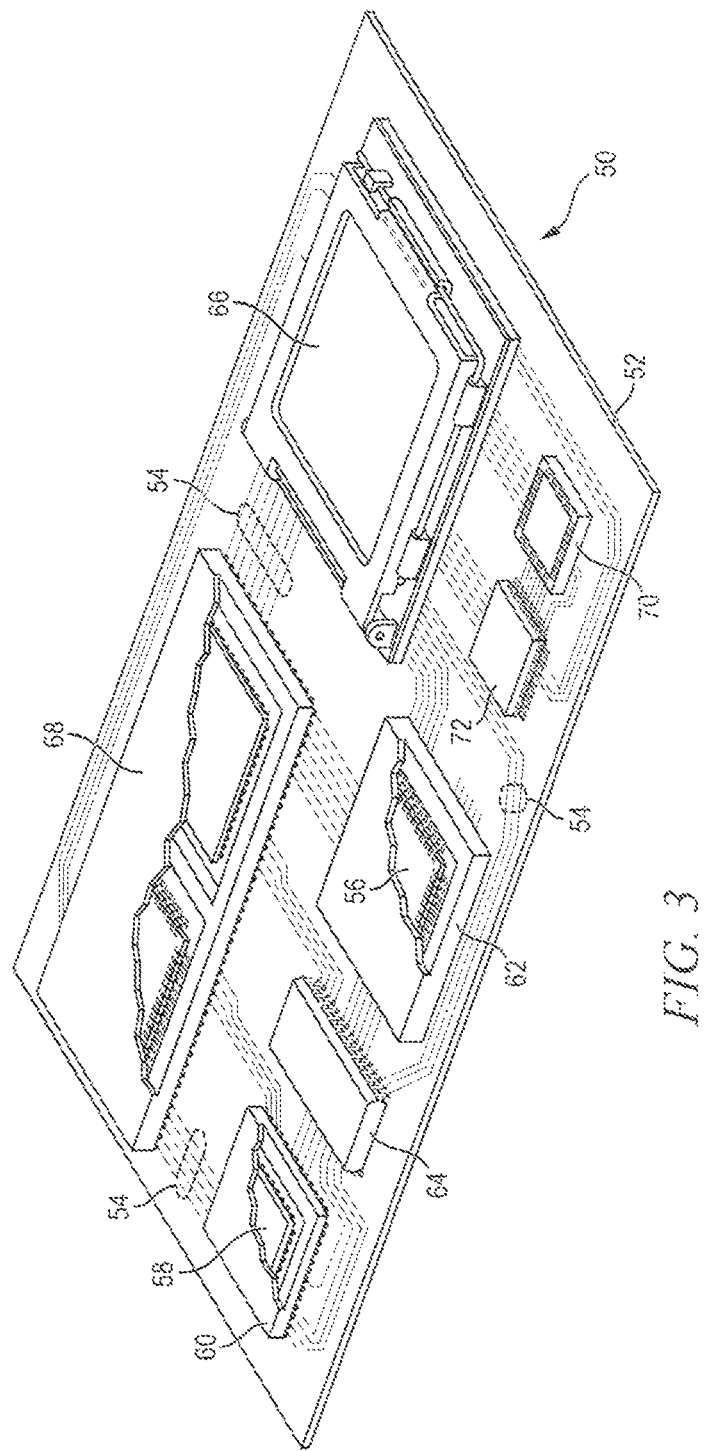
FIG. 3 illustrates a PCB with different types of packages mounted to its surface.

FIG. 3 illustrates electronic device 50 having a chip carrier substrate or PCB 52 with a plurality of semiconductor packages mounted on its surface. Electronic device 50 can have one type of semiconductor package, or multiple types of semiconductor packages, depending on the application. The different types of semiconductor packages are shown in FIG. 3 for purposes of illustration.

Electronic device 50 can be a stand-alone system that uses the semiconductor packages to perform one or more electrical functions. Alternatively, electronic device 50 can be a sub-component of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. Miniaturization and weight reduction are essential for these products to be accepted by the market. The distance between semiconductor devices must be decreased to achieve higher density.

In FIG. 3, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

Figure 4A:
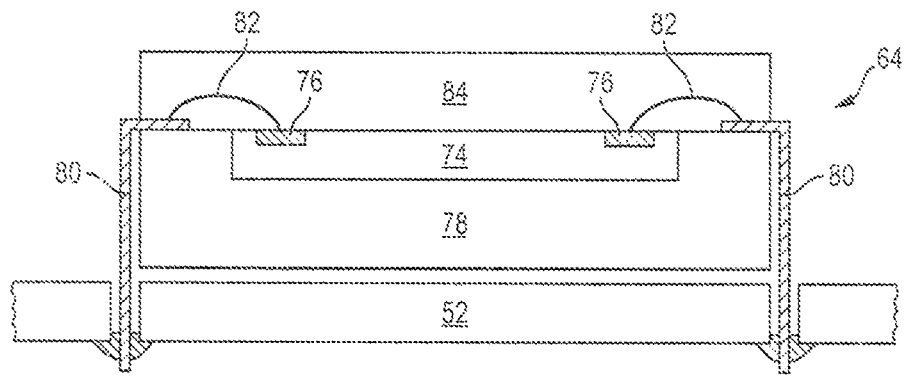
FIGS. 4a-4c illustrate further detail of the representative semiconductor packages mounted to the PCB.
Figure 4B:
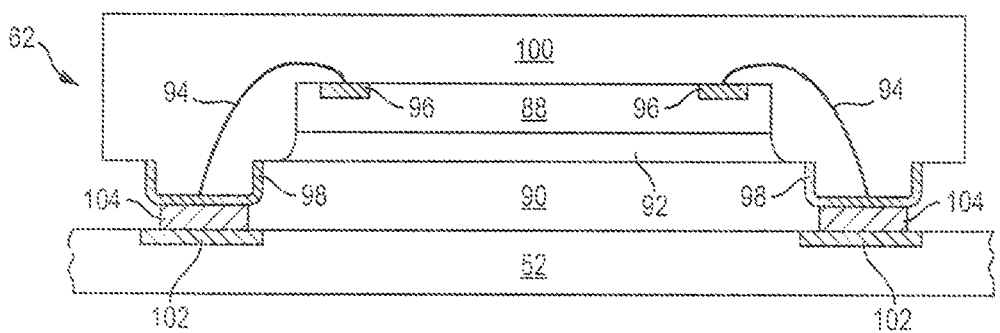
Figure 4C:
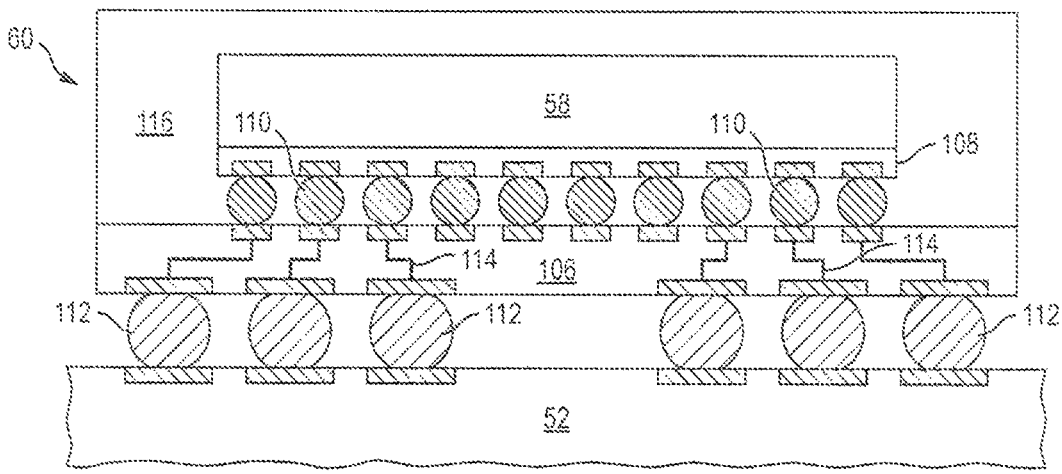

FIGS. 4a-4c show exemplary semiconductor packages. FIG. 4a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit can include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating semiconductor die 74 or bond wires 82.

FIG. 4b illustrates further detail of BCC 62 mounted on PCB 52. Semiconductor die 88 is mounted over carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 4c, semiconductor die 58 is mounted face down to intermediate carrier 106 with a flipchip style first level packaging. Active region 108 of semiconductor die 58 contains analog or digital circuits implemented as active devices, passive devices, conductive layers, and dielectric layers formed according to the electrical design of the die. For example, the circuit can include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flipchip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flipchip style first level packaging without intermediate carrier 106.

Figure 5C:
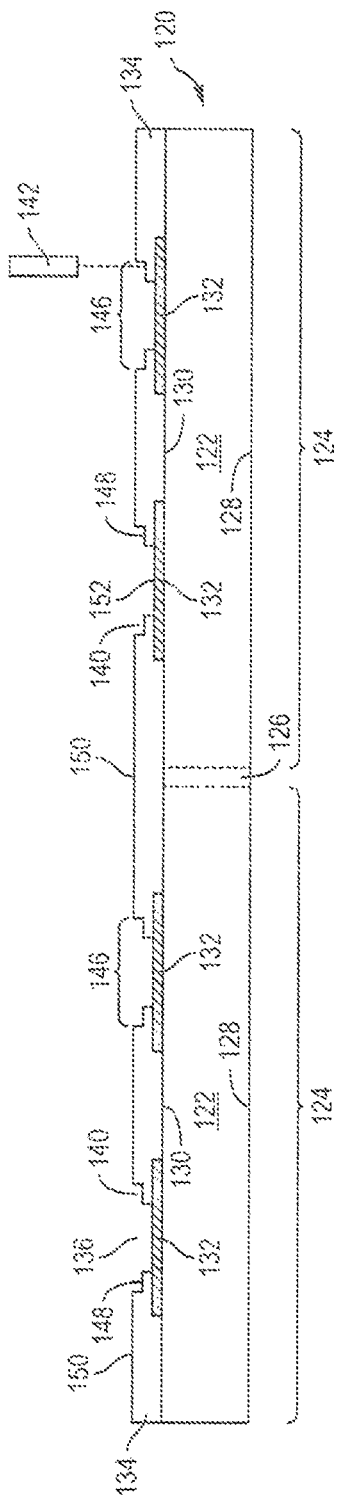
FIGS. 5a-5o illustrate a process of forming a compliant conductive interconnect structure over a semiconductor wafer.
Figure 5D:
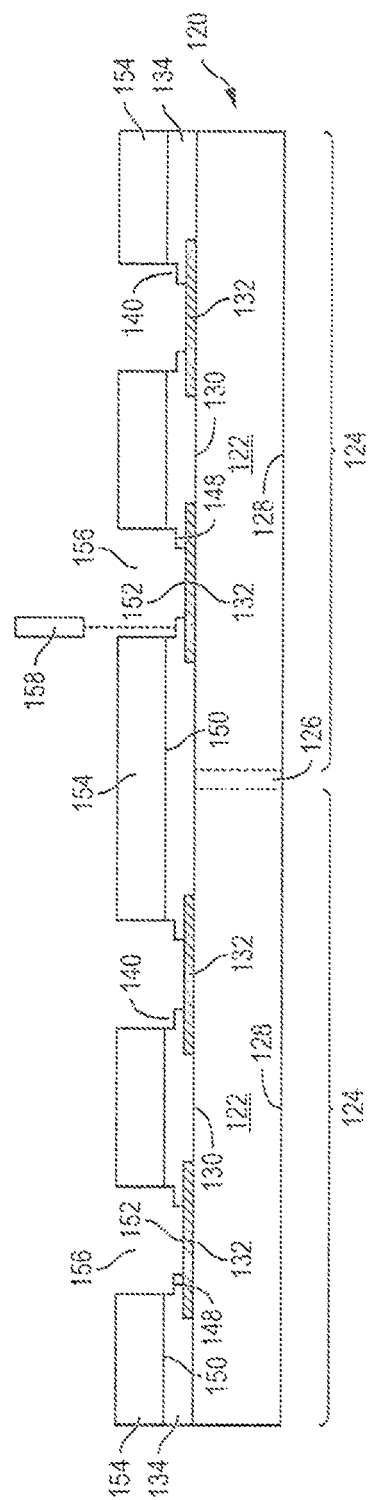
Figure 5E:
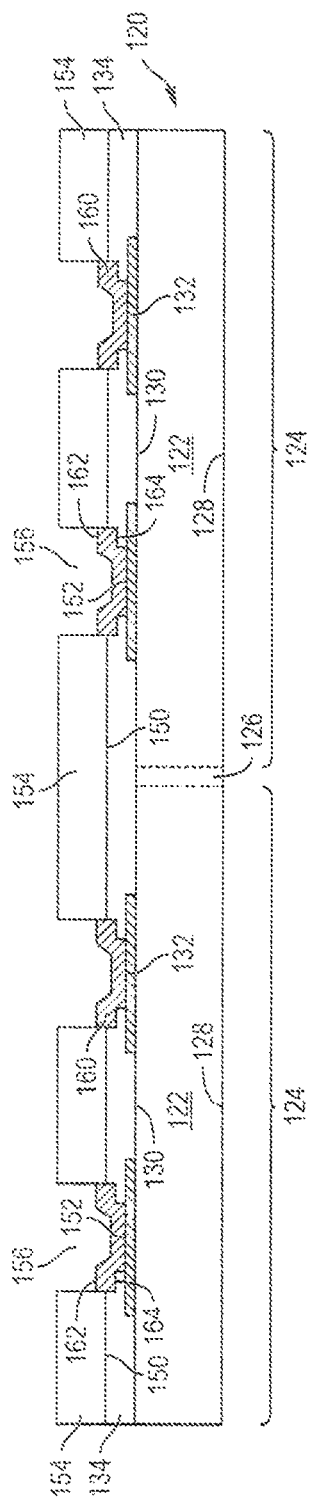
Figure 5F:
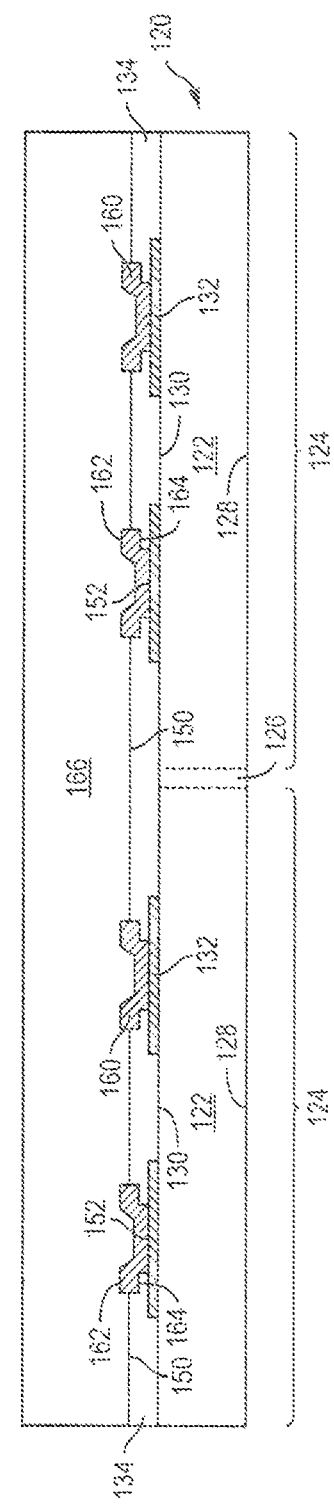
Figure 5I:
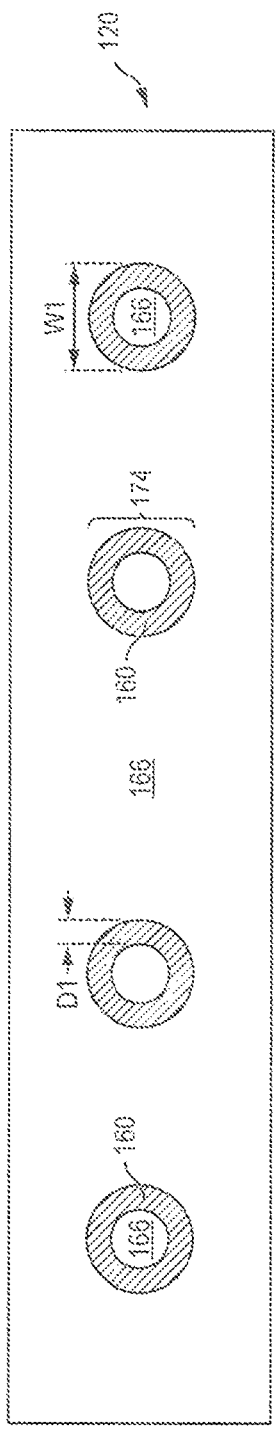
Figure 5J:
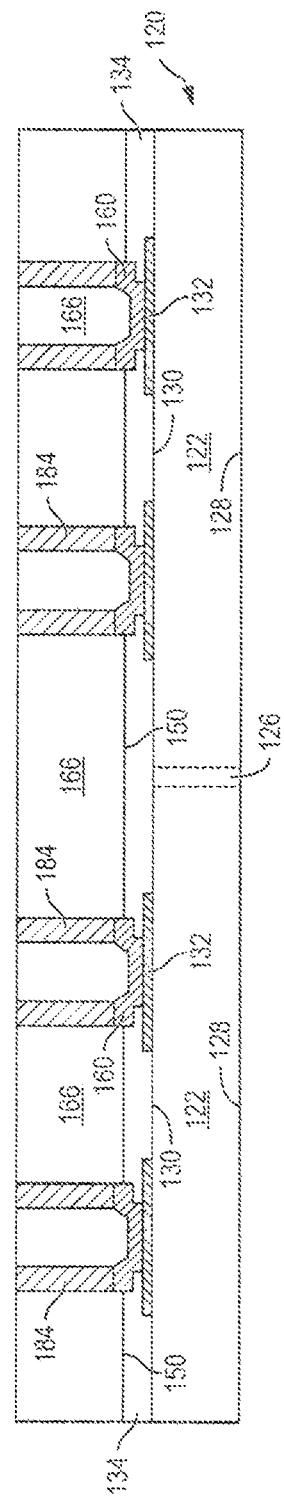
Figure 5M:
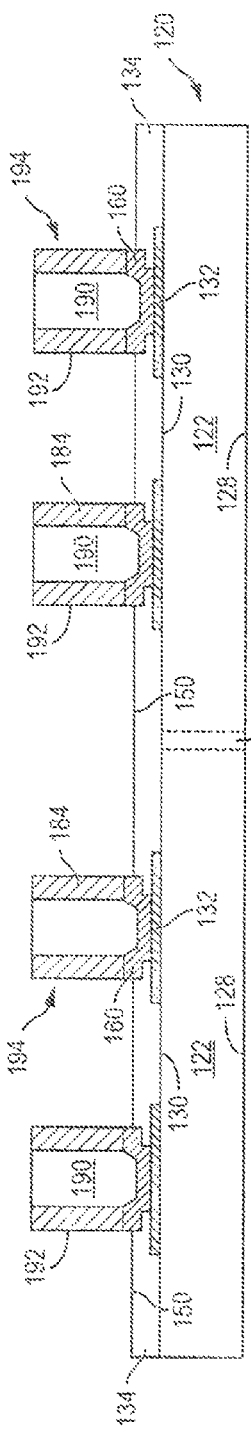
Figure 5N:
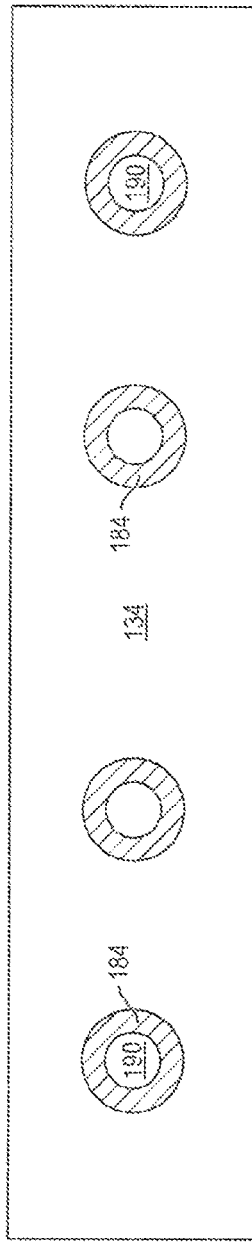
Figure 5O:
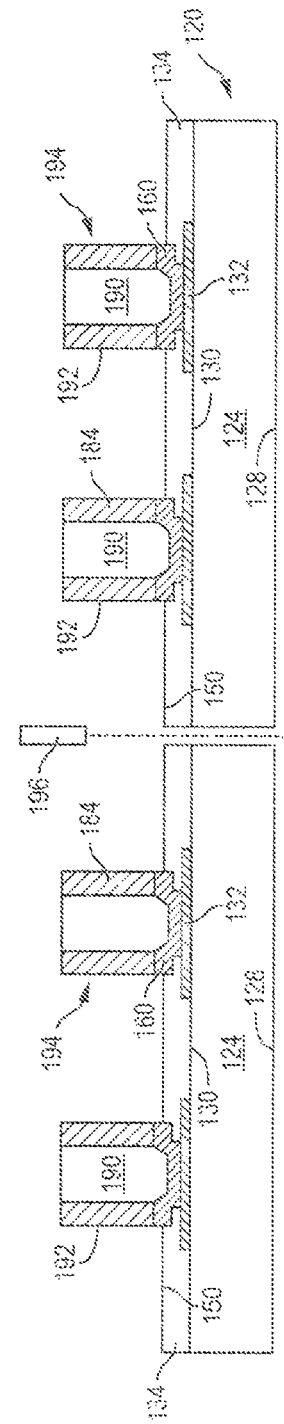

FIGS. 5a-5o illustrate, in relation to FIGS. 3 and 4a-4c, a process of forming a compliant conductive interconnect structure over a semiconductor wafer. FIG. 5a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by a non-active, inter-die wafer area or saw street 126 as described above. Saw street 126 provides cutting areas to singulate semiconductor wafer 120 into individual semiconductor die 124.

FIG. 5b shows a cross-sectional view of a portion of semiconductor wafer 120. Each semiconductor die 124 has a back surface 128 and active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPDs), such as inductors, capacitors, and resistors, for RF signal processing.

An electrically conductive layer 132 is formed over active surface 130 using PVD, CVD, electrolytic plating, electroless plating process, or other suitable metal deposition process. Conductive layer 132 can be one or more layers of Al, Cu, Sn, Ni, Au, Ag, or other suitable electrically conductive material. Conductive layer 132 operates as contact pads electrically connected to the circuits on active surface 130. Conductive layer 132 can be disposed side-by-side a first distance from the edge of semiconductor die 124, as shown in FIG. 5b. Alternatively, conductive layer 132 can be offset in multiple rows such that a first row of contact pads is disposed a first distance from the edge of the die, and a second row of contact pads alternating with the first row is disposed a second distance from the edge of the die.

An insulating or passivation layer 134 is formed over active surface 130 and conductive layer 132 using PVD, CVD, printing, spin coating, spray coating, screen printing or lamination. Insulating layer 134 contains one or more layers of silicon dioxide (SiO2), silicon nitride (Si3N4), silicon oxynitride (SiON), tantalum pentoxide (Ta2O5), aluminum oxide (Al2O3), polyimide (PI), or other material having similar insulating and structural properties. A portion of insulating layer 134 over conductive layer 132 is removed by an etching process with a patterned photoresist layer, to form opening 136 and to expose conductive layer 132. Alternatively, a portion of insulating layer 134 is removed by laser direct ablation (LDA) using laser 138 to form opening 136 and to expose conductive layer 132.

In FIG. 5c, a portion of insulating layer 134 over conductive layer 132 and outside a footprint of opening 136 is removed by an etching process with a patterned photoresist layer, to form opening 140. Alternatively, a portion of insulating layer 134 is removed by LDA using laser 142 to form opening 140. Opening 140 has a cross-sectional width greater than a cross-sectional width of opening 136, such that opening 136 lies within a footprint of opening 140. Similarly, conductive layer 132 has a cross-sectional width that is greater than the cross-sectional width of opening 140 such that the footprint of opening 140 lies within a footprint of conductive layer 132. Collectively, opening 140 and opening 136 constitute opening 146. Opening 140 extends only partially through insulating layer 134, such that a surface 148 of insulating layer 134 within opening 140 is vertically offset from surface 150 of insulating layer 134 and recessed within insulating layer 134. Surface 148 is also vertically offset from exposed surface 152 of conductive layer 132. Thus, opening 146 has a stepped sidewall. In another embodiment, opening 146 has a straight or sloped sidewall.

In FIG. 5d, a patterning or photoresist layer 154 is formed over insulating layer 134 using printing, spin coating, or spray coating. In some embodiments that utilize an insulating layer for patterning, the insulating layer can include one or more layers of SiO2, Si3N4, SiON, Ta2O5, Al2O3, or other material having similar structural properties. A portion of photoresist layer 154 over opening 140 is removed by an etching process to form opening 156 and to expose surface 148 of insulating layer 134 and conductive layer 132. Alternatively, a portion of photoresist layer 154 is removed by LDA using laser 158 to form opening 156 and expose surface 148 of insulating layer 134 and conductive layer 132. In one embodiment, opening 156 has a circular cross-sectional area configured to form a conductive shell with a cylindrical shape including a circular cross-section. In another embodiment, opening 156 has a rectangular cross-sectional area configured to form a conductive shell with a cubic shape including a rectangular cross-section. After forming opening 156, photoresist layer 154 maintains coverage over surface 150 of insulating layer 134. In another embodiment, opening 156 exposes a portion of surface 150 of insulating layer 134.

In FIG. 5e, an electrically conductive layer 160 is conformally applied over insulating layer 134 and conductive layer 132 within opening 156, using a patterning and metal deposition process such as printing, PVD, CVD, sputtering, electrolytic plating, and electroless plating. Conductive layer 160 can be one or more layers of Al, Cu, Sn, titanium (Ti), Ni, Au, Ag, or other suitable electrically conductive material. In one embodiment, conductive layer 160 is a multi-layer stack including a seed layer, barrier layer, and adhesion layer. The seed layer can be titanium copper (TiCu), titanium tungsten copper (TiWCu), or tantalum nitrogen copper (TaNCu). The barrier layer can be Ni, nickel vanadium (NiV), platinum (Pt), palladium (Pd), titanium tungsten (TiW), or CrCu, or other suitable material. The adhesion layer can be Ti, TiN, TiW, Al, or chromium (Cr), or other suitable material.

Conductive layer 160 is electrically connected to conductive layer 132 of semiconductor die 124 and follows the contour of insulating layer 134 and conductive layer 132. An exposed surface 162 of conductive layer 160 is vertically offset from surface 150 of insulating layer 134 such that a portion of conductive layer 160 protrudes or extends outside insulating layer 134. A surface 164 of conductive layer 160 is vertically offset from surface 150 of insulating layer 134, such that a portion of conductive layer 160 is recessed within insulating layer 134. Thus, surfaces 162 and 164 of conductive layer 160 are not coplanar with surface 150 of insulating layer 134. In another embodiment, surface 162 of conductive layer 160 is coplanar with surface 150 of insulating layer 134. In another embodiment, a portion of insulating layer 134 is not removed outside a footprint of opening 136 to form opening 140, such that surface 164 of conductive layer 160 is coplanar with surface 150 of insulating layer 134.

In FIG. 5f, photoresist layer 154 is removed by an etching process to expose surface 150 of insulating layer 134. A patterning or photoresist layer 166 is formed over insulating layer 134 and conductive layer 160 using printing, spin coating, or spray coating. In some embodiments that utilize an insulating layer for patterning, the insulating layer can include one or more layers of SiO2, Si3N4, SiON, Ta2O5, Al2O3, or other material having similar structural properties.

In FIG. 5g, a masking layer 170 is disposed over photoresist layer 166. Masking layer 170 has a solid or opaque portion 170a and a transparent portion 170b disposed over conductive layer 160. Opaque portion 170a is formed in a generally circular ring shape over conductive layer 160, such that opaque portion 170a forms a circular ring over a perimeter of the footprint of conductive layer 160. The shape of opaque portion 170a can vary according to the design and function of semiconductor die 124, and can be formed, for example, in a generally oval, rectangular, or square shape. Transparent portion 170*b* is formed adjacent to opaque portion 170*a* outside a footprint of conductive layer 160. Transparent portion 170*b* is also formed centrally to opaque portion 170*a*, such that a portion of transparent portion 170*b* is disposed over the footprint of conductive layer 160. Masking layer 170 is exposed to ultraviolet (UV) light, which passes through transparent portion 170*b*. The portion of photoresist layer 166 outside the footprint of opaque portion 170*a* is irradiated with UV light to cure photoresist layer 166 within a footprint of transparent portion 170*b*.

In FIG. 5*h*, masking layer 170 is removed and the non-irradiated portion of photoresist layer 166 is removed by an etching process to form channel or opening 174 and to expose a portion of conductive layer 160 around and along the perimeter of conductive layer 160. Alternatively, a portion of photoresist layer 166 is removed by LDA using laser 180 to form opening 174 and to expose a portion of conductive layer 160 around and along the perimeter of conductive layer 160. A portion of photoresist layer 166 maintains coverage over a central portion of conductive layer 160. Opening 174 has a cross-sectional width W1, measured across opening 174, which can vary according to the design and function of semiconductor die 124 by adjusting the shape, size, and position of opaque portion 170*a* of masking layer 170. Distance D1, measured between sidewalls of opening 174, can also be adjusted according to the design and function of semiconductor die 124 by adjusting the shape, size, and position of opaque portion 170*a* of masking layer 170.

FIG. 5*i* shows a top or plan view of the assembly from FIG. 5*h*. Opening 174 is formed in a generally circular or ring shape and exposes a portion of conductive layer 160 around and along the perimeter of conductive layer 160. The shape of opening 174 can vary according to the design and function of semiconductor die 124. In another embodiment, the footprint of opening 174 is generally oval, rectangular, or square. Photoresist layer 166 covers insulating layer 134 and a central portion of conductive layer 160.

Continuing from FIG. 5*h*, an electrically conductive layer 184 is formed over conductive layer 160 within opening 174 using a patterning and metal deposition process such as printing, PVD, CVD, sputtering, electrolytic plating, and electroless plating, as shown in FIG. 5*j*. Conductive layer 184 can be one or more layers of Al, Cu, Sn, Ti, Ni, Au, Ag, or other suitable electrically conductive material. Conductive layer 184 constitutes a conductive hollow pillar or conductive shell. Conductive shell 184 is electrically connected to conductive layer 160. The shape of conductive shell 184 can vary according to the design and function of semiconductor die 124 and can be, for example, generally cylindrical or cubic.

In FIG. 5*k*, photoresist layer 166 is removed by an etching process to expose insulating layer 134 and conductive layer 160. After photoresist layer 166 is removed, conductive shell 184 has a hollow core 186. A patterning or photoresist layer 188 is formed over insulating layer 134 outside a footprint, or in a peripheral region of conductive shell 184 using printing, spin coating, or spray coating. In some embodiments that utilize an insulating layer for patterning, the insulating layer can include one or more layers of SiO2, Si3N4, SiON, Ta2O5, Al2O3, or other material having similar structural properties.

The hollow core 186 of conductive shell 184 can be filled with a compliant material, as shown in FIG. 5*l*, to form a compliant core 190 of conductive shell 184. Compliant core 190 can include an encapsulant, molding compound, polymer composite material, such as epoxy resin with filler, epoxy acrylate with filler, or polymer with proper filler. Compliant core 190 can also be one or more layers of SiO2, Si3N4, SiON, Ta2O5, Al2O3, PI, BCB, PBO, or other suitable insulating or dielectric material. Alternatively, compliant core 190 can remain hollow. Compliant core 190 has a lower Young's modulus than the material of conductive shell 184. In one embodiment, compliant core 190 has a Young's modulus less than 10 gigapascals (GPa). Thus, compliant core 190 is softer or more compliant than the material of conductive shell 184.

In FIG. 5*m*, photoresist layer 188 is removed using an etching process to expose insulating layer 134 and external sidewall 192 of conductive shell 184. Collectively, conductive layer 160, conductive shell 184, and compliant core 190 constitute a z-direction vertical compliant conductive interconnect structure or compliant pillar 194. Conductive shell 184 provides structural support for compliant pillar 194. Hollow core 186 of conductive shell 184 is filled with a compliant material, or remains hollow, to form compliant core 190. Compliant core 190 is softer or more compliant than the material of conductive shell 184. When compliant core 190 is filled with a compliant material, compliant core 190 provides additional structural support to compliant pillar 194. Because compliant core 190 is softer or more compliant than the material of conductive shell 184, compliant pillar 194 is less rigid than a solid conductive pillar and can conform or slightly change shape under stress, which reduces the incidence of pre-solder crack or ELK delamination.

FIG. 5*n* shows a top or plan view of the assembly from FIG. 5*m*. The footprint of conductive shell 184 is formed in a generally circular or ring shape around compliant core 190. The shape of conductive shell 184 can vary according to the design and function of semiconductor die 124. In another embodiment, the footprint of conductive shell 184 is generally oval, rectangular, or square.

In FIG. 5*o*, the assembly from FIG. 5*n* is singulated through insulating layer 134 and saw street 126 using a saw blade or laser cutting tool 196 into individual semiconductor die 124.

Figure 6A:
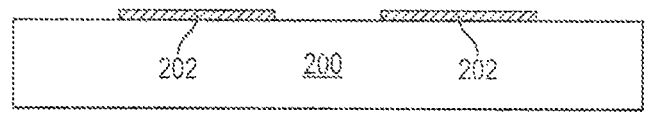
FIGS. 6a-6e illustrate a process of mounting a semiconductor die having a compliant conductive interconnect structure over a substrate.

FIGS. 6*a*-6*e* illustrate, in relation to FIGS. 3 and 4*a*-4*c*, a process of mounting a semiconductor die having a compliant conductive interconnect structure over a substrate. FIG. 6*a* shows a substrate or PCB 200 suitable for mounting semiconductor die 124. Substrate 200 can be one or more laminated layers of polytetrafluoroethylene pre-impregnated (prepreg), FR-4, FR-1, CEM-1, or CEM-3 with a combination of phenolic cotton paper, epoxy, resin, woven glass, matte glass, polyester, and other reinforcement fibers or fabrics. Alternatively, substrate 200 contains one or more laminated insulating or dielectric layers.

An electrically conductive layer 202 is formed over substrate 200 using a patterning and metal deposition process, such as silk screen printing, photoengraving, PCB milling, electroless plating, or electroplating process. Conductive layer 202 can be one or more layers of Al, Cu, Sn, Ni, Au, Ag, or other suitable electrically conductive material. Conductive layer 202 operates as conductive traces or contact pads for electrical interconnect. Portions of conductive layer 202 are electrically common or electrically isolated according to the design and function of semiconductor die 124.

Figure 6B:
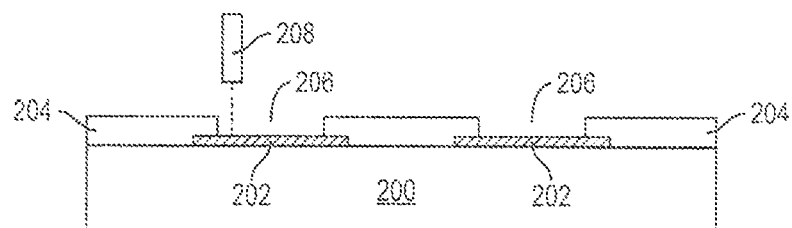

In FIG. 6*b* a solder resist or insulating layer 204 is formed over substrate 200 and conductive layer 202 using PVD, CVD, printing, spin coating, spray coating, screen printing or lamination. Insulating layer 204 contains one or more layers of SiO2, Si3N4, SiON, Ta2O5, Al2O3, PI, or other material having similar insulating and structural properties. A portion of insulating layer 204 over conductive layer 202 is removed by an etching process with a patterned photoresist layer, to form opening 206 and to expose conductive layer 202. Alternatively, a portion of insulating layer 204 is removed by LDA using laser 208 to form opening 206 and to expose conductive layer 202.

Figure 6C:
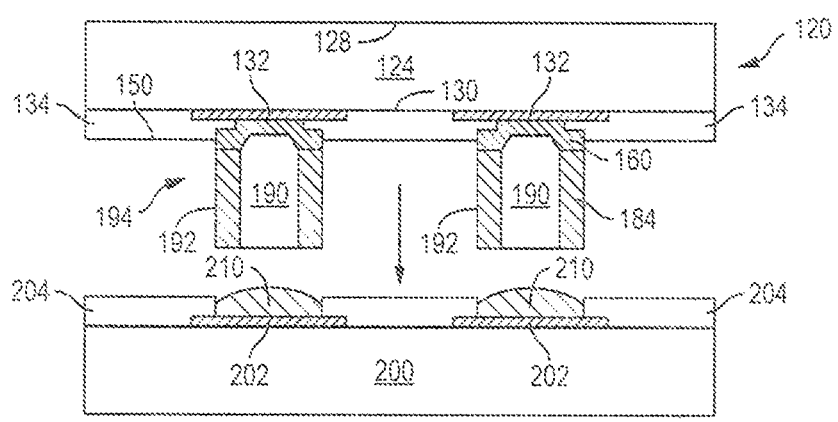

In FIG. 6c, an electrically conductive pre-solder or bump material is deposited over the exposed conductive layer 202 using an evaporation, electrolytic plating, electroless plating, ball drop, or screen printing process. The bump material can be Al, Sn, Ni, Au, Ag, lead (Pb), bismuth (Bi), Cu, solder, and combinations thereof, with an optional flux solution. For example, the bump material can be eutectic Sn/Pb, high-lead solder, or lead-free solder. In one embodiment, the bump material is reflowed by heating the material above its melting point to form pre-solder bumps 210. In some applications, bumps 210 are reflowed a second time to improve electrical contact to conductive layer 202. Bumps 210 can also be compression bonded to conductive layer 210. Bumps 210 represent one type of interconnect structure that can be formed over conductive layer 202. The interconnect structure can also use stud bump, micro bump, or other electrical interconnect. In another embodiment, bumps 210 are formed over compliant pillar 194 as a pre-solder bump cap. Semiconductor die 124 from FIGS. 5a-5o is positioned over and mounted to substrate 200 using a pick and place operation with active surface 130 oriented toward substrate 200. Compliant pillar 194 is aligned with conductive layer 202.

Figure 6D:
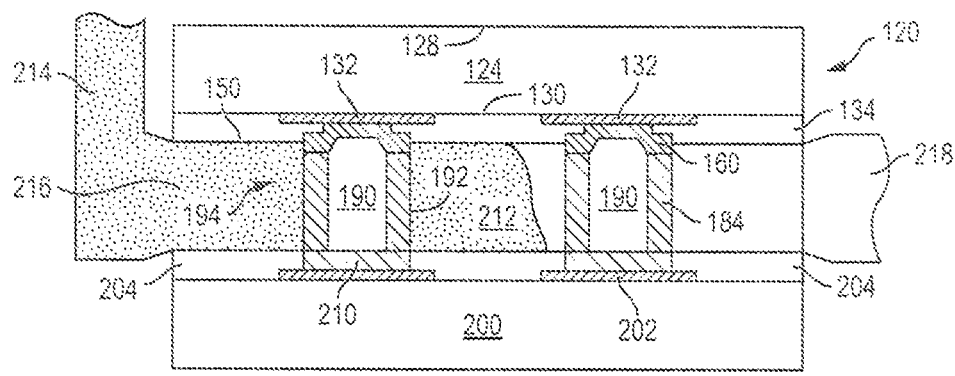

FIG. 6d shows semiconductor die 124 mounted over substrate 200. An underfill (UF) material or molding compound 212 is deposited between semiconductor die 124 and substrate 200. In one embodiment, UF material 212 is injected under pressure from a dispensing needle 214 to completely fill gap 216 between semiconductor die 124 and substrate 200 using an UF process. A vacuum assist 218 can draw UF material 212 to aid with uniform distribution between semiconductor die 124 and substrate 200 and between compliant pillars 194. UF material 212 can be an encapsulant, molding compound, polymer composite material, such as epoxy resin with filler, epoxy acrylate with filler, or polymer with proper filler. UF material 212 is non-conductive and environmentally protects semiconductor die 124 from external elements and contaminants.

Figure 6E:
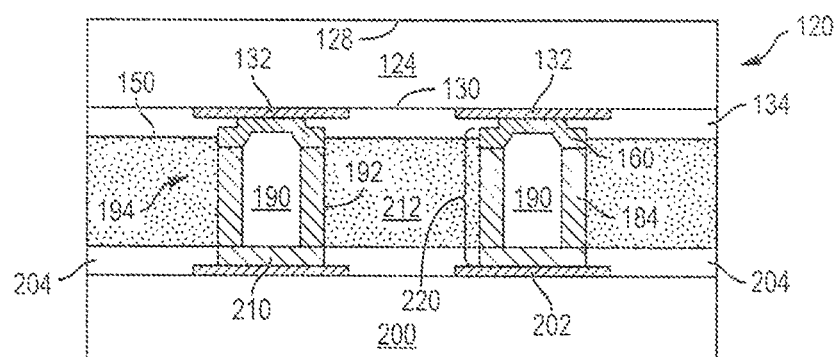

FIG. 6e shows UF material 212 disposed evenly and completely filling the space between semiconductor die 124 and substrate 200, and around and between compliant pillars 194. Collectively, compliant pillar 194 and bump 210 constitute a compliant composite conductive interconnect structure or compliant composite bump 220. Compliant composite bump 220 has a fusible portion, bump 210, and a non-fusible or non-collapsible portion, compliant pillar 194. Conductive shell 184 of compliant pillar 194 is electrically connected to bump 210 and conductive layer 202. Thus, semiconductor die 124 is electrically connected to conductive layer 202 of substrate 200 through compliant composite bump 220. Conductive shell 184 of compliant pillar 194 provides standoff distance between semiconductor die 124 and substrate 200. Thus, conductive shell 184 allows for fine pitch between adjacent bumps by requiring less bump material to achieve the desired standoff distance. Compliant core 190 of compliant pillar 194 is hollow or has a material that is softer or more compliant than the material of conductive shell 184. Because compliant core 190 is more compliant than conductive shell 184, compliant pillar 194 is less rigid than a solid conductive pillar and can conform or slightly change shape under stress, which reduces the incidence of pre-solder crack or ELK delamination. The compliant bump structure can reduce pre-solder stress in some instances by more than 30%. Additionally, a compliant bump with a cross-sectional width equal to 5 μm can reduce ELK stress by 25% and reduce stress in the UBM layer and contact pad by 3% or more. In one embodiment, compliant pillar 194 has a cross-sectional width equal to 5 μm. As the cross-sectional width of the compliant bump exceeds 7 μm, the stress reduction may decrease. In one embodiment, compliant pillar 194 has a cross-sectional width less than 7 μm.

Figure 7A:
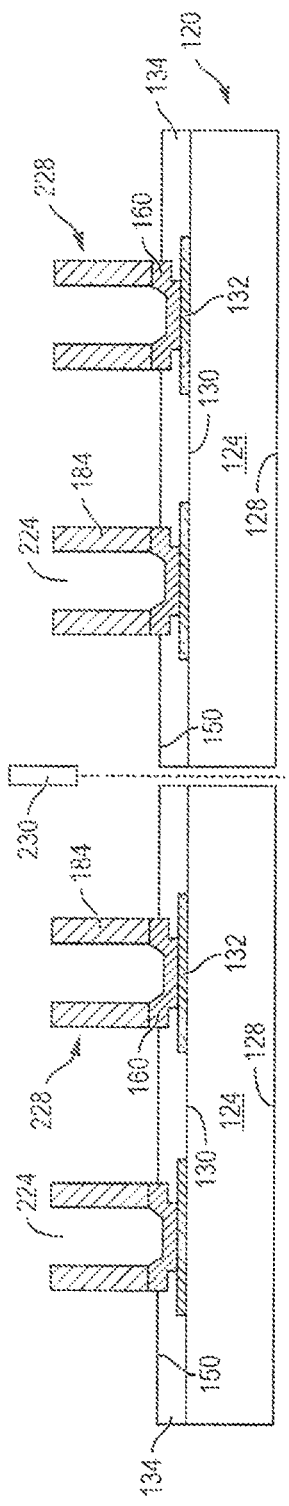
FIGS. 7a-7b illustrate a process of forming a compliant conductive interconnect structure with a hollow core over a semiconductor wafer.
Figure 7B:
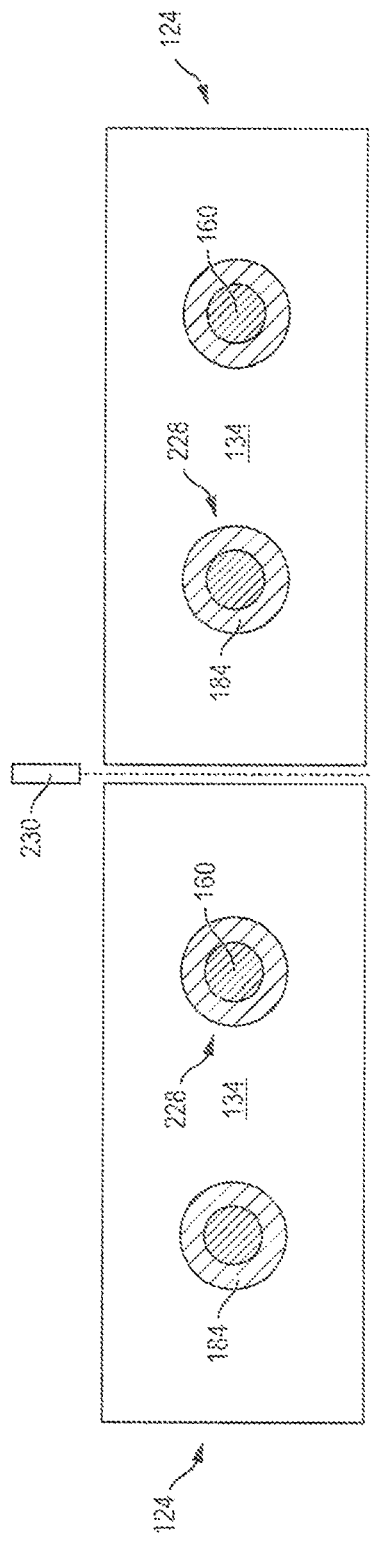

FIGS. 7a-7b illustrate, in relation to FIGS. 3 and 4a-4c, a process of forming a compliant conductive interconnect structure with a hollow core over a semiconductor wafer. Continuing from FIG. 5j, photoresist layer 166 is removed by an etching process to expose insulating layer 134 and conductive layer 160, as shown in FIG. 7a. Conductive shell 184 has a hollow compliant core 224, which exposes the central portion of conductive layer 160 not covered by conductive shell 184. Collectively, conductive shell 184, hollow compliant core 224, and conductive layer 160 constitute a z-direction vertical compliant conductive interconnect structure or compliant pillar 228. Conductive shell 184 of compliant pillar 228 provides for structural support and electrical conductivity of compliant pillar 228. Hollow compliant core 224 allows the structure of compliant pillar 228 to conform or slightly change shape under stress, which reduces the incidence of pre-solder crack or ELK delamination. Leaving hollow compliant core 224 of conductive shell 184 hollow rather than filling hollow compliant core 224 with a compliant material reduces the number of manufacturing steps.

The assembly is singulated through insulating layer 134 and saw street 126 using a saw blade or laser cutting tool 230 into individual semiconductor die 124. FIG. 7b shows a top or plan view of singulated die 124. A central portion of conductive layer 160 not covered by conductive shell 184 is exposed through hollow compliant core 224.

Figure 8A:
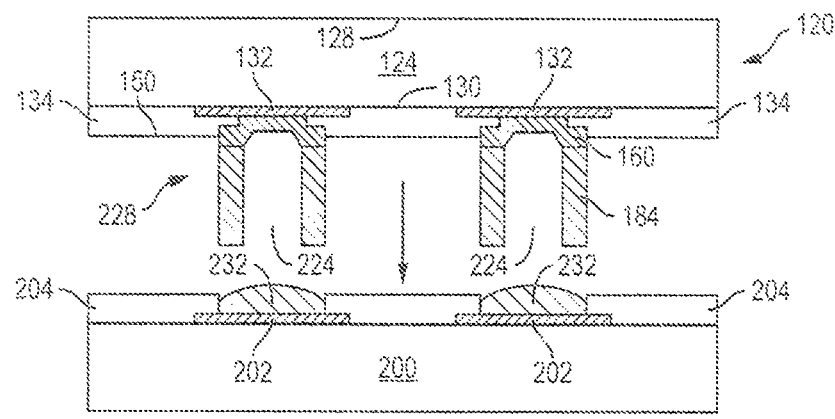
FIGS. 8a-8b illustrate a process of mounting a semiconductor die having a hollow compliant conductive interconnect structure over a substrate.
Figure 8B:
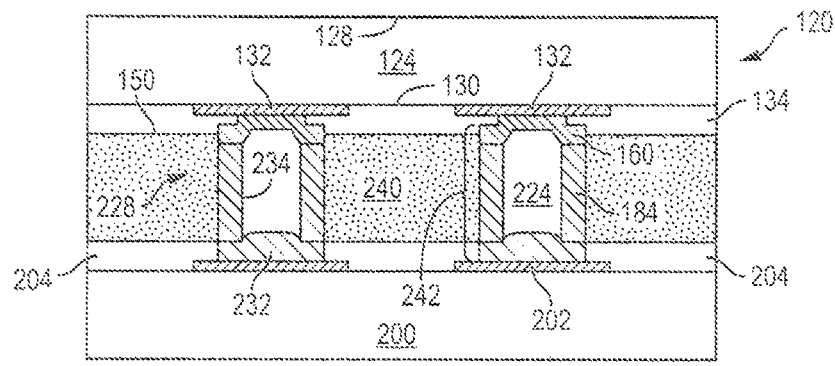

FIGS. 8a-8b illustrate, in relation to FIGS. 3 and 4a-4c, a process of mounting a semiconductor die having a hollow compliant conductive interconnect structure over a substrate. Continuing from FIG. 6b, an electrically conductive pre-solder or bump material is deposited over the exposed conductive layer 202 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. In one embodiment, the bump material is reflowed by heating the material above its melting point to form pre-solder bumps 232. In some applications bumps 232 are reflowed a second time to improve electrical contact to conductive layer 202. Bumps 232 can also be compression bonded to conductive layer 202. Bumps 232 represent one type of interconnect structure that can be formed over conductive layer 202. The interconnect structure can also use stud bump, micro bump, or other electrical interconnect. Semiconductor die 124 from FIG. 7b is positioned over and mounted to substrate 200 using a pick and place operation with active surface 130 oriented toward substrate 200. Compliant pillar 228 is aligned with conductive layer 202.

FIG. 8b shows semiconductor die 124 mounted over substrate 200. Because compliant pillar 228 has a hollow compliant core 224, a portion of the material of bump 232 extends partially into hollow compliant core 224 and contacts internal or interior sidewall 234 of conductive shell 184, but hollow compliant core 224 of compliant pillar 228 remains substantially hollow. An UF material or molding compound 240 is deposited evenly between semiconductor die 124 and substrate 200, and between and around compliant pillar 228, using an UF process. UF material 240 can be an encapsulant, molding compound, polymer composite material, such as epoxy resin with filler, epoxy acrylate with filler, or polymer with proper filler. UF material 240 is non-conductive and environmentally protects semiconductor die 124 from external elements and contaminants.

Collectively, compliant pillar 228 and bumps 232 constitute a compliant composite conductive interconnect structure or compliant composite bump 242. Compliant composite bump 242 has a fusible portion, bump 232, and a non-fusible or non-collapsible portion, compliant pillar 228. Conductive shell 184 of compliant pillar 228 is electrically connected to bump 232 and conductive layer 202. Thus, semiconductor die 124 is electrically connected to conductive layer 202 of substrate 200 through compliant composite bump 242.

Conductive shell 184 of compliant pillar 228 provides standoff distance between semiconductor die 124 and substrate 200. Thus, conductive shell 184 allows for fine pitch between adjacent bumps by requiring less bump material to achieve a desired standoff distance. Because hollow compliant core 224 of compliant pillar 228 is hollow, compliant pillar 228 is less rigid than a solid conductive pillar and can conform or slightly change shape under stress, which reduces the incidence of pre-solder crack or ELK delamination. The compliant structure can reduce pre-solder stress in some instances by more than 30%. Additionally, a compliant bump with a cross-sectional width equal to 5 µm can reduce ELK stress by 25% and reduce stress in the UBM layer and contact pad by 3%. In one embodiment, compliant pillar 228 has a cross-sectional width equal to 5 µm. As the cross-sectional width of the compliant bump exceeds 7 µm, the stress reduction may decrease. In one embodiment, compliant pillar 228 has a cross-sectional width less than 7 µm.

FIGS. 9a-9d illustrate, in relation to FIGS. 3 and 4a-4c, a process of forming a covered compliant conductive interconnect structure over a semiconductor wafer. Continuing from FIG. 5m, patterning or photoresist layer 244 is formed over insulating layer 134, covering external sidewall 192 of conductive shell 184, using printing, spin coating, or spray coating. In some embodiments that utilize an insulating layer for patterning, the insulating layer can include one or more layers of SiO2, Si3N4, SiON, Ta2O5, Al2O3, or other material having similar structural properties. A portion of conductive shell 184 and compliant core 190 is removed using an etching process to form cavity or recessed opening 246, such that an exposed surface 248 of compliant pillar 194 is recessed or vertically offset with respect to exposed surface 250 of photoresist layer 244. Alternatively, a portion of conductive shell 184 and compliant core 190 is removed by LDA using laser 252 to form cavity 246, such that surface 248 of compliant pillar 194 is recessed or vertically offset with respect to surface 250 of photoresist layer 244. Thus, surface 248 of compliant pillar 194 is not coplanar with surface 250 of photoresist layer 244. In another embodiment, photoresist layer 244 is formed over insulating layer 134 and compliant pillar 194, and the portion of photoresist layer 244 over the footprint of compliant pillar 194 is removed using an etching process to form cavity 246. Alternatively, the portion of photoresist layer 244 over the footprint of compliant pillar 194 is removed by LDA using laser 254 to form cavity 246.

In FIG. 9b, an electrically conductive layer 258 is deposited in cavity 246 using a patterning and metal deposition process such as printing, PVD, CVD, sputtering, electrolytic plating, and electroless plating. Conductive layer 258 can be one or more layers of Al, Cu, Sn, Ti, Ni, Au, Ag, or other suitable electrically conductive material. Conductive layer 258 covers surface 248 of compliant pillar 194, including compliant core 190 and conductive shell 184. Conductive layer 258 is electrically connected to conductive shell 184.

Collectively, conductive layer 160, conductive shell 184, compliant core 190, and conductive layer 258 constitute a covered compliant conductive interconnect structure or compliant pillar 260. Compliant core 190 of conductive shell 184 is filled with a compliant material, or remains hollow, and is softer or more compliant than the material of conductive shell 184. When compliant core 190 is filled with a compliant material, compliant core 190 provides additional structural support to compliant pillar 260. Because compliant core 190 is softer or more compliant than the material of conductive shell 184, compliant pillar 260 is less rigid than a solid conductive pillar and can conform or slightly change shape under stress, which reduces the incidence of pre-solder crack or ELK delamination. Conductive layer 258 provides additional structural support for compliant pillar 260, and provides a greater surface area for subsequent mechanical and electrical contact with a substrate. Additionally, conductive layer 258 seals compliant core 190 from external environmental contaminants.

FIG. 9c shows a top or plan view of the assembly from FIG. 9b, the footprint of compliant pillar 260 is formed in a generally circular shape. The shape and footprint of compliant pillar 260 can vary according to the design and function of semiconductor die 124. In another embodiment, the footprint of compliant pillar 260 is generally oval, rectangular, or square.

In FIG. 9d, photoresist layer 244 is removed by an etching process to expose surface 150 of insulating layer 134 and sidewall 192 of conductive shell 184. The assembly is singulated through insulating layer 134 and saw street 126 using a saw blade or laser cutting tool 262 into individual semiconductor die 124.

Figure 10A:
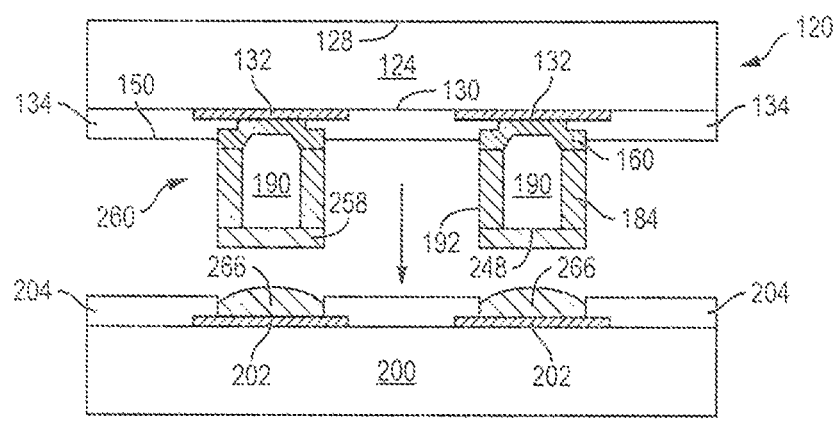
FIGS. 10a-10b illustrate a process of mounting a semiconductor die having a covered compliant conductive interconnect structure over a substrate.
Figure 10B:
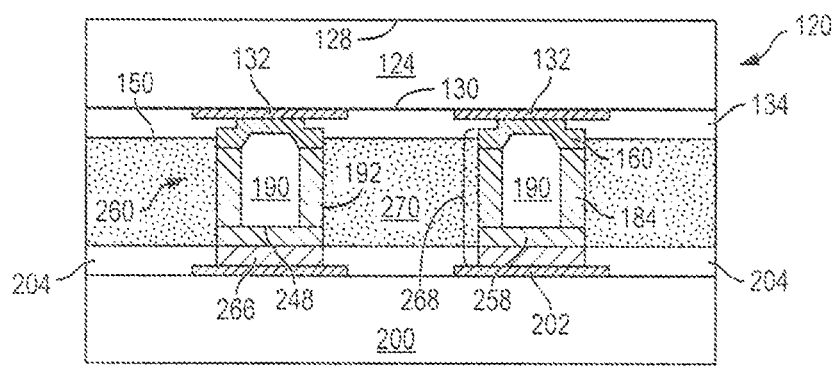

FIGS. 10a-10b illustrate, in relation to FIGS. 3 and 4a-4c, a process of mounting a semiconductor die having a covered compliant conductive interconnect structure over a substrate. Continuing from FIG. 6b, an electrically conductive pre-solder or bump material is deposited over the exposed conductive layer 202 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. In one embodiment, the bump material is reflowed by heating the material above its melting point to form pre-solder bumps 266. In some applications, bumps 266 are reflowed a second time to improve electrical contact to conductive layer 202. Bumps 266 can also be compression bonded to conductive layer 202. Bumps 266 represent one type of interconnect structure that can be formed over conductive layer 202. The interconnect structure can also use stud bump, micro bump, or other electrical interconnect. In another embodiment, bumps 266 are formed over conductive layer 258 of compliant pillar 260. Semiconductor die 124 from FIG. 9d is positioned over and mounted to substrate 200 using a pick and place operation with active surface 130 oriented toward substrate 200. Compliant pillar 260 is aligned with conductive layer 202.

FIG. 10b shows semiconductor die 124 mounted over substrate 200. Collectively, compliant pillar 260 and bump 266 constitute a compliant composite conductive interconnect structure or compliant composite bump 268. Compliant composite bump 268 has a fusible portion, bump 266, and a non-fusible or non-collapsible portion, compliant pillar 260. Conductive layer 258 of compliant pillar 260 is electrically connected to bump 266 and conductive layer 202. Thus, semiconductor die 124 is electrically connected to conductive layer 202 of substrate 200 through compliant composite bump 268. Conductive layer 258 of compliant pillar 260 seals compliant core 190 and prevents material from bump 266, subsequently applied UF material, or environmental contaminants from entering compliant core 190.

Compliant pillar 260 provides standoff distance between semiconductor die 124 and substrate 200. Thus, compliant pillar 260 allows for fine pitch between adjacent bumps by requiring less bump material to achieve a desired standoff distance. Compliant core 190 of compliant pillar 260 is hollow or has a compliant material that is softer or more compliant than the material of conductive shell 184. Because compliant core 190 is more compliant than conductive shell 184, compliant pillar 260 is less rigid than a solid conductive pillar and can conform or slightly change shape under stress, which reduces the incidence of pre-solder crack or ELK delamination. The compliant pillar structure can reduce pre-solder stress in some instances by more than 30%. Additionally, a compliant bump with a cross-sectional width equal to 5 μm can reduce ELK stress by 25% and reduce stress in the UBM layer and contact pad by 3%. In one embodiment, compliant pillar 260 has a cross-sectional width equal to 5 μm. As the cross-sectional width of the compliant bump exceeds 7 μm, the stress reduction may decrease. In one embodiment, compliant pillar 260 has a cross-sectional width less than 7 μm.

An UF material or molding compound 270 is deposited evenly between semiconductor die 124 and substrate 200, and between and around compliant pillar 260, using an UF process. UF material 270 can be an encapsulant, molding compound, polymer composite material, such as epoxy resin with filler, epoxy acrylate with filler, or polymer with proper filler. UF material 270 is non-conductive and environmentally protects semiconductor die 124 from external elements and contaminants.

Figure 11G:
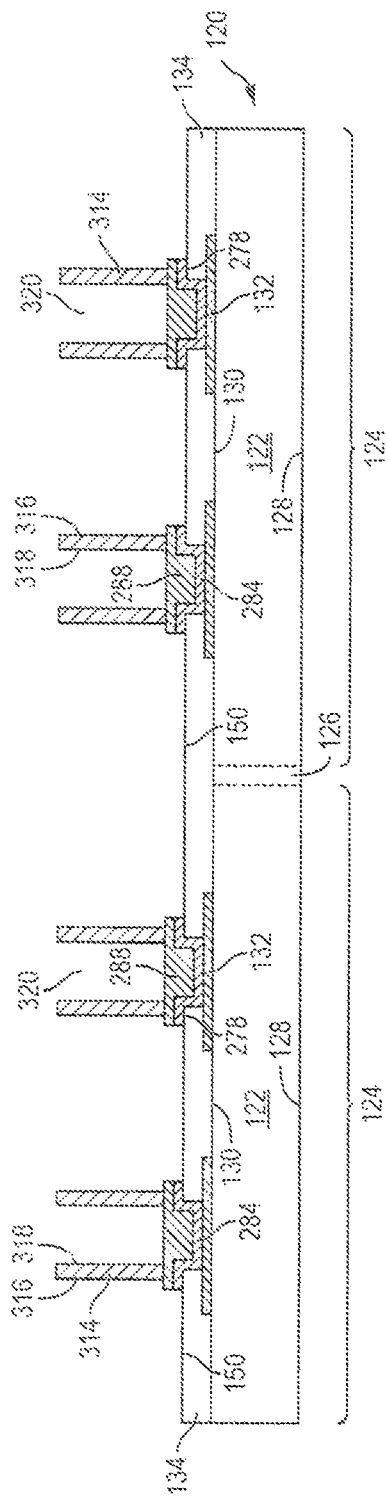

FIGS. 11a-11l illustrate, in relation to FIGS. 3 and 4a-4c, a process of forming a narrow compliant conductive interconnect structure with conductive bump material over a semiconductor wafer. Continuing from FIG. 5b, a patterning or photoresist layer 276 is formed over insulating layer 134 using printing, spin coating, or spray coating, as shown in FIG. 11a. In some embodiments that utilize an insulating layer for patterning, the insulating layer can include one or more layers of SiO2, Si3N4, SiON, Ta2O5, Al2O3, or other material having similar structural properties. A portion of photoresist layer 276 over opening 136 is removed by an etching process to expose conductive layer 132 and a surface 278 of insulating layer 134 over a footprint of conductive layer 132 to form opening 280. Alternatively, a portion of photoresist layer 276 is removed by LDA using laser 282 to form opening 280 and to expose conductive layer 132 and a surface 278 of insulating layer 134.

Opening 280 has a larger footprint or cross-sectional width than the footprint of opening 136 and a smaller footprint or cross-sectional width than the cross-sectional width of conductive layer 132. In another embodiment, opening 280 has a footprint that is equal to or larger than the cross-sectional width of conductive layer 132. In one embodiment, opening 280 has a generally circular cross-sectional area configured to form a conductive shell with a cylindrical shape including a circular cross-section. In another embodiment, opening 280 has a generally rectangular cross-sectional area configured to form a conductive shell with a cubic shape including a rectangular cross-section.

An electrically conductive layer 284 is conformally applied over insulating layer 134 and conductive layer 132 within opening 280, using a patterning and metal deposition process such as printing, PVD, CVD, sputtering, electrolytic plating, and electroless plating. Conductive layer 284 can be one or more layers of Al, Cu, Sn, Ti, Ni, Au, Ag, or other suitable electrically conductive material. In one embodiment, conductive layer 284 is a multi-layer stack including a seed layer, barrier layer, and adhesion layer. The seed layer can be TiCu, TiWCu, or TaNCu. The barrier layer can be Ni, NiV, Pt, Pd, TiW, or CrCu, or other suitable material. The adhesion layer can be Ti, TiN, TiW, Al, or Cr, or other suitable material. Conductive layer 284 is electrically connected to conductive layer 132 of semiconductor die 124 and follows the contour of insulating layer 134 and conductive layer 132.

In FIG. 11b, an electrically conductive layer 288 is deposited over conductive layer 284 within opening 280, using a patterning and metal deposition process such as printing, PVD, CVD, sputtering, electrolytic plating, and electroless plating. Conductive layer 288 can be one or more layers of Al, Cu, Sn, Ti, Ni, Au, Ag, or other suitable electrically conductive material. Conductive layer 288 has a surface 290, which contacts and conforms to the contour of conductive layer 284. Thus, conductive layer is electrically connected to conductive layer 132 of semiconductor die 124. Conductive layer 288 has an exposed surface 292, opposite conductive layer 284, which is substantially flat or planar.

In FIG. 11c, photoresist layer 276 is removed by an etching process to expose insulating layer 134. A patterning or photoresist layer 300 is formed over insulating layer 134 and conductive layers 284 and 288 using printing, spin coating, or spray coating. In some embodiments that utilize an insulating layer for patterning, the insulating layer can include one or more layers of SiO2, Si3N4, SiON, Ta2O5, Al2O3, or other material having similar structural properties.

In FIG. 11d, a masking layer 302 is disposed over photoresist layer 300. Masking layer 302 has a solid or opaque portion 302a and a transparent portion 302b. Opaque portion 302a is formed in a generally circular shape over conductive layer 288, such that opaque portion 302a forms a ring over a footprint of conductive layer 288. The shape of opaque portion 302a can vary according to the design and function of semiconductor die 124 and can be formed, for example, in a generally oval, rectangular, or square shape. Transparent portion 302b is formed outside a footprint or in a peripheral area of opaque portion 302a. Transparent portion 302b is also formed centrally to the ring of opaque portion 302a. Masking layer 302 is exposed to UV light, which passes through transparent portion 302b. The portion of photoresist layer 300 outside the footprint of opaque portion 302a is irradiated with UV light to cure photoresist layer 300 within a footprint of transparent portion 302b.

In FIG. 11e, masking layer 302 is removed and the non-irradiated portion of photoresist layer 300 is removed by an etching process to form channel or opening 306 and to expose a portion of conductive layer 288. Alternatively, a portion of photoresist layer 300 is removed by LDA using laser 310 to form opening 306 and to expose a portion of conductive layer 288. A portion of photoresist layer 300 maintains coverage over conductive layers 284 and 288, and insulating layer 134 outside a footprint of opening 306. Opening 306 has a cross-sectional width W2, measured across opening 306, which can vary according to the design and function of semiconductor die 124 by adjusting the shape, size, and position of opaque portion 302a of masking layer 302. Thus, in FIG. 11e, width W2 of opening 306 is shown smaller or narrower than the cross-sectional width of conductive layer 288. The distance D2 between sidewalls of opening 306 can also be adjusted according to the design and function of semiconductor die 124 by adjusting the shape, size, and position of opaque portion 302a of masking layer 302. By adjusting distance D2 and width W2, the size and thickness of subsequently deposited conductive material within opening 306 can be adjusted to increase or reduce the compliance of the final compliant bump structure.

In FIG. 11f, an electrically conductive layer 314 is formed over conductive layer 288 within opening 306 using a patterning and metal deposition process such as printing, PVD, CVD, sputtering, electrolytic plating, and electroless plating. Conductive layer 314 can be one or more layers of Al, Cu, Sn, Ti, Ni, Au, Ag, or other suitable electrically conductive material. Conductive layer 314 constitutes a conductive hollow pillar or conductive shell. Conductive shell 314 is electrically connected to conductive layer 288. The shape of conductive shell 314 can vary according to the design and function of semiconductor die 124 and can be, for example, generally cylindrical or cubic.

In FIG. 11g, photoresist layer 300 is removed by an etching process to expose insulating layer 134, external sidewall 316 of conductive shell 314, internal sidewall 318 of conductive shell 314, and conductive layers 284 and 288. After photoresist layer 300 is removed, conductive shell 314 has a hollow core 320.

Figure 11H:
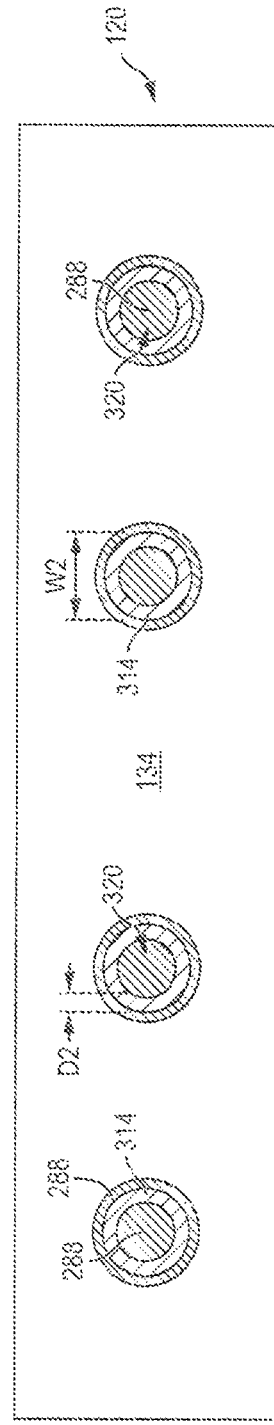

FIG. 11h shows a top or plan view of the assembly from FIG. 11g. Conductive shell 314 is formed in a generally circular or ring shape within a footprint of conductive layer 288. A portion of conductive layer 288 outside a footprint of conductive shell 314 is exposed, and a portion of conductive layer 288 within a footprint of conductive shell 314 is exposed through hollow core 320. Thus, the cross-sectional width W2 of conductive shell 314 is smaller or narrower than the width of conductive layer 288.

Figure 11I:
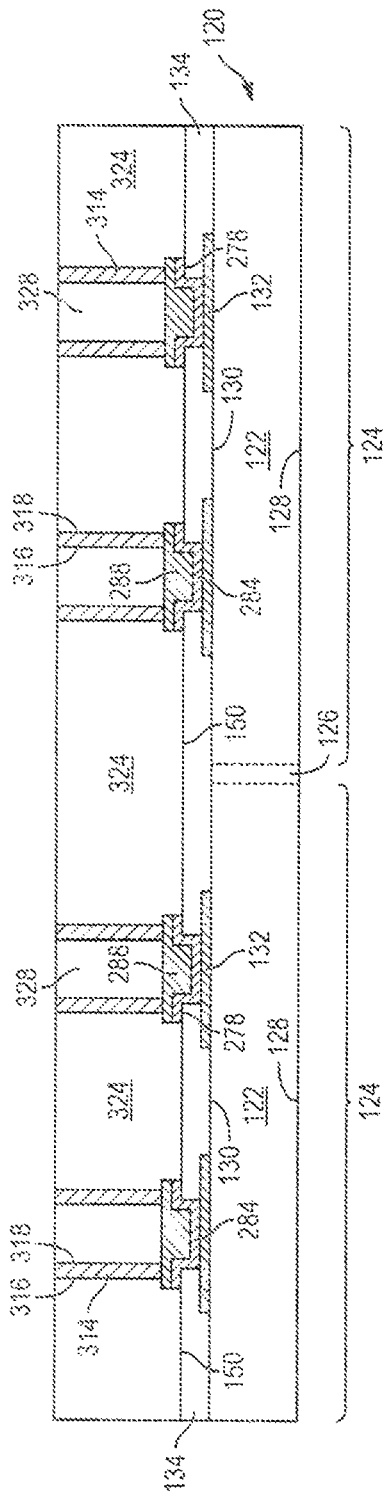

In FIG. 11i, a patterning or photoresist layer 324 is formed over insulating layer 134 outside a footprint, or in a peripheral region of conductive shell 314 using printing, spin coating, or spray coating. In some embodiments that utilize an insulating layer for patterning, the insulating layer can include one or more layers of SiO2, Si3N4, SiON, Ta2O5, Al2O3, or other material having similar structural properties. Hollow core 320 of conductive shell 314 can be filled with a compliant material, as shown in FIG. 11i, to form a compliant core 328 of conductive shell 314. Compliant core 328 can include an encapsulant, molding compound, polymer composite material, such as epoxy resin with filler, epoxy acrylate with filler, or polymer with proper filler. Compliant core 328 can also be one or more layers of SiO2, Si3N4, SiON, Ta2O5, Al2O3, PI, BCB, PBO, or other suitable insulating or dielectric material. Alternatively, compliant core 328 can remain hollow. Compliant core 328 has a lower Young's modulus than the material of conductive shell 314. In one embodiment, compliant core 328 has a Young's modulus less than 10 GPa. Thus, compliant core 328 is softer or more compliant than the material of conductive shell 314.

Figure 11J:
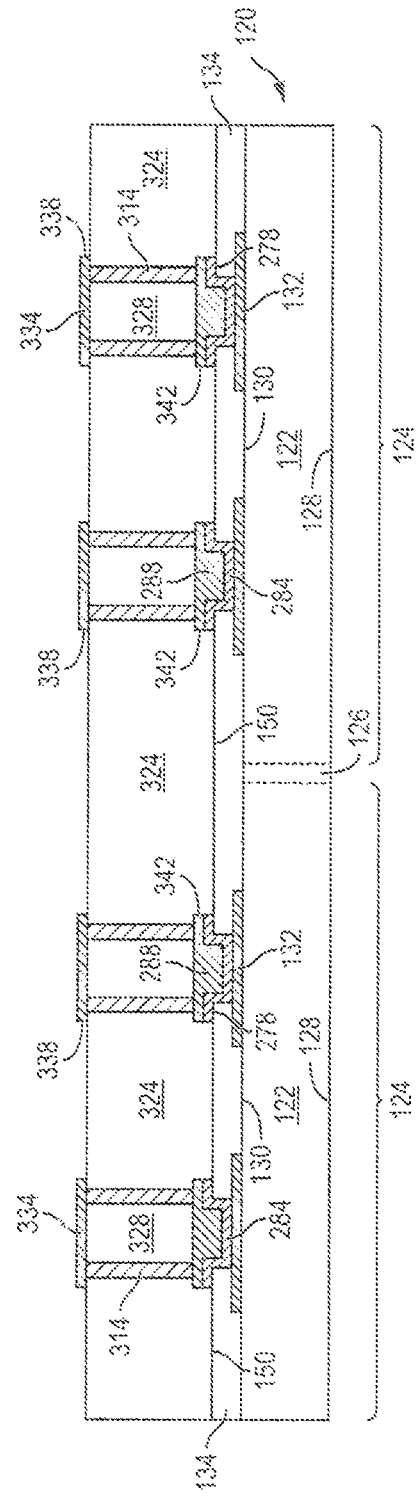

In FIG. 11j, an electrically conductive layer 334 is deposited over conductive shell 314, compliant core 328, and photoresist layer 324 using a patterning and metal deposition process such as printing, PVD, CVD, sputtering, electrolytic plating, and electroless plating. Conductive layer 334 can be one or more layers of Al, Cu, Sn, Ti, Ni, Au, Ag, or other suitable electrically conductive material. Conductive layer 334 extends outside the footprint of conductive shell 314. The peripheral edge 338 of conductive layer 334 is coplanar or vertically aligned with the peripheral edge 342 of conductive layer 288. In another embodiment, peripheral edge 338 of conductive layer 334 is laterally offset from the peripheral edge 342, such that the footprint of conductive layer 334 lies within the footprint of conductive layer 288. In another embodiment, the footprint of conductive layer 334 extends outside the footprint of conductive layer 288. The shape and configuration of conductive layer 334 can vary according to the design and function of semiconductor die 124. In one embodiment, conductive layer 334 has a generally circular footprint. In another embodiment, conductive layer 334 has a generally rectangular footprint. Conductive layer 334 provides additional structural support for conductive shell 314 and provides a greater surface area for subsequent mechanical and electrical contact with bump material and a substrate. Additionally, conductive layer 334 seals compliant core 328 from external environmental contaminants.

In FIG. 11k, photoresist layer 324 is removed using an etching process to expose insulating layer 134, conductive shell 314, conductive layer 288, and conductive layer 284. An electrically conductive bump material is deposited over conductive shell 314, conductive layer 334, and conductive layer 288 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material can be reflowed to form a rounded or spherical bump 344 around conductive shell 314, conductive layer 334, and conductive layer 288.

Collectively, conductive layers 284, 288, and 334, and conductive shell 314 constitute a z-direction vertical narrow compliant conductive interconnect structure or compliant pillar 350. Bump 344 is formed externally around compliant pillar 350. Hollow core 320 of conductive shell 314 is filled with a compliant material, or remains hollow, to form compliant core 328, which is softer or more compliant than the material of conductive shell 314. Because compliant core 328 is softer or more compliant than the material of conductive shell 314, compliant pillar 350 is less rigid than a solid conductive pillar and can conform or slightly change shape under stress, which reduces the incidence of pre-solder crack or ELK delamination.

Width W2, measured across conductive shell 314, and distance D2, measured between exterior sidewall 316 and interior sidewall 318 of conductive shell 314, can be adjusted according to the design and function of semiconductor die 124 by adjusting the size and location of opaque portion 302a shown in FIG. 11d. Adjusting width W2 and distance D2 provides for the ability to control or adjust the compliance of conductive shell 314 by reducing or increasing the thickness or footprint of conductive shell 314. Additionally, narrowing or decreasing width W2 and distance D2 of conductive shell 314 allows subsequently deposited conductive bump material to surround the compliant bump, while maintaining a relatively small pitch between adjacent compliant bumps.

In FIG. 11l, the assembly from FIG. 11k is singulated through insulating layer 134 and saw street 126 using a saw blade or laser cutting tool 356 into individual semiconductor die 124.

Figure 12A:
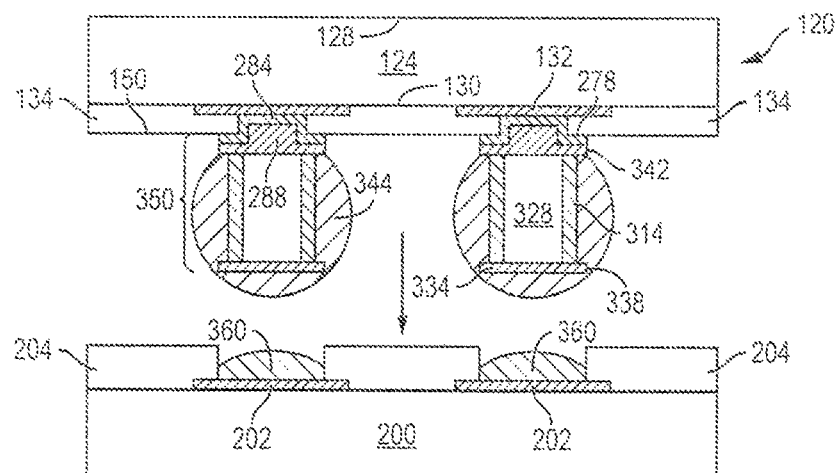
FIGS. 12a-12b illustrate a process of mounting a semiconductor die having a narrow compliant conductive interconnect structure over a substrate.
Figure 12B:
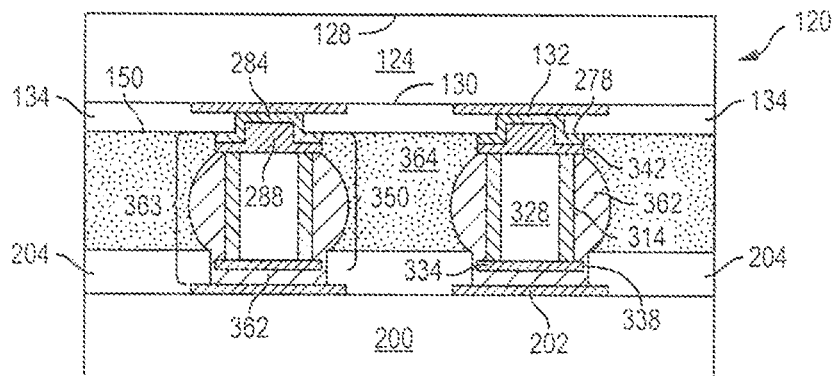

FIGS. 12a-12b illustrate, in relation to FIGS. 3 and 4a-4c, a process of mounting a semiconductor die having a narrow compliant conductive interconnect structure over a substrate. Continuing from FIG. 6b an electrically conductive pre-solder or bump material is deposited over the exposed conductive layer 202 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. In one embodiment, the bump material is reflowed by heating the material above its melting point to form pre-solder bumps 360. In some applications, bumps 360 are reflowed a second time to improve electrical contact to conductive layer 202. Bumps 360 can also be compression bonded to conductive layer 202. Bumps 360 represent one type of interconnect structure that can be formed over conductive layer 202. The interconnect structure can also use stud bump, micro bump, or other electrical interconnect. Semiconductor die 124 from FIG. 11l is positioned over and mounted to substrate 200 using a pick and place operation with active surface 130 oriented toward substrate 200. Compliant pillar 350 is aligned with conductive layer 202.

FIG. 12b shows semiconductor die 124 mounted over substrate 200. Bumps 344 and 360 are reflowed and merge to form bump 362. Bump 362 is formed externally to compliant pillar 350 and is mechanically and electrically connected to compliant pillar 350 and conductive layer 202. Collectively, compliant pillar 350 and bump 362 constitute a compliant composite conductive interconnect structure or compliant composite bump 363. Compliant composite bump 363 has a fusible portion, bump 362, and a non-fusible or non-collapsible portion, compliant pillar 350. Conductive shell 314 of compliant pillar 350 provides standoff distance between semiconductor die 124 and substrate 200. Thus, semiconductor die 124 is electrically connected to conductive layer 202 of substrate 200 through compliant composite bump 363. Because compliant core 328 of compliant pillar 350 is softer or more compliant than the material of conductive shell 314, compliant pillar 350 can conform or slightly change shape under stress, which reduces the incidence of pre-solder crack or ELK delamination. The compliant pillar structure can reduce pre-solder stress in some instances by more than 30%. Additionally, a compliant pillar with a cross-sectional width equal to 5 μm can reduce ELK stress by 25% and reduce stress in the UBM layer and contact pad by 3%. In one embodiment, compliant pillar 350 has a cross-sectional width equal to 5 μm. As the cross-sectional width of the compliant pillar exceeds 7 μm, the stress reduction may decrease. In one embodiment, compliant pillar 350 has a cross-sectional width less than 7 μm.

An UF material or molding compound 364 is deposited evenly between semiconductor die 124 and substrate 200, and between and around compliant pillars 350, using an UF process. UF material 364 can be an encapsulant, molding compound, polymer composite material, such as epoxy resin with filler, epoxy acrylate with filler, or polymer with proper filler. UF material 364 is non-conductive and environmentally protects semiconductor die 124 from external elements and contaminants.

Figure 13:
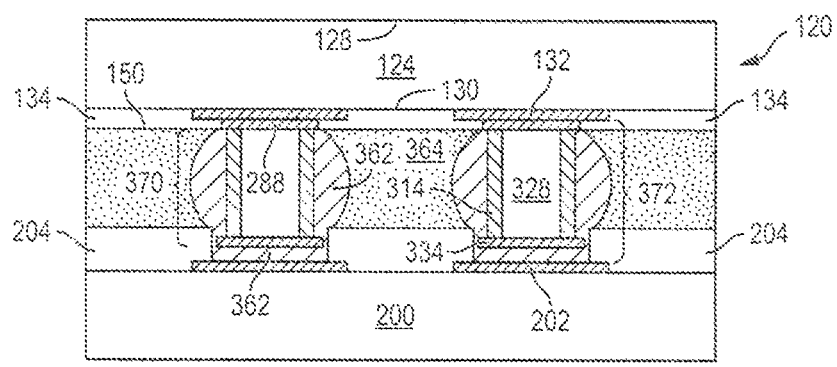
FIG. 13 illustrates a semiconductor die with a compliant conductive interconnect structure without a UBM layer mounted over a substrate.

FIG. 13 illustrates an alternate embodiment, similar to the assembly shown in FIG. 12b, absent the formation of conductive layer 284 as a UBM layer, reducing the number of manufacturing steps. Instead, conductive layer 288 is formed directly over conductive layer 132 of semiconductor die 124. Collectively, conductive layer 288, conductive shell 314, compliant core 328, and conductive layer 334 constitute a z-direction vertical narrow compliant conductive interconnect structure or compliant pillar 370. Bumps 344 and 360 are reflowed and merge to form bump 362. Bump 362 is formed externally to compliant pillar 370 and is mechanically and electrically connected to compliant pillar 370 and conductive layer 202.

Collectively, compliant pillar 370 and bump 362 constitute a compliant composite conductive interconnect structure or compliant composite bump 372. Compliant composite bump 372 has a fusible portion, bump 362, and a non-fusible portion, compliant pillar 370. Thus, semiconductor die 124 is electrically connected to conductive layer 202 of substrate 200 through compliant composite bump 372. Conductive shell 314 of compliant pillar 370 provides standoff distance between semiconductor die 124 and substrate 200. Compliant pillar 370 has a compliant core 328. Compliant core 328 is a compliant material or is hollow, and is softer or more compliant than the material of conductive shell 314. Because compliant core 328 is softer or more compliant than the material of conductive shell 314, compliant pillar 370 is less rigid than a solid conductive pillar and can conform or slightly change shape under stress, which reduces the incidence of pre-solder crack or ELK delamination. The compliant pillar structure can reduce pre-solder stress in some instances by more than 30%. Additionally, a compliant pillar with a cross-sectional width equal to 5 μm can reduce ELK stress by 25% and reduce stress in the UBM layer and contact pad by 3%. In one embodiment, compliant pillar 370 has a cross-sectional width equal to 5 μm. As the cross-sectional width of the compliant pillar exceeds 7 μm, the stress reduction may decrease. In one embodiment, compliant pillar 370 has a cross-sectional width less than 7 μm.

Figure 14:
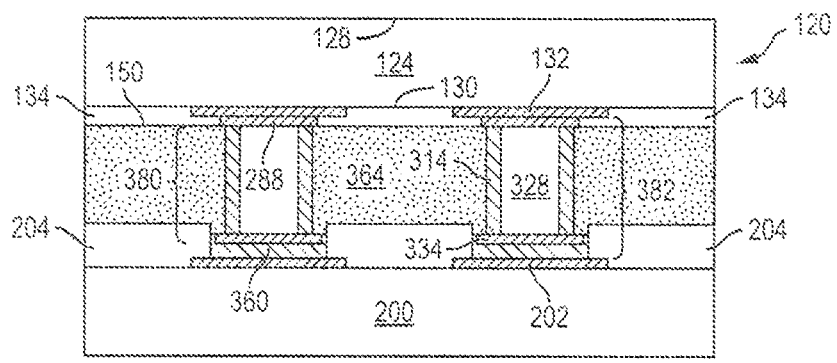
FIG. 14 illustrates a compliant conductive interconnect structure formed over a semiconductor die without conductive bump material and mounted over a substrate.

FIG. 14 illustrates an alternate embodiment, similar to the assembly shown in FIG. 13, absent the formation of a conductive bump material around the compliant pillar structure. Collectively, conductive layer 288, conductive shell 314, compliant core 328, and conductive layer 334 constitute a z-direction vertical narrow compliant conductive interconnect structure or compliant pillar 380. Bump material constituting bumps 360 is deposited over conductive layer 202 of substrate 200, without forming bumps 344 around compliant pillar 380. Alternatively, bumps 360 can be formed over conductive layer 334 of compliant pillar 380. By not forming bump material 344, the pitch or distance between adjacent compliant pillar 380 can be reduced. Bumps 360 are reflowed to electrically and mechanically connect conductive layer 202 to compliant pillar 380.

Collectively, compliant pillar 380 and bump 360 constitute a compliant composite conductive interconnect structure or compliant composite bump 382. Thus, semiconductor die 124 is electrically connected to conductive layer 202 of substrate 200 through compliant composite bump 382. Compliant composite bump 382 has a fusible portion, bump 360, and a non-fusible or non-collapsible portion, compliant pillar 380. The stiffer or less compliant material of conductive shell 314 of compliant pillar 380 provides standoff distance between semiconductor die 124 and substrate 200. Thus, compliant pillar 380 allows for fine pitch between adjacent bumps by requiring less bump material to achieve a desired standoff distance. Compliant pillar 380 has a compliant core 328. Compliant core 328 is a compliant material or is hollow, and is softer or more compliant than the material of conductive shell 314. Because compliant core 328 is softer or more compliant than the material of conductive shell 314, compliant pillar 380 is less rigid than a solid conductive pillar and can conform or slightly change shape under stress, which reduces the incidence of pre-solder crack or ELK delamination. The compliant pillar structure can reduce pre-solder stress in some instances by more than 30%. Additionally, a compliant pillar with a cross-sectional width equal to 5 μm can reduce ELK stress by 25% and reduce stress in the UBM layer and contact pad by 3%. In one embodiment, compliant pillar 380 has a cross-sectional width equal to 5 μm. As the cross-sectional width of the compliant pillar exceeds 7 μm, the stress reduction may decrease. In one embodiment, compliant pillar 380 has a cross-sectional width less than 7 μm.

FIGS. 15a-15f illustrate, in relation to FIGS. 3 and 4a-4c, a process of forming a compliant conductive interconnect structure with a conductive lip over a semiconductor wafer.

Continuing from FIG. 11c, a masking layer 390 is disposed over photoresist layer 300, as shown in FIG. 15a. Masking layer 390 has a solid or opaque portion 390a and a transparent portion 390b. Opaque portion 390a is formed in a generally circular shape over conductive layer 288, such that opaque portion 390a forms a ring over the perimeter of a footprint of conductive layer 288. The shape of opaque portion 390a can vary according to the design and function of semiconductor die 124 and can be formed, for example, in a generally oval, rectangular, or square shape. Transparent portion 390b is formed adjacent to opaque portion 390a, outside a footprint of opaque portion 390a. Transparent portion 390b is also formed centrally to the ring of opaque portion 390a. Masking layer 390 is exposed to UV light, which passes through transparent portion 390b. The portion of photoresist layer 300 outside the footprint of opaque portion 390a is irradiated with UV light to cure photoresist layer 300 within a footprint of transparent portion 390b.

In FIG. 15b, masking layer 390 is removed and the non-irradiated portion of photoresist layer 300 is removed by an etching process to form channel or opening 392 and to expose a portion of conductive layer 288. Alternatively, a portion of photoresist layer 300 is removed by LDA using laser 394 to form channel or opening 392 and to expose a portion of conductive layer 288. A portion of photoresist layer 300 maintains coverage over portions of conductive layers 284 and 288, and insulating layer 134 outside a footprint of opening 392. The cross-sectional width and the distance between sidewalls of opening 392 can be adjusted according to the design and function of semiconductor die 124.

In FIG. 15c, an electrically conductive layer 396 is formed over conductive layer 288 within opening 392 using a patterning and metal deposition process such as printing, PVD, CVD, sputtering, electrolytic plating, and electroless plating. Conductive layer 396 can be one or more layers of Al, Cu, Sn, Ti, Ni, Au, Ag, or other suitable electrically conductive material. Conductive layer 396 constitutes a conductive hollow pillar or conductive shell. Conductive shell 396 is electrically connected to conductive layer 288. The shape of conductive shell 396 can vary according to the design and function of semiconductor die 124 and can be, for example, generally cylindrical or cubic.

In FIG. 15d, photoresist layer 300 is removed by an etching process to expose insulating layer 134, conductive layer 284, and conductive layer 288, including the portion of conductive layer 288 central to the footprint of conductive shell 396. A patterning or photoresist layer 400 is formed over insulating layer 134 outside a footprint of conductive shell 396 using printing, spin coating, or spray coating. In some embodiments that utilize an insulating layer for patterning, the insulating layer can include one or more layers of SiO2, Si3N4, SiON, Ta2O5, Al2O3, or other material having similar structural properties. Conductive shell 396 can be filled with a compliant material as shown in FIG. 15d, to form a compliant core 404 of compliant shell 396. Compliant core 404 can include an encapsulant, molding compound, polymer composite material, such as epoxy resin with filler, epoxy acrylate with filler, or polymer with proper filler. Compliant core 404 can also be one or more layers of SiO2, Si3N4, SiON, Ta2O5, Al2O3, PI, BCB, PBO, or other suitable insulating or dielectric material. Alternatively, compliant core 404 can remain hollow. Compliant core 404 has a lower Young's modulus than the material of conductive shell 396. In one embodiment, compliant core 404 has a Young's modulus less than 10 GPa. Thus, compliant core 404 is softer or more compliant than the material of conductive shell 396.

An electrically conductive layer 406 is formed over conductive shell 396 and extends over a portion of photoresist layer 400 outside a footprint of conductive shell 396 using a patterning and metal deposition process such as printing, PVD, CVD, sputtering, electrolytic plating, and electroless plating. Conductive layer 406 can be one or more layers of Al, Cu, Sn, Ni, Au, Ag, or other suitable electrically conductive material. Conductive layer 406 constitutes a conductive lip, and provides additional structural support for conductive shell 396 and additional contact surface area for subsequently deposited bump material.

FIG. 15e shows a top or plan view of the assembly from FIG. 15d. Conductive layer 406 is formed over conductive shell 396 and extends over a portion of photoresist layer 400 to form a conductive lip in a generally circular or ring shape. The shape of conductive layer 406 can vary according to the design and function of semiconductor die 124, and can be, for example, generally square, rectangular, or oval. Compliant core 404 is formed centrally with respect to the footprint of conductive layer 406, within conductive shell 396.

In FIG. 15f, photoresist layer 400 is removed using an etching process to expose external surface 408 of conductive shell 396, insulating layer 134, conductive layer 288, and conductive layer 284. Collectively, conductive layers 284, 288, and 406, conductive shell 396, and compliant core 404 constitute a z-direction vertical narrow compliant conductive interconnect structure or compliant pillar 410. Conductive shell 396 is filled with a compliant material, or remains hollow, to form compliant core 404, which is softer or more compliant than the material of conductive shell 396. Because compliant core 404 is softer or more compliant than the material of conductive shell 396, compliant pillar 410 is less rigid than a solid conductive pillar and can conform or slightly change shape under stress, which reduces incidence of pre-solder crack or ELK delamination. Conductive layer 406 provides additional structural support for compliant pillar 410, and provides greater surface area for subsequent mechanical and electrical contact with a substrate or subsequently applied bump material. The assembly is singulated through insulating layer 134 and saw street 126 using a saw blade or laser cutting tool 414 into individual semiconductor die 124.

Figure 16A:
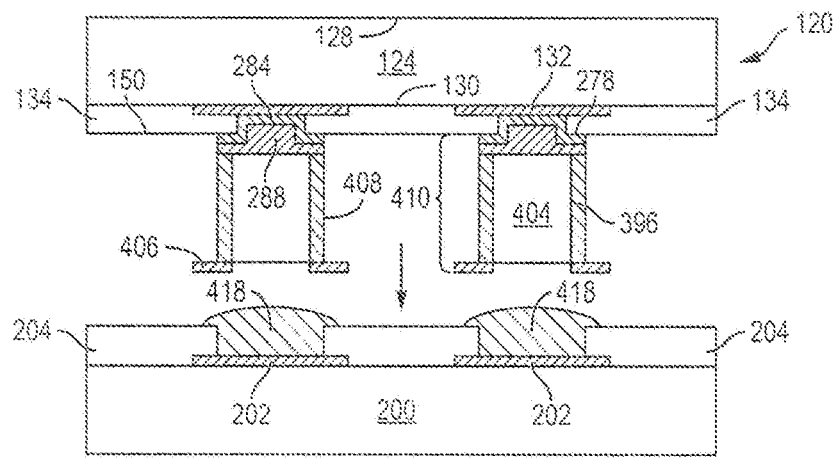
FIGS. 16a-16b illustrate a process of mounting a semiconductor die having a compliant conductive interconnect structure with a conductive lip over a substrate.
Figure 16B:
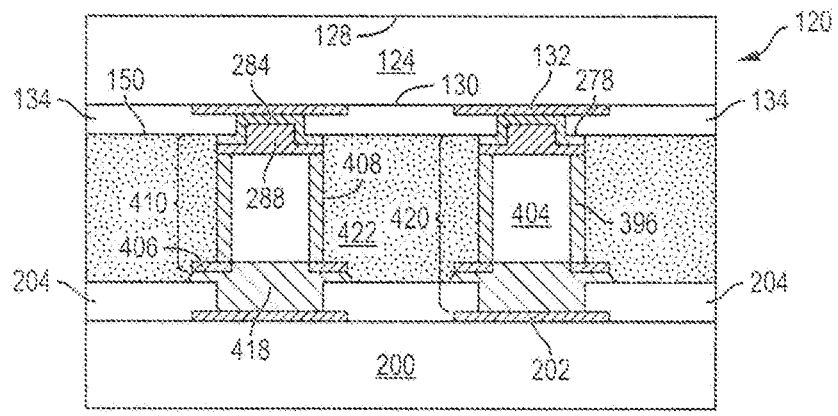

FIGS. 16a-16b illustrate, in relation to FIGS. 3 and 4a-4c, a process of mounting a semiconductor die having a compliant conductive interconnect structure with a conductive lip over a substrate. Continuing from FIG. 6b, an electrically conductive pre-solder or bump material is deposited over the exposed conductive layer 202 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. In one embodiment, the bump material is reflowed by heating the material above its melting point to form pre-solder bumps 418. In some applications, bumps 418 are reflowed a second time to improve electrical contact to conductive layer 202. Bumps 418 can also be compression bonded to conductive layer 202. Bumps 418 represent one type of interconnect structure that can be formed over conductive layer 202. The interconnect structure can also use stud bump, micro bump, or other electrical interconnect. Semiconductor die 124 from FIG. 15f is positioned over and mounted to substrate 200 using a pick and place operation with active surface 130 oriented toward substrate 200. Compliant pillar 410 is aligned with conductive layer 202. The footprint of conductive layer 406 extends over a portion of insulating layer 204 and outside the footprint of conductive layer 202 and opening 206.

FIG. 16b shows semiconductor die 124 mounted over substrate 200. Bumps 418 are reflowed to mechanically and electrically connect compliant pillar 410 to conductive layer 202. Collectively, compliant pillar 410 and bump 418 constitute a compliant composite conductive interconnect structure or compliant composite bump 420. Semiconductor die 124 is electrically connected to conductive layer 202 of substrate 200 through compliant composite bump 420. Compliant composite bump 420 has a fusible portion, bump 418, and a non-fusible or non-collapsible portion, compliant pillar 410. Conductive shell 396 of compliant pillar 410 provides standoff distance between semiconductor die 124 and substrate 200. Thus, conductive shell 396 allows for fine pitch between adjacent bumps by requiring less bump material to achieve a desired standoff distance. Because compliant core 404 of compliant pillar 410 is softer or more compliant than the material of conductive shell 396, compliant pillar 410 can conform or slightly change shape under stress, which reduces the incidence of pre-solder crack or ELK delamination. The compliant pillar structure can reduce pre-solder stress in some instances by more than 30%. Additionally, a compliant pillar with a cross-sectional width equal to 5 μm can reduce ELK stress by 25% and reduce stress in the UBM layer and contact pad by 3%. In one embodiment, compliant pillar 410 has a cross-sectional width equal to 5 μm. As the cross-sectional width of the compliant pillar exceeds 7 μm, the stress reduction may decrease. In one embodiment, compliant pillar 410 has a cross-sectional width less than 7 μm.

An UF material or molding compound 422 is deposited evenly between semiconductor die 124 and substrate 200, and between and around compliant pillars 410, using an UF process. UF material 422 can be an encapsulant, molding compound, polymer composite material, such as epoxy resin with filler, epoxy acrylate with filler, or polymer with proper filler. UF material 422 is non-conductive and environmentally protects semiconductor die 124 from external elements and contaminants.

Figure 17:
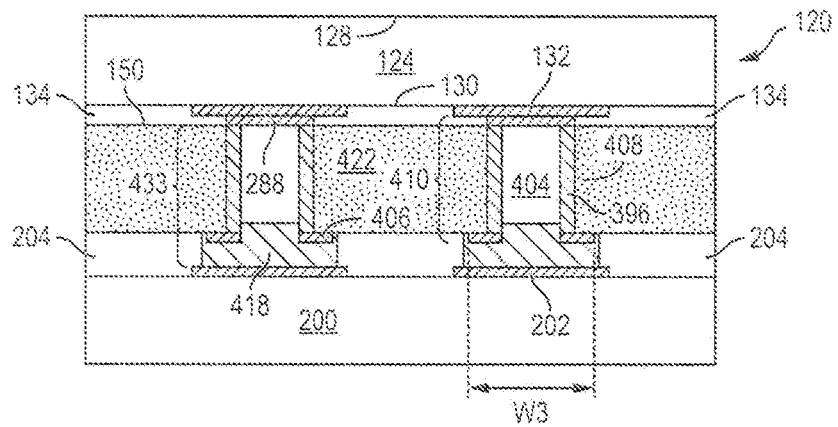
FIG. 17 illustrates a semiconductor die with a compliant conductive interconnect structure having a conductive lip without a UBM layer mounted over a substrate.

FIG. 17 illustrates an alternate embodiment, similar to the assembly shown in FIG. 16b, absent the formation of conductive layer 284 as a UBM layer. Instead, conductive layer 288 is formed directly over conductive layer 132 of semiconductor die 124. Additionally, the cross-sectional width W3 measured across conductive layer 406 is slightly narrower than in FIG. 16b, and slightly narrower than opening 206, allowing conductive layer 406 to be recessed within conductive layer 204. Bump 418 is reflowed to electrically and mechanically connect compliant pillar 410 to conductive layer 202. Collectively, compliant pillar 410 and bump 418 constitute a compliant composite conductive interconnect structure or compliant composite bump 433. Semiconductor die 124 is electrically connected to conductive layer 202 of substrate 200 through compliant composite bump 433 Compliant composite bump 433 has a fusible portion, bump 418, and a non-fusible or non-collapsible portion, compliant pillar 410.

The stiffer or less compliant material of conductive shell 396 of compliant bump 430 provides standoff distance between semiconductor die 124 and substrate 200. Thus, conductive shell 396 allows for fine pitch between adjacent bumps by requiring less bump material to achieve a desired standoff distance. Compliant bump 430 has a compliant core 404. Compliant core 404 is a compliant material or is hollow, and is softer or more compliant than the material of conductive shell 396. Compliant core 404 is softer or more compliant than the material of conductive shell 396, which allows the structure of conductive shell 396 to conform or slightly change shape under stress, thereby reducing the incidence of pre-solder crack or ELK delamination. The compliant pillar structure can reduce pre-solder stress in some instances by more than 30%. Additionally, a compliant pillar with a cross-sectional width equal to 5 μm can reduce ELK stress by 25% and reduce stress in the UBM layer and contact pad by 3%. In one embodiment, compliant bump 430 has a cross-sectional width equal to 5 μm. As the cross-sectional width of the compliant pillar exceeds 7 μm, the stress reduction may decrease. In one embodiment, compliant bump 430 has a cross-sectional width less than 7 μm.

Figure 18E:
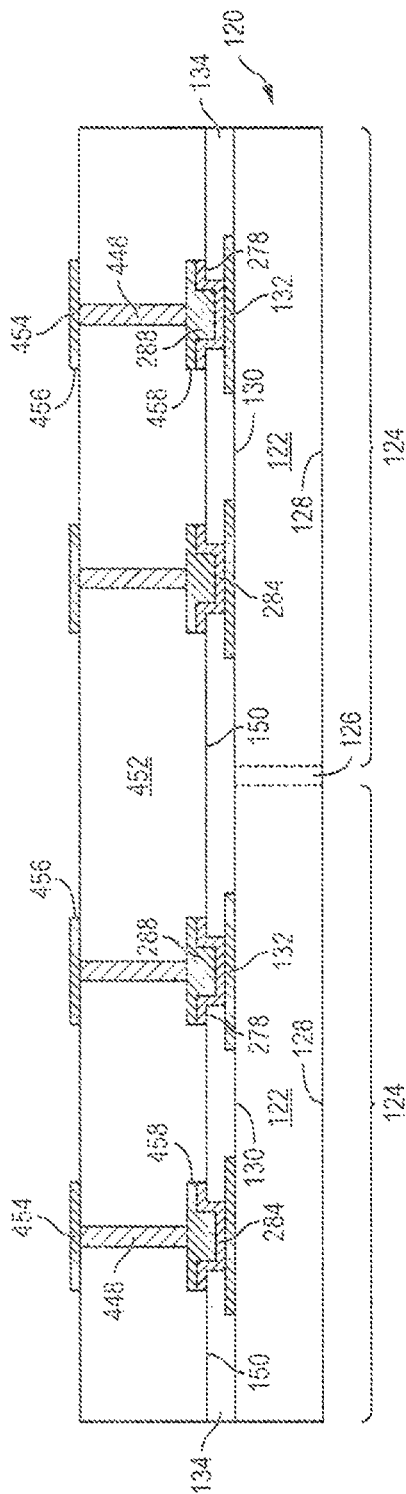

FIGS. 18a-18f illustrate, in relation to FIGS. 3 and 4a-4c, a process of forming a compliant conductive interconnect structure with a narrow conductive column and external conductive bump material. Continuing from FIG. 11c, a masking layer 440 is disposed over photoresist layer 300. Masking layer 440 has a solid or opaque portion 440a and a transparent portion 440b. In FIG. 18a, opaque portion 440a has a generally circular cross-section over conductive layer 288. The shape of opaque portion 440a can vary according to the design and function of semiconductor die 124 and can be formed, for example, in a generally oval, rectangular, or square shape. The cross-sectional width of opaque portion 440a is smaller than the cross-sectional width of conductive layer 288. Transparent portion 440b is formed adjacent to opaque portion 440a, outside the footprint of opaque portion 440a. Transparent portion 440b extends over a footprint of conductive layer 288. Masking layer 440 is exposed to UV light, which passes through transparent 440b. The portion of photoresist layer 300 outside the footprint of opaque portion 440a is irradiated with UV light to cure photoresist layer 300 within a footprint of transparent portion 440b.

In FIG. 18b, masking layer 440 is removed and the non-irradiated portion of photoresist layer 300 is removed by an etching process to form narrow opening 442 and to expose conductive layer 288. Alternatively, a portion of photoresist layer 300 is removed by LDA using laser 444 to form opening 442 and to expose conductive layer 288.

In FIG. 18c, an electrically conductive layer 448 is formed over conductive layer 288 within opening 442 using a patterning and metal deposition process such as printing, PVD, CVD, sputtering, electrolytic plating, and electroless plating. Conductive layer 448 can be one or more layers of Al, Cu, Sn, Ti, Ni, Au, Ag, or other suitable electrically conductive material. Conductive layer 448 constitutes a narrow conductive column. Conductive column 448 is electrically connected to conductive layer 288. The shape of conductive column 448 can vary according to the design and function of semiconductor die 124 and can be, for example, generally cylindrical or cubic. The cross-sectional width of conductive column 448 is much less than the cross-sectional width of conductive layer 288. In one embodiment, the cross-sectional width of conductive column 448 ranges from 20-30 μm. The cross-sectional width of conductive column 448 is also less than the cross-sectional width of conductive layer 132 of semiconductor die 124. Because conductive column 448 is narrow and has a cross-sectional width less than the cross-sectional width of conductive layers 288 and 132, conductive column 448 is more compliant than a conductive pillar with a larger cross-sectional width.

FIG. 18d shows a top or plan view of the assembly from FIG. 18c. Photoresist layer 300 is removed using an etching process to expose insulating layer 134, conductive layer 288, and sidewall 450 of conductive column 448. The footprint of conductive column 448 lies within the footprint of conductive layer 288. The cross-sectional width of conductive column 448 is smaller than the cross-sectional width of conductive layer 288, such that conductive column 448 constitutes a narrow conductive column.

In FIG. 18e, a patterning or photoresist layer 452 is formed over insulating layer 134, and conductive layers 284 and 288 outside a footprint of conductive column 448 using printing, spin coating, or spray coating. In some embodiments that utilize an insulating layer for patterning, the insulating layer can include one or more layers of SiO2, Si3N4, SiON, Ta2O5, Al2O3, or other material having similar structural properties. An electrically conductive layer 454 is deposited over conductive column 448 and photoresist layer 452 using a patterning and metal deposition process such as printing, PVD, CVD, sputtering, electrolytic plating, and electroless plating. Conductive layer 454 can be one or more layers of Al, Cu, Sn, Ti, Ni, Au, Ag, or other suitable electrically conductive material. Conductive layer 454 extends outside the footprint of conductive column 448. The peripheral edge 456 of conductive layer 454 is coplanar with the peripheral edge 458 of conductive layer 288. In another embodiment, peripheral edge 456 of conductive layer 454 is laterally offset from the peripheral edge 458, such that the footprint of conductive layer 454 lies within the footprint of conductive layer 288. In another embodiment, the footprint of conductive layer 454 extends outside the footprint of conductive layer 288.

Figure 18F:
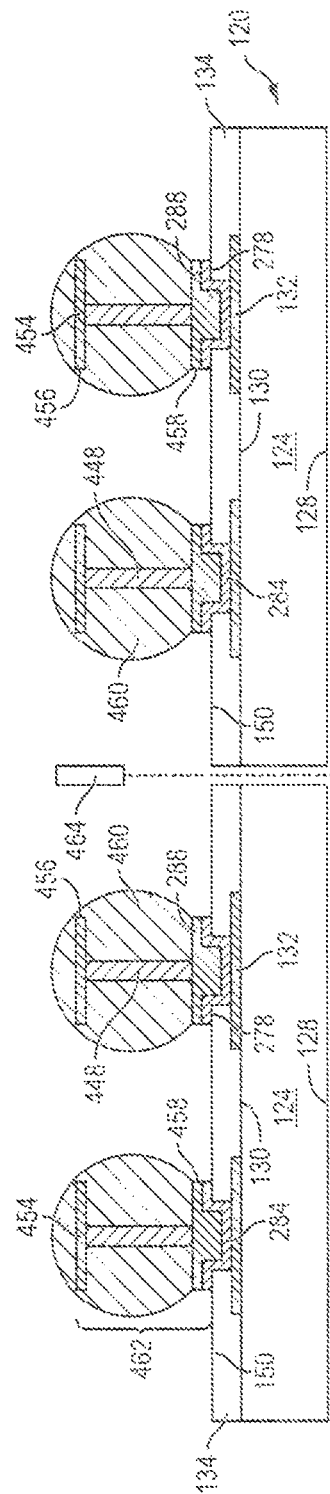

In FIG. 18f, photoresist layer 452 is removed using an etching process to expose conductive layers 284 and 288, and insulating layer 134. An electrically conductive bump material is deposited over conductive column 448, conductive layer 454, and conductive layer 288 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material can be reflowed to form a rounded or spherical bump 460 around conductive column 448, conductive layer 454, and over conductive layer 288.

Collectively, conductive layers 284, 288, and 454, and conductive column 448 constitute z-direction vertical narrow compliant conductive interconnect structure or compliant pillar 462. Bump 460 is formed externally around compliant pillar 462. Conductive column 448 has a smaller or narrower cross-sectional width than the cross-sectional width of conductive layer 288. The cross-sectional width of conductive column 448 is also less than the cross-sectional width of conductive layer 132 of semiconductor die 124. Because conductive column 448 is narrow and has a cross-sectional width less than the cross-sectional width of conductive layers 288 and 132, conductive column 448 is more compliant than a conductive pillar with a larger cross-sectional width. The narrow and compliant conductive column 448 enables compliant pillar 462 to conform or slightly change shape under stress, which reduces the incidence of pre-solder crack or ELK delamination. The assembly is singulated through insulating layer 134 and saw street 126 using a saw blade or laser cutting tool 464 into individual semiconductor die 124.

Figure 19A:
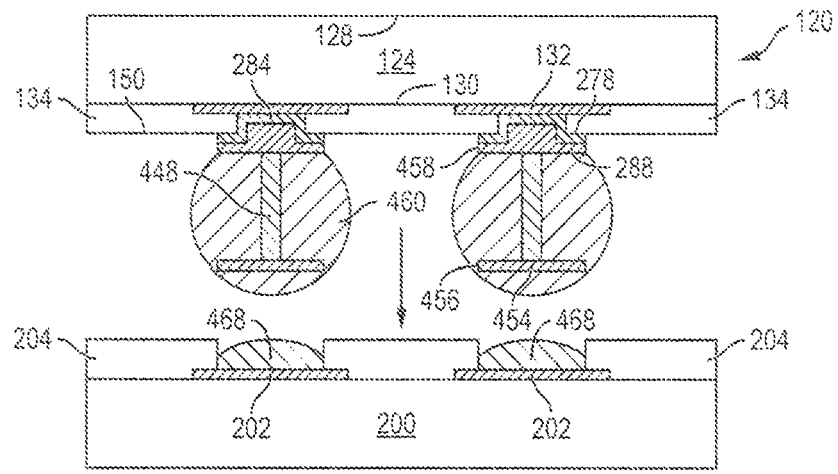
FIGS. 19a-19b illustrate a process of mounting a semiconductor die having a compliant conductive interconnect structure with a narrow conductive column over a substrate.
Figure 19B:
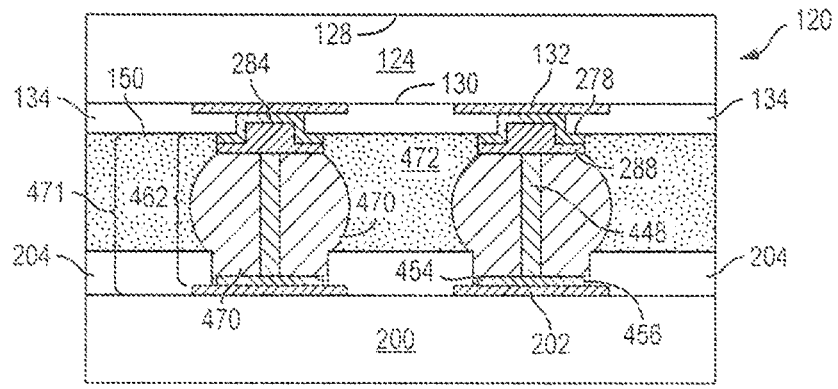

FIGS. 19a-19b illustrate, in relation to FIGS. 3 and 4a-4c, a process of mounting a semiconductor die having a compliant conductive interconnect structure with a narrow conductive column over a substrate. Continuing from FIG. 6b, an electrically conductive pre-solder or bump material is deposited over the exposed conductive layer 202 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. In one embodiment, the bump material is reflowed by heating the material above its melting point to form pre-solder bumps 468. In some applications, bumps 468 are reflowed a second time to improve electrical contact to conductive layer 202. Bumps 468 can also be compression bonded to conductive layer 202. Bumps 468 represent one type of interconnect structure that can be formed over conductive layer 202. The interconnect structure can also use stud bump, micro bump, or other electrical interconnect. Semiconductor die 124 from FIG. 18f is positioned over and mounted to substrate 200 using a pick and place operation with active surface 130 oriented toward substrate 200. Compliant pillar 462 is aligned with conductive layer 202.

FIG. 19b shows semiconductor die 124 mounted over substrate 200. Bumps 460 and 468 are reflowed and merge to form bump 470. Bump 470 is formed externally to compliant pillar 462, and surrounds conductive column 448 and conductive layer 454. Bump 470 mechanically and electrically connects compliant pillar 462 to conductive layer 202. Conductive layer 454 is adjacent to conductive layer 202 of substrate 200. Collectively, compliant pillar 462 and bump 470 constitute a compliant composite conductive interconnect structure or compliant composite bump 471. Semiconductor die 124 is electrically connected to conductive layer 202 of substrate 200 through compliant composite bump 471. Compliant composite bump 471 has a fusible portion, bump 470, and a non-fusible or non-collapsible portion, compliant pillar 462. Conductive column 448 provides standoff distance between semiconductor die 124 and substrate 200. Compliant pillar 462 has a narrow conductive column 448. The cross-sectional width of conductive column 448 is much less than the cross-sectional width of conductive layer 288. In one embodiment, the cross-sectional width of conductive column 448 ranges from 20-30 μm. The cross-sectional width of conductive column 448 is also less than the cross-sectional width of conductive layer 132 of semiconductor die 124. Because conductive column 448 is narrow and has a cross-sectional width less than the cross-sectional width of conductive layers 288 and 132, conductive column 448 is more compliant than a conductive pillar with a larger cross-sectional width. Thus, conductive column 448 allows the structure of compliant pillar 462 to conform or slightly change shape under stress, which reduces the incidence of pre-solder crack or ELK delamination. Conductive column 448 has a higher melting point than bump 470, and maintains standoff distance between semiconductor die 124 and substrate 200 during reflow of bump 470.

An UF material or molding compound 472 is deposited evenly between semiconductor die 124 and substrate 200, and between and around compliant pillar 462. UF material 472 can be an encapsulant, molding compound, polymer composite material, such as epoxy resin with filler, epoxy acrylate with filler, or polymer with proper filler. UF material 472 is non-conductive and environmentally protects semiconductor die 124 from external elements and contaminants.

Figures 20A, 20B:
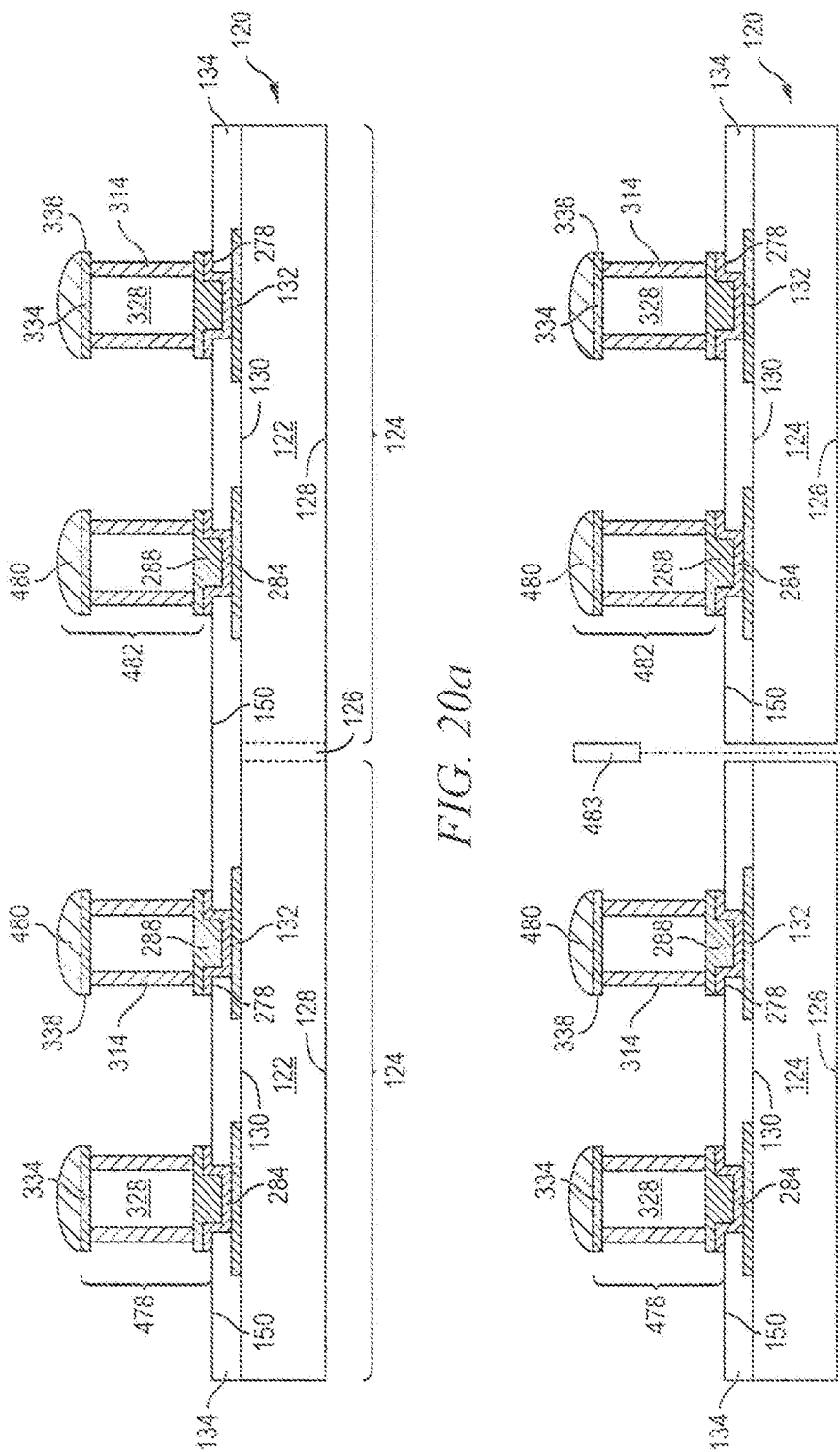
FIGS. 20a-20b illustrate a process of forming a compliant conductive interconnect structure with a conductive bump cap over a semiconductor wafer.

FIGS. 20a-20b illustrate, in relation to FIGS. 3 and 4a-4c, a process of forming a compliant conductive interconnect structure with a conductive bump cap over a semiconductor wafer. Continuing from FIG. 11j, photoresist layer 324 is removed using an etching process to expose insulating layer 134, conductive shell 314, conductive layer 288, and conductive layer 284. Collectively, conductive layers 284, 288, and 334, conductive shell 314, and compliant core 328 constitute z-direction vertical narrow compliant conductive interconnect structure or compliant pillar 478. Hollow core 320 of conductive shell 314 is filled with a compliant material, or remains hollow to form compliant core 328, which is softer or more compliant than the material of conductive shell 314. Because compliant core 328 is softer or more compliant than the material of conductive shell 314, compliant pillar 478 is less rigid than a solid conductive pillar and can conform or slightly change shape under stress, which reduces the incidence of pre-solder crack or ELK delamination. Conductive layer 334 provides additional structural support for compliant pillar 478, and provides a greater surface area for subsequent mechanical and electrical contact with a substrate. Additionally, conductive layer 334 seals compliant core 328 from external environmental contaminants.

An electrically conductive bump material is deposited over compliant pillar 478 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material can be reflowed to form a rounded bump cap 480. Collectively, compliant pillar 478 and bump cap 480 constitute a compliant composite conductive interconnect structure or compliant composite bump 482. Compliant composite bump 482 has a fusible portion, bump cap 480, and a non-fusible or non-collapsible portion, compliant pillar 478. The assembly is singulated through insulating layer 134 and saw street 126 using a saw blade or laser cutting tool 483 into individual semiconductor die 124.

Figure 21A:
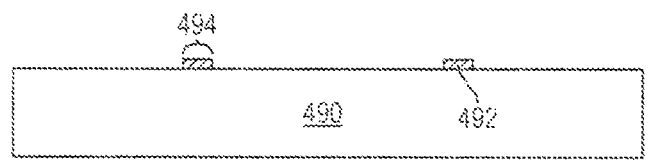
FIGS. 21a-21d illustrate a process of mounting a semiconductor die with a compliant conductive interconnect structure to a substrate in a bump on lead (BOL) configuration.

FIGS. 21a-21d illustrate, in relation to FIGS. 3 and 4a-4c, a process of mounting a semiconductor die with a compliant conductive interconnect structure to a substrate in a BOL configuration. FIG. 21a shows a substrate or PCB 490 suitable for mounting semiconductor die 124. Substrate 490 can be one or more laminated layers of prepreg, FR-4, FR-1, CEM-1, or CEM-3 with a combination of phenolic cotton paper, epoxy, resin, woven glass, matte glass, polyester, and other reinforcement fibers or fabrics. Alternatively, substrate 490 contains one or more laminated insulating or dielectric layers.

An electrically conductive layer 492 is formed over substrate 490 using a patterning and metal deposition process, such as silk screen printing, photoengraving, PCB milling, electroless plating, or electroplating process. Conductive layer 492 can be one or more layers of Al, Cu, Sn, Ni, Au, Ag, or other suitable electrically conductive material. Conductive layer 492 operates as conductive traces or leads for electrical interconnect. Portions of conductive layer 492 are electrically common or electrically isolated according to the design and function of semiconductor die 124. A portion of conductive layer 492 operates as an interconnect site 494 for semiconductor die 124.

Figure 21B:
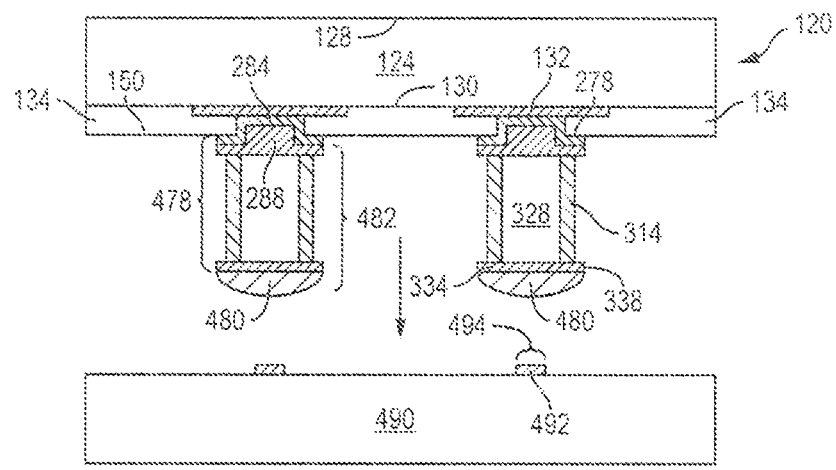

In FIG. 21b, semiconductor die 124 from FIG. 20b is positioned over and mounted to substrate 490 using a pick and place operation with active surface 130 oriented toward substrate 490. Compliant composite bump 482 is aligned with interconnect site 494 of conductive layer 492. In one embodiment, compliant composite bump 482 has a cross-sectional width greater than the cross-sectional width of interconnect site 494. Because interconnect site 494 of conductive layer 492 is narrower than compliant composite bump 482, the distance or pitch between adjacent conductive layers 492 and compliant composite bump 482 can be reduced. In another embodiment, compliant composite bump 482 has a cross-sectional width slightly less than the cross-sectional width of interconnect site 494. In another embodiment the cross-sectional width of compliant composite bump 482 is less than 7 µm and the cross-sectional width of interconnect site 494 ranges from 10-25 µm.

Figure 21C:
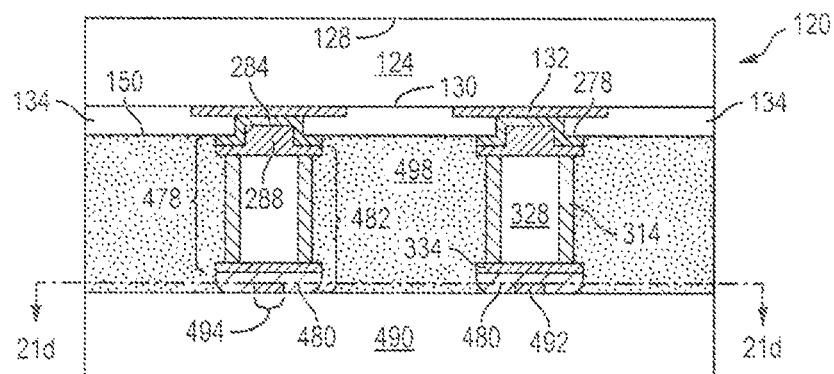

FIG. 21c shows semiconductor die 124 mounted over substrate 490 with compliant composite bump 482 electrically and metallurgically connected to conductive layer 492 in a BOL configuration. Bump cap 480 is melted or reflowed to electrically and mechanically connect compliant composite bump 482 to conductive layer 492 of substrate 490. Compliant composite bump 482 can also be compression bonded or thermocompression bonded to conductive layer 492 of substrate 490. Compression bonding uses pressure in excess of 10 megapascals (MPa) (1450 psi) at temperatures below 200° C. to bond materials via solid-state diffusion. Typical materials bonded using compression bonding include indium (In), Au, Pb, and Pb/Sn alloys. Thermocompression bonding uses elevated temperatures in conjunction with pressure to bond materials. Typical materials bonded using thermocompression bonding include Cu, Au, and Al. In one embodiment, thermocompression bonding is used to bond bump cap 480 to conductive layer 492 by applying 30 MPa of pressure at 300° C. for 2 minutes.

An UF material or molding compound 498 is deposited evenly between semiconductor die 124 and substrate 490, and between and around compliant composite bump 482, using an UF process. UF material 498 can be an encapsulant, molding compound, polymer composite material, such as epoxy resin with filler, epoxy acrylate with filler, or polymer with proper filler. UF material 498 is non-conductive and environmentally protects semiconductor die 124 from external elements and contaminants.

The stiffer or less compliant material of conductive shell 314 of compliant composite bump 482 provides standoff distance between semiconductor die 124 and substrate 490. Thus, conductive shell 314 allows for fine pitch between adjacent bumps by requiring less bump material to achieve a desired standoff distance. Compliant composite bump 482 has a compliant core 328. Compliant core 328 is a compliant material or is hollow, and is softer or more compliant than the material of conductive shell 314. Because compliant core 328 is softer or more compliant than the material of conductive shell 314, compliant pillar 478 is less rigid than a solid conductive pillar and can conform or slightly change shape under stress, which reduces the incidence of pre-solder crack or ELK delamination. The compliant pillar structure can reduce pre-solder stress in some instances by more than 30%. Additionally, a compliant pillar with a cross-sectional width equal to 5 µm can reduce ELK stress by 25% and reduce stress in the UBM layer and contact pad by 3%. In one embodiment, compliant composite bump 482 has a cross-sectional width equal to 5 µm. As the cross-sectional width of the compliant bump exceeds 7 µm, the stress reduction may decrease. In one embodiment, compliant composite bump 482 has a cross-sectional width less than 7 µm. Compliant composite bump 482 has a cross-sectional width greater than the cross-sectional width of interconnect site 494. Because interconnect site 494 of conductive layer 492 is narrower than compliant composite bump 482, the distance or pitch between adjacent conductive layers 492 and compliant composite bumps 482 can be reduced.

Figure 21D:
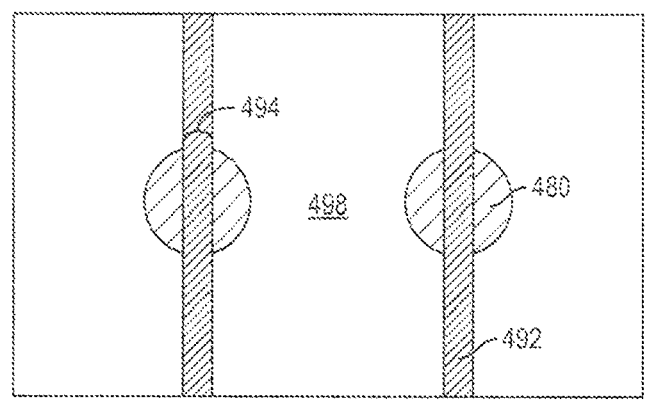

FIG. 21d shows a top or plan view of the assembly from FIG. 21c, from a plane that runs parallel to substrate 490 through interconnect site 494 across conductive layer 492. Bump cap 480 has a cross-sectional width greater than the width across conductive layer 492. The width of conductive layer 492 under bump cap 480 is less than the width of bump cap 480. Additionally, the width across conductive layer 492 under bump cap 480 at interconnect site 494 is substantially equal to the width across conductive layer 492 outside a footprint of bump cap 480. In one embodiment, conductive layer 492 flares out slightly at interconnect site 494 within a footprint of bump cap 480 to have a cross-sectional width within a footprint of bump cap greater than the cross-sectional width of conductive layer 492 outside a footprint of bump cap 480. Mounting semiconductor die 124 directly on a conductive trace or lead without a conventional capture pad allows for finer pitch between adjacent traces and conductive bumps for increased signal routing density.

Figure 22A:
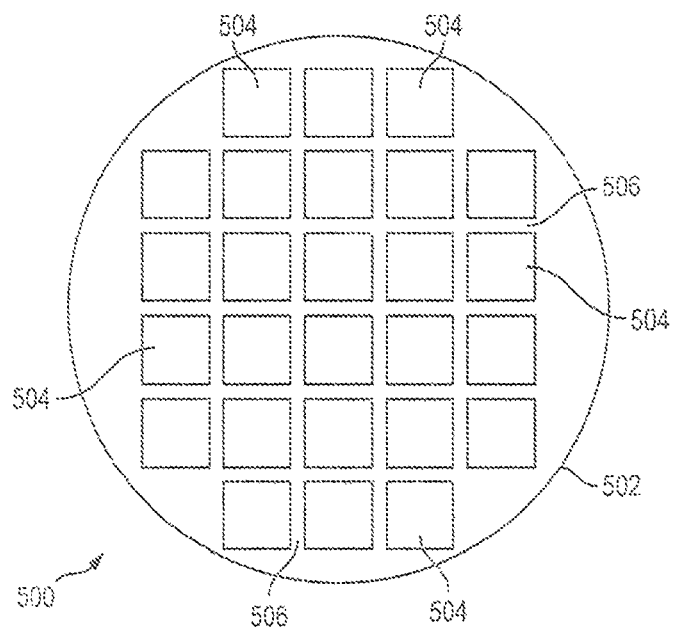
FIGS. 22a-22c illustrate a semiconductor wafer with a plurality of semiconductor die separated by saw streets.

FIG. 22a shows a semiconductor wafer 500 with a base substrate material 502, such as silicon, germanium, gallium arsenide, indium phosphide, or silicon carbide, for structural support. A plurality of semiconductor die or components 504 is formed on semiconductor wafer 500 separated by a non-active, inter-die wafer area or saw street 506 as described above. Saw street 506 provides cutting areas to singulate semiconductor wafer 500 into individual semiconductor die 504.

Figure 22B:
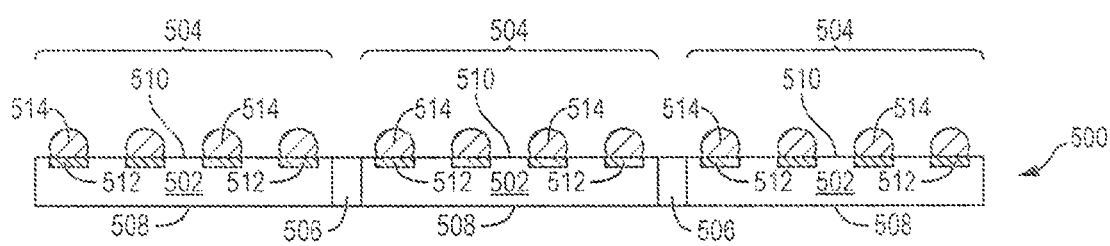

FIG. 22b shows a cross-sectional view of a portion of semiconductor wafer 500. Each semiconductor die 504 has a back surface 508 and active surface 510 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 510 to implement analog circuits or digital circuits, such as DSP, ASIC, memory, or other signal processing circuit. Semiconductor die 504 may also contain IPDs, such as inductors, capacitors, and resistors, for RF signal processing.

An electrically conductive layer 512 is formed over active surface 510 using PVD, CVD, electrolytic plating, electroless plating process, or other suitable metal deposition process. Conductive layer 512 can be one or more layers of Al, Cu, Sn, Ni, Au, Ag, or other suitable electrically conductive material. Conductive layer 512 operates as contact pads electrically connected to the circuits on active surface 510. Contact pads 512 can be disposed side-by-side a first distance from the edge of semiconductor die 504, as shown in FIG. 22b. Alternatively, contact pads 512 can be offset in multiple rows such that a first row of contact pads is disposed a first distance from the edge of the die, and a second row of contact pads alternating with the first row is disposed a second distance from the edge of the die.

An electrically conductive bump material is deposited over conductive layer 512 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 512 using a suitable attachment or bonding process. In one embodiment, the bump material is reflowed by heating the material above its melting point to form balls or bumps 514. In some applications, bumps 514 are reflowed a second time to improve electrical contact to conductive layer 512. Bumps 514 can also be compression bonded to conductive layer 512. Bumps 514 represent one type of interconnect structure that can be formed over conductive layer 512. The interconnect structure can also use stud bump, micro bump, or other electrical interconnect.

Figure 22C:
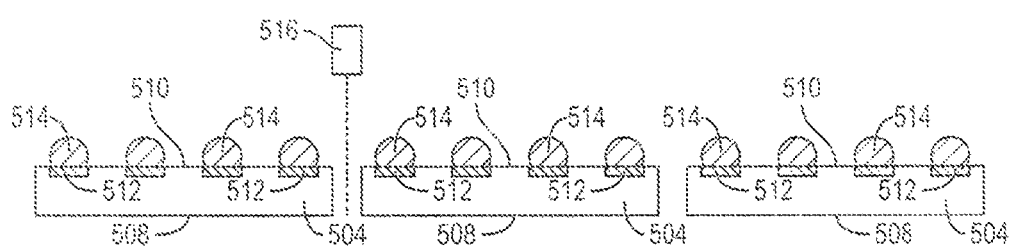

In FIG. 22c, semiconductor wafer 500 is singulated through saw street 506 using a saw blade or laser cutting tool 516 into individual semiconductor die 504.

Figure 23A:
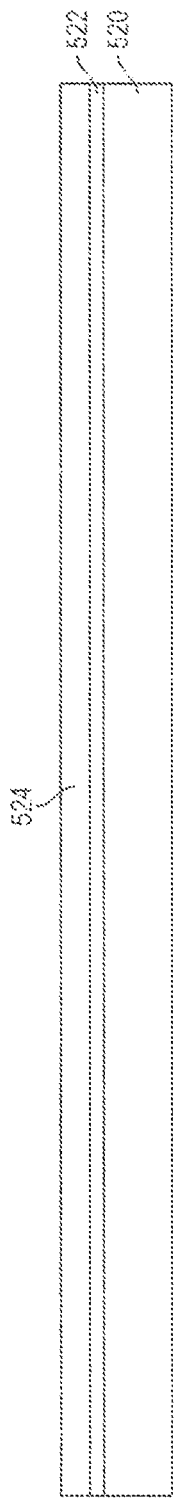
FIGS. 23a-23o illustrate a process of forming a semiconductor package with a compliant conductive interconnect structure.

FIGS. 23a-23n illustrate, in relation to FIGS. 3 and 4a-4c, a process of forming a semiconductor package with a compliant conductive interconnect structure. In FIG. 23a, a temporary substrate or carrier 520 contains sacrificial base material such as silicon, polymer, beryllium oxide, glass, or other suitable low-cost, rigid material for structural support. An interface layer or double-sided tape 522 is formed over carrier 520 as a temporary adhesive bonding film, etch-stop layer, or release layer. A semiconductor wafer or substrate 524 contains base material, such as silicon, germanium, gallium arsenide, indium phosphide, or silicon carbide, for structural support. As a semiconductor wafer, substrate 524 can contain embedded integrated semiconductor die or discrete devices. Substrate 524 can also be a multi-layer flexible laminate, ceramic or leadframe. Substrate 524 is mounted to interface layer 522 over carrier 520.

Figure 23B:
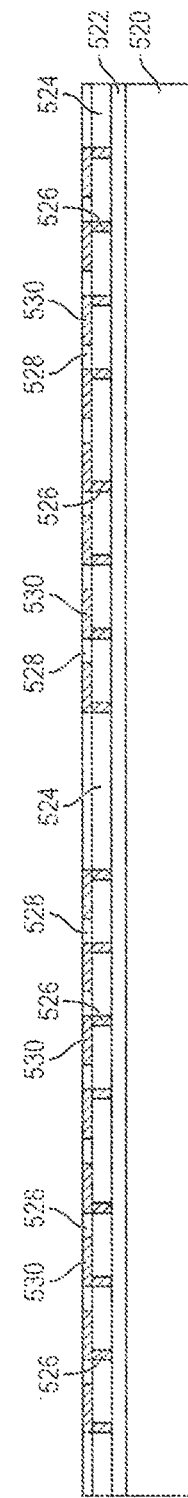

In FIG. 23b, a plurality of vias is formed through substrate 524 using laser drilling, mechanical drilling, or deep reactive ion etching (DRIE). The vias are filled with Al, Cu, Sn, Ni, Au, Ag, Ti, W, poly-silicon, or other suitable electrically conductive material using electrolytic plating, electroless plating process, or other suitable metal deposition process to form z-direction vertical interconnect conductive vias 526.

An insulating or passivation layer 528 is formed over a surface of substrate 524 and conductive vias 526 using PVD, CVD, printing, spin coating, spray coating, sintering or thermal oxidation. The insulating layer 528 contains one or more layers of SiO2, Si3N4, SiOn, Ta2O5, Al2O3, or other material having similar insulating and structural properties. A portion of insulating layer 528 is removed by an etching process with a patterned photoresist layer to expose substrate 524 and conductive vias 526.

An electrically conductive layer 530 is formed over the exposed substrate 524 and conductive vias 526 using a patterning and metal deposition process such as printing, PVD, CVD, sputtering, electrolytic plating, and electroless plating. Conductive layer 530 is one or more layers of Al, Cu, Sn, Ni, Au, Ag, or other suitable electrically conductive material. Conductive layer 530 is electrically connected to conductive vias 526.

Figure 23C:
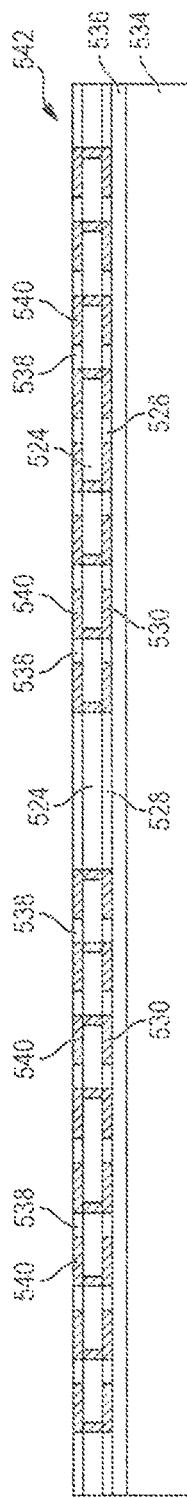

In FIG. 23c, a temporary substrate or carrier 534 contains sacrificial base material such as silicon, polymer, beryllium oxide, glass, or other suitable low-cost, rigid material for structural support. An interface layer or double-sided tape 536 is formed over carrier 534 as a temporary adhesive bonding film, etch-stop layer, or release layer. Leading with insulating layer 528 and conductive layer 530, substrate 524 is mounted to interface layer 536 over carrier 534. Carrier 520 and interface layer 522 are removed by chemical etching, mechanical peeling, CMP, mechanical grinding, thermal bake, UV light, laser scanning, or wet stripping to expose a surface of substrate 524 and conductive vias 526 opposite conductive layer 530.

An insulating or passivation layer 538 is formed over substrate 524 and conductive vias 526 using PVD, CVD, printing, spin coating, spray coating, sintering or thermal oxidation. The insulating layer 538 contains one or more layers of SiO2, Si3N4, SiOn, Ta2O5, Al2O3, or other material having similar insulating and structural properties. A portion of insulating layer 538 is removed by an etching process with a patterned photoresist layer to expose substrate 524 and conductive vias 526.

An electrically conductive layer 540 is formed over the exposed substrate 524 and conductive vias 526 using a patterning and metal deposition process such as printing, PVD, CVD, sputtering, electrolytic plating and electroless plating. Conductive layer 540 can be one or more layers of Al, Cu, Sn, Ni, Au, Ag, or other suitable electrically conductive material. Conductive layer 540 is electrically connected to conductive vias 526 and conductive layer 530. In another embodiment, conductive vias 526 are formed through substrate 524 after forming conductive layers 530 and/or 540. Conductive layers 530 and 540 can be formed prior to insulating layer 528 and 538, respectively. The resulting wafer-form through silicon via (TSV) interposer or substrate 542 provides electrical interconnect vertically and laterally across the substrate.

Figure 23D:
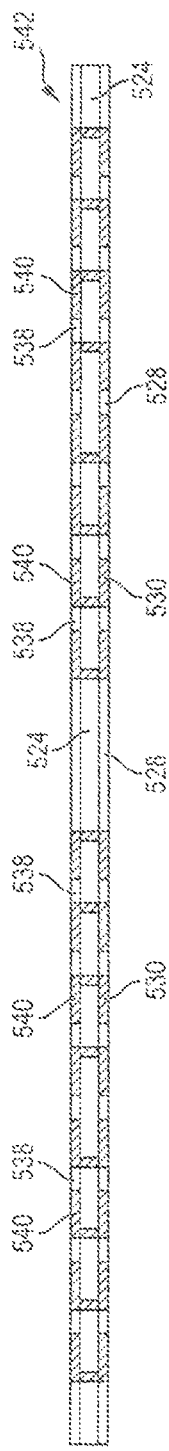

In FIG. 23d, carrier 534 and interface layer 536 are removed by chemical etching, mechanical peeling, CMP, mechanical grinding, thermal bake, UV light, laser scanning, or wet stripping to expose conductive layer 530 and insulating layer 528.

Figure 23E:
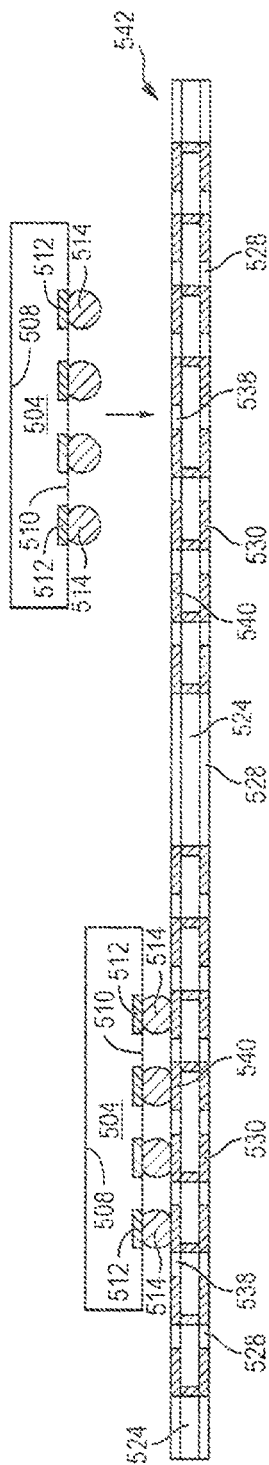
Figure 23F:
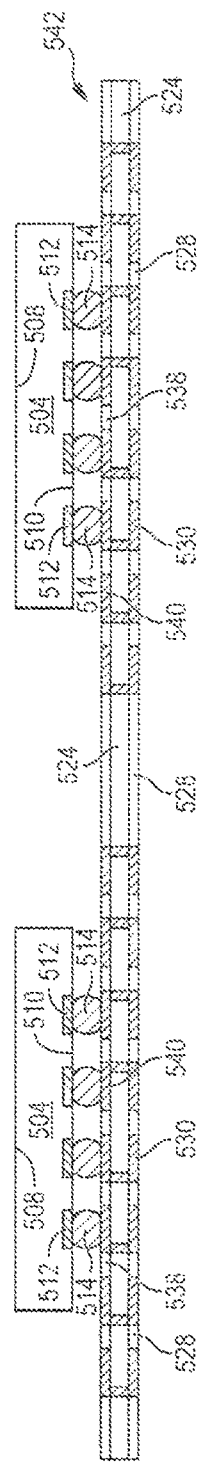

In FIG. 23e, semiconductor die 504 from FIGS. 22a-22c are mounted to conductive layer 540 of TSV substrate 542 using a pick and place operation with active surface 130 oriented toward the substrate. Bumps 514 are reflowed to electrically connect conductive layer 512 of semiconductor die 504 to conductive layer 540 of TSV substrate 542. FIG. 23f shows semiconductor die 504 mounted to TSV substrate 542.

In FIG. 23g, an encapsulant or molding compound 550 is deposited over semiconductor die 504 and TSV substrate 542 using a paste printing, compressive molding, transfer molding, liquid encapsulant molding, vacuum lamination, spin coating, or other suitable applicator. Encapsulant 550 can be polymer composite material, such as epoxy resin with filler, epoxy acrylate with filler, or polymer with proper filler. Encapsulant 550 is non-conductive and environmentally protects the semiconductor device from external elements and contaminants.

In FIG. 23h, the assembly from FIG. 23g is inverted and an insulating or passivation layer 552 is formed over TSV substrate 542 using PVD, CVD, printing, spin coating, spray coating, screen printing or lamination. Insulating layer 552 contains one or more layers of photosensitive polymer dielectric film with or without fillers, non-photosensitive polymer dielectric film, SiO2, Si3N4, SiON, Ta2O5, Al2O3, or other material having similar insulating and structural properties. A portion of insulating layer 552 is removed by an etching process with a patterned photoresist layer to create via or opening 554 to expose conductive layer 530. Alternatively, a portion of insulating layer 552 is removed by LDA using laser 556 to create opening 554.

In FIG. 23i, a patterning or photoresist layer 560 is formed over insulating layer 552 using printing, spin coating, or spray coating. In some embodiments that utilize an insulating layer for patterning, the insulating layer can include one or more layers of SiO2, Si3N4, SiON, Ta2O5, Al2O3, or other material having similar structural properties. A portion of photoresist layer 560 over opening 554 is removed by an etching process through a patterned photoresist layer to form opening 562 and to expose a portion of conductive layer 530 and a surface 564 of insulating layer 552. Alternatively, a portion of photoresist layer 560 is removed by LDA using laser 568 to form opening 562 and expose conductive layer 530 and a surface 564 of insulating layer 552. Opening 562 has a larger footprint or cross-sectional width than the footprint of opening 554. In one embodiment, opening 562 has a circular cross-sectional area configured to form a conductive shell with a cylindrical shape including a circular cross-section. In another embodiment, opening 562 has a rectangular cross-sectional area configured to form a conductive shell with a cubic shape including a rectangular cross-section.

An electrically conductive layer 570 is conformally applied over insulating layer 552 and conductive layer 530 within opening 562, using a patterning and metal deposition process such as printing, PVD, CVD, sputtering, electrolytic plating, and electroless plating. Conductive layer 570 can be one or more layers of Al, Cu, Sn, Ti, Ni, Au, Ag, or other suitable electrically conductive material. In one embodiment, conductive layer 570 is a multi-layer stack including a seed layer, barrier layer, and adhesion layer. The seed layer can be TiCu, TiWCu, or TaNCu. The barrier layer can be Ni, NiV, Pt, Pd, TiW, or CrCu, or other suitable material. The adhesion layer can be Ti, TiN, TiW, Al, or Cr, or other suitable material. Conductive layer 570 follows the contour of insulating layer 552 and conductive layer 530.

An electrically conductive layer 574 is deposited over conductive layer 570 within opening 562, using a patterning and metal deposition process such as printing, PVD, CVD, sputtering, electrolytic plating, and electroless plating. Conductive layer 288 can be one or more layers of Al, Cu, Sn, Ti, Ni, Au, Ag, or other suitable electrically conductive material. Conductive layer 574 has a surface 576, which contacts and conforms to the contour of conductive layer 570. Conductive layer 574 has an exposed surface 578 which is substantially flat or planar.

In FIG. 23j, photoresist layer 560 is removed by an etching process to expose insulating layer 552. A patterning or photoresist layer 582 is formed over insulating layer 552 and conductive layers 570 and 574 using printing, spin coating, or spray coating. In some embodiments that utilize an insulating layer for patterning, the insulating layer can include one or more layers of SiO2, Si3N4, SiON, Ta2O5, Al2O3, or other material having similar structural properties.

A masking layer 586 is disposed over photoresist layer 582. Masking layer 586 has a solid or opaque portion 586a and a transparent portion 586b. Opaque portion 586a is formed in a generally circular shape over conductive layer 574, such that opaque portion 586a forms a ring over a footprint of conductive layer 574. The shape of opaque portion 586a can vary according to the design and function of semiconductor die 124 and can be formed, for example, in a generally oval, rectangular, or square shape. Transparent portion 586b is formed adjacent to opaque portion 586a, outside a footprint of opaque portion 586a. Transparent portion 586b is also formed centrally to the ring of opaque portion 586a. Masking layer 586 is exposed to UV light, which passes through transparent portion 586b. The portion of photoresist layer 582 outside the footprint of opaque portion 586a is irradiated with UV light to cure photoresist layer 582 within a footprint of transparent portion 586b.

In FIG. 23k, masking layer 586 is removed and the non-irradiated portion of photoresist layer 582 is removed by an etching process to form channel or opening 590 and to expose a portion of conductive layer 574. Alternatively, a portion of photoresist layer 582 is removed by LDA using laser 592 to form opening 590 and to expose a portion of conductive layer 574. A portion of photoresist layer 582 maintains coverage over portions of conductive layers 570 and 574, and insulating layer 552 outside a footprint of opening 590. The cross-sectional width of opening 590 and the distance between sidewalls of opening 590 can be adjusted according to the design and function of semiconductor die 504 by adjusting the size and shape of opaque portion 586a of masking layer 586.

In FIG. 23l, an electrically conductive layer 594 is formed over conductive layer 574 within opening 590 using a patterning and metal deposition process such as printing, PVD, CVD, sputtering, electrolytic plating. Conductive layer 594 can be one or more layers of Al, Cu, Sn, Ti, Ni, Au, Ag, or other suitable electrically conductive material. Conductive layer 594 constitutes a conductive hollow pillar or conductive shell. Conductive shell 594 is electrically connected to conductive layer 574. The shape of conductive shell 594 can vary according to the design and function of semiconductor die 504 and can be, for example, generally cylindrical or cubic with a generally circular or rectangular cross-section.

FIG. 23m shows a top or plan view of the assembly from FIG. 23l after removing photoresist layer 582 by an etching process to expose insulating layer 552 and a portion of conductive layer 574 outside a footprint of conductive shell 594. A portion of conductive layer 574 central to conductive shell 594 is also exposed. Conductive shell 594 is formed in a generally circular or ring shape within a footprint of conductive layer 574. Thus, the cross-sectional width of conductive shell 594 is smaller than the cross-sectional width of conductive layer 574. In another embodiment, the cross-sectional width of conductive shell 594 is equal to the cross-sectional width of conductive layer 574.

In FIG. 23n, a patterning or photoresist layer 598 is formed over insulating layer 552 outside a footprint, or in a peripheral region of conductive shell 594 using printing, spin coating, or spray coating. In some embodiments that utilize an insulating layer for patterning, the insulating layer can include one or more layers of SiO2, Si3N4, SiON, Ta2O5, Al2O3, or other material having similar structural properties. Conductive shell 594 can be filled with a compliant material to form a compliant core 602 of conductive shell 594. Compliant core 602 can include an encapsulant, molding compound, polymer composite material, such as epoxy resin with filler, epoxy acrylate with filler, or polymer with proper filler. Compliant core 602 can also be one or more layers of SiO2, Si3N4, SiON, Ta2O5, Al2O3, PI, BCB, PBO, or other suitable insulating or dielectric material. Alternatively, compliant core 602 can remain hollow. Compliant core 602 has a lower Young's modulus than the material of conductive shell 594. In one embodiment, compliant core 602 has a Young's modulus less than 10 GPa. Thus, compliant core 602 is softer or more compliant than the material of conductive shell 594.

An electrically conductive layer 604 is deposited over conductive shell 594, compliant core 602, and photoresist layer 598 using a patterning and metal deposition process such as printing, PVD, CVD, sputtering, electrolytic plating, and electroless plating. Conductive layer 604 can be one or more layers of Al, Cu, Sn, Ti, Ni, Au, Ag, or other suitable electrically conductive material. Conductive layer 604 extends outside the footprint of conductive shell 594. The perimeter edge 606 of conductive layer 604 is coplanar with the perimeter edge 608 of conductive layer 574. In another embodiment, perimeter edge 606 of conductive layer 604 is laterally offset from perimeter edge 608, such that the footprint of conductive layer 604 lies within the footprint of conductive layer 574. In another embodiment, the footprint of conductive layer 604 extends outside the footprint of conductive layer 574.

In FIG. 23o, photoresist layer 598 is removed using an etching process to expose insulating layer 552, conductive shell 594, conductive layer 574, and conductive layer 570. Collectively, conductive layers 570, 574, and 604, compliant core 602, and conductive shell 594 constitute z-direction vertical narrow compliant conductive interconnect structure or compliant pillar 610. Conductive shell 594 is filled with a compliant material, or remains hollow to form compliant core 602, which is softer or more compliant than the material of conductive shell 594. Because compliant core 602 is softer or more compliant than the material of conductive shell 594, compliant pillar 610 is less rigid than a solid conductive pillar and can conform or slightly change shape under stress, which reduces the incidence of pre-solder crack or ELK delamination. Conductive layer 604 provides additional structural support for compliant pillar 610, and provides a greater surface area for subsequent mechanical and electrical contact with a substrate. Additionally, conductive layer 604 seals compliant core 602 from external environmental contaminants.

An electrically conductive bump material is deposited over compliant pillar 610 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material can be reflowed to form a rounded or spherical bump 612 around compliant pillar 610. The assembly is singulated through insulating layer 552, TSV substrate 542, and encapsulant 550 using saw blade or laser cutting tool 616 into individual fan-out semiconductor packages 618.

FIGS. 24a to 24b illustrate, in relation to FIGS. 3 and 4a-4c, a process of mounting a semiconductor package having a compliant conductive interconnect structure over a substrate. FIG. 24a shows a substrate or PCB 620 suitable for mounting semiconductor package 618. Substrate 620 can be one or more laminated layers of prepreg, FR-4, FR-1, CEM-1, or CEM-3 with a combination of phenolic cotton paper, epoxy, resin, woven glass, matte glass, polyester, and other reinforcement fibers or fabrics. Alternatively, substrate 620 contains one or more laminated insulating or dielectric layers.

An electrically conductive layer 622 is formed over substrate 620 using a patterning and metal deposition process, such as silk screen printing, photoengraving, PCB milling, electroless plating, or electroplating process. Conductive layer 622 can be one or more layers of Al, Cu, Sn, Ni, Au, Ag, or other suitable electrically conductive material. Conductive layer 622 operates as conductive traces or contact pads for electrical interconnect. Portions of conductive layer 622 are electrically common or electrically isolated according to the design and function of semiconductor package 618.

A solder resist or insulating layer 624 is formed over substrate 620 and conductive layer 622 using PVD, CVD, printing, spin coating, spray coating, screen printing or lamination. Insulating layer 624 contains one or more layers of SiO2, Si3N4, SiON, Ta2O5, Al2O3, PI, or other material having similar insulating and structural properties. A portion of insulating layer 624 over conductive layer 622 is removed by an etching process with a patterned photoresist layer, to expose conductive layer 622. Alternatively, a portion of insulating layer 624 is removed by LDA to expose conductive layer 622.

An electrically conductive pre-solder or bump material is deposited over the exposed conductive layer 622 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. In one embodiment, the bump material is reflowed by heating the material above its melting point to form pre-solder bumps 626. In some applications, bumps 626 are reflowed a second time to improve electrical contact to conductive layer 622. Bumps 626 can also be compression bonded to conductive layer 622. Bumps 626 represent one type of interconnect structure that can be formed over conductive layer 622. The interconnect structure can also use stud bump, micro bump, or other electrical interconnect. Semiconductor package 618 from FIG. 23o is positioned over and mounted to substrate 620 using a pick and place operation with active surface 510 of semiconductor die 504 oriented toward substrate 620. Compliant pillar 610 is aligned with conductive layer 622.

FIG. 24b shows semiconductor package 618 mounted over substrate 620. An UF material or molding compound 628 is deposited evenly between semiconductor package 618 and substrate 620, and between and around compliant pillar 610, using an UF process. UF material 628 can be an encapsulant, molding compound, polymer composite material, such as epoxy resin with filler, epoxy acrylate with filler, or polymer with proper filler. UF material 628 is non-conductive and environmentally protects semiconductor package 618 from external elements and contaminants.

Bumps 612 and 626 are reflowed and merge to form bump 630. Bump 630 is formed externally to compliant pillar 610 and is mechanically and electrically connected to compliant pillar 610 and conductive layer 622. Collectively, compliant pillar 610 and bump 630 constitute a compliant composite conductive interconnect structure or compliant composite bump 632. Compliant composite bump 632 has a fusible portion, bump 630, and a non-fusible or non-collapsible portion, compliant pillar 610. Semiconductor package 618 is electrically connected to conductive layer 622 of substrate 620 through compliant composite bump 632. Conductive shell 594 of compliant pillar 610 provides standoff distance between semiconductor package 618 and substrate 620. Because compliant core 602 is softer or more compliant than the material of conductive shell 594, compliant pillar 610 can conform or slightly change shape under stress, which reduces the incidence of pre-solder crack or ELK delamination. The compliant pillar structure can reduce pre-solder stress in some instances by more than 30%. Additionally, a compliant pillar with a cross-sectional width equal to 5 μm can reduce ELK stress by 25% and reduce stress in the UBM layer and contact pad by 3%. In one embodiment, compliant pillar 610 has a cross-sectional width equal to 5 μm. As the cross-sectional width of the compliant bump exceeds 7 μm, the stress reduction may decrease. In one embodiment, compliant pillar 610 has a cross-sectional width less than 7 μm.

While one or more embodiments of the present invention have been illustrated in detail, the skilled artisan will appreciate that modifications and adaptations to those embodiments may be made without departing from the scope of the present invention as set forth in the following claims.

What is claimed is:

1. A method of making a semiconductor device, comprising:
    providing a semiconductor die including a contact pad;
    forming a first conductive layer over the contact pad;
    forming a conductive shell including a hollow core over the first conductive layer;
    depositing a compliant insulating material in the hollow core; and
    disposing the semiconductor die over a substrate with the conductive shell electrically connected to a conductive trace on the substrate.

2. The method of claim 1, further including depositing a bump material around the conductive shell.

3. The method of claim 1, further including forming a second conductive layer over the conductive shell.

4. The method of claim 3, wherein the second conductive layer is a conductive lip.

5. The method of claim 1, wherein the conductive shell includes a cross-sectional width less than 7 micrometers.

6. A method of making a semiconductor device, comprising:
    providing a semiconductor die including a contact pad;
    forming a first conductive layer over the contact pad;
    forming a conductive shell including a hollow core over the first conductive layer;
    disposing a bump material over the hollow core; and
    disposing the semiconductor die over a substrate with the conductive shell electrically connected to a conductive trace on the substrate, the hollow core disposed over the conductive trace.

7. The method of claim 6, further including forming a second conductive layer over the conductive shell.

8. The method of claim 7, wherein disposing the semiconductor die over the substrate further includes disposing the semiconductor die over the substrate in a bump on lead (BOL) configuration.

9. The method of claim 6, wherein the conductive shell includes a cross-sectional width less than 7 micrometers.

10. The method of claim 6, further including depositing the bump material around the conductive shell.

11. A method of making a semiconductor device, comprising:
    providing a first substrate;
    forming a first insulating layer including an opening over the first substrate;
    forming a compliant composite conductive interconnect structure over the first substrate within the opening in the first insulating layer;
    removing the first insulating layer to form a hollow core in the compliant composite conductive interconnect structure; and
    forming a second insulating layer within the hollow core.

12. The method of claim 11, wherein the second insulating layer includes a compliant material.

13. The method of claim 11, wherein forming the compliant composite conductive interconnect structure includes:
    forming a conductive shell over the first substrate; and
    forming a conductive layer over the conductive shell.

14. The method of claim 11, further including:
    disposing a semiconductor die over the first substrate; and
    forming an encapsulant over the semiconductor die.

15. The method of claim 11, further including forming a conductive layer over the first substrate, wherein the compliant composite conductive interconnect structure includes a width less than a width of the conductive layer.

16. The method of claim 11, further including disposing the first substrate over a second substrate.

17. A semiconductor device, comprising:
    a substrate;
    a compliant composite conductive interconnect structure formed over the substrate, wherein the compliant composite conductive interconnect structure includes a hollow core;
    a conductive layer formed over the hollow core of the compliant composite conductive interconnect structure; and
    a bump formed over the compliant composite conductive interconnect structure.

18. The semiconductor device of claim 17, wherein the compliant composite conductive interconnect structure further includes:
    a conductive shell formed over the substrate; and
    the conductive layer formed over the conductive shell.

19. The semiconductor device of claim 18, wherein the compliant composite conductive interconnect structure includes a Young's modulus less than a Young's modulus of the conductive shell.

20. The semiconductor device of claim 17, wherein the compliant composite conductive interconnect structure includes a cross-sectional width less than 7 micrometers.

21. The semiconductor device of claim 17, wherein the substrate includes a semiconductor die.

* * * * *